(12) United States Patent
Yamazaki et al.

(10) Patent No.: US 10,923,350 B2
(45) Date of Patent: Feb. 16, 2021

(54) MANUFACTURING METHOD OF SEMICONDUCTOR DEVICE

(71) Applicant: Semiconductor Energy Laboratory Co., Ltd., Atsugi (JP)

(72) Inventors: Shunpei Yamazaki, Setagaya (JP); Masataka Sato, Tochigi (JP); Seiji Yasumoto, Tochigi (JP); Kayo Kumakura, Tochigi (JP); Satoru Idojiri, Tochigi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/687,915

(22) Filed: Aug. 28, 2017

(65) Prior Publication Data

US 2018/0061639 A1    Mar. 1, 2018

(30) Foreign Application Priority Data

Aug. 31, 2016  (JP) .................................. 2016-170378
Sep. 6, 2016   (JP) .................................. 2016-173345
Oct. 7, 2016   (JP) .................................. 2016-198947

(51) Int. Cl.
*H01L 21/02*       (2006.01)
*H01L 21/67*       (2006.01)
(Continued)

(52) U.S. Cl.
CPC .. *H01L 21/02694* (2013.01); *H01L 21/02488* (2013.01); *H01L 21/67132* (2013.01);
(Continued)

(58) Field of Classification Search
None
See application file for complete search history.

(56) References Cited

U.S. PATENT DOCUMENTS 4,409,134 A    10/1983  Yamazaki
5,464,500 A  * 11/1995  Tsujimura ................ C23F 1/02
                                                216/34
(Continued)

FOREIGN PATENT DOCUMENTS

JP    2003-098977 A    4/2003
JP    2015-223823 A   12/2015

OTHER PUBLICATIONS

French.I et al., "54.2: Thin Plastic Electrophoretic Displays Fabricated by a Novel Process", SID Digest '05 : SID International Symposium Digest of Technical Papers, May 24, 2005, vol. 36, pp. 1634-1637.

(Continued)

*Primary Examiner* — Bradley Smith
(74) *Attorney, Agent, or Firm* — Robinson Intellectual Property Law Office; Eric J. Robinson

(57) ABSTRACT

The yield of a manufacturing process of a semiconductor device is increased. The mass productivity of a semiconductor device is increased. A semiconductor device is manufactured by forming a first material layer over a substrate; forming a second material layer over the first material layer; and separating the first material layer and the second material layer from each other; and heating the first material layer and the second material layer that are stacked before the separation. The first material layer includes a gas containing hydrogen, oxygen, or hydrogen and oxygen (e.g., water) in a metal oxide, for example. The second material layer includes a resin. The first material layer and the second material layer are separated from each other by a break of a hydrogen bond. Specifically water is separated out at the interface or near the interface, and then adhesion is reduced due to the water present.

17 Claims, 47 Drawing Sheets

(51) Int. Cl.
*H01L 21/78* (2006.01)
*H01L 27/12* (2006.01)
*H01L 29/66* (2006.01)

(52) U.S. Cl.
CPC ...... *H01L 21/7806* (2013.01); *H01L 27/1225* (2013.01); *H01L 27/1266* (2013.01); *H01L 29/66969* (2013.01); *G02F 2201/44* (2013.01)

(56) References Cited

U.S. PATENT DOCUMENTS

| | | | |
|---|---|---|---|
| 5,783,022 A * | 7/1998 | Cha | B26D 3/28 134/137 |
| 5,826,162 A | 10/1998 | Aral et al. | |
| 5,834,327 A | 11/1998 | Yamazaki et al. | |
| 6,100,166 A | 8/2000 | Sakaguchi et al. | |
| 6,127,199 A | 10/2000 | Inoue et al. | |
| 6,335,479 B1 | 1/2002 | Yamada et al. | |
| 6,372,608 B1 | 4/2002 | Shimoda et al. | |
| 6,379,792 B1 | 4/2002 | Isshiki et al. | |
| 6,468,638 B2 | 10/2002 | Jacobsen et al. | |
| 6,521,511 B1 | 2/2003 | Inoue et al. | |
| 6,627,518 B1 | 9/2003 | Inoue et al. | |
| 6,645,830 B2 | 11/2003 | Shimoda et al. | |
| 6,814,832 B2 | 11/2004 | Utsunomiya | |
| 6,825,099 B2 | 11/2004 | Yanagita et al. | |
| 6,846,616 B2 | 1/2005 | Kobayashi et al. | |
| 6,867,067 B2 | 3/2005 | Ghyselen et al. | |
| 6,885,146 B2 | 4/2005 | Yamazaki et al. | |
| 6,946,361 B2 | 9/2005 | Takayama et al. | |
| 6,947,321 B2 | 9/2005 | Tanabe | |
| 7,052,924 B2 | 5/2006 | Daniels et al. | |
| 7,067,392 B2 | 6/2006 | Yamazaki et al. | |
| 7,078,737 B2 | 7/2006 | Yuri et al. | |
| 7,084,045 B2 | 8/2006 | Takayama et al. | |
| 7,094,665 B2 | 8/2006 | Shimoda et al. | |
| 7,147,740 B2 | 12/2006 | Takayama et al. | |
| 7,169,652 B2 | 1/2007 | Kimura | |
| 7,262,088 B2 | 8/2007 | Kodaira et al. | |
| 7,341,924 B2 | 3/2008 | Takayama et al. | |
| 7,411,211 B1 | 8/2008 | Yamazaki | |
| 7,420,208 B2 | 9/2008 | Yamazaki et al. | |
| 7,456,059 B2 | 11/2008 | Kodaira et al. | |
| 7,572,667 B2 | 8/2009 | Ryu et al. | |
| 7,575,965 B2 | 8/2009 | Kuwabara et al. | |
| 8,173,519 B2 | 5/2012 | Morisue et al. | |
| 9,437,831 B2 | 9/2016 | Yamazaki et al. | |
| 2003/0003687 A1 | 1/2003 | Yanagita et al. | |
| 2003/0024635 A1 | 2/2003 | Utsunomiya | |
| 2003/0048370 A1 | 3/2003 | Koyama | |
| 2003/0087073 A1 | 5/2003 | Kobayashi | |
| 2003/0217805 A1 | 11/2003 | Takayama et al. | |
| 2004/0026736 A1 * | 2/2004 | Grupp | H01L 21/28537 257/330 |
| 2004/0079941 A1 | 4/2004 | Yamazaki et al. | |
| 2004/0129960 A1 | 7/2004 | Maruyama et al. | |
| 2004/0209442 A1 | 10/2004 | Takakuwa et al. | |
| 2004/0239827 A1 | 12/2004 | Yamazaki et al. | |
| 2005/0124751 A1 | 6/2005 | Klingenberg et al. | |
| 2005/0127371 A1 | 6/2005 | Yamazaki et al. | |
| 2005/0130391 A1 | 6/2005 | Takayama et al. | |
| 2005/0173701 A1 | 8/2005 | Kawase et al. | |
| 2005/0250308 A1 | 11/2005 | Yamaguchi et al. | |
| 2005/0287871 A1 | 12/2005 | Nakayama et al. | |
| 2007/0171142 A1 | 7/2007 | Ikarashi et al. | |
| 2007/0207571 A1 | 9/2007 | Morisue et al. | |
| 2007/0295973 A1 | 12/2007 | Jinbo et al. | |
| 2009/0315457 A1 | 12/2009 | Furukawa et al. | |
| 2010/0015358 A1 * | 1/2010 | Cernak | H01J 7/32348 427/576 |
| 2011/0204361 A1 * | 8/2011 | Nishiki | H01L 21/268 257/52 |
| 2012/0228617 A1 | 9/2012 | Ko et al. | |
| 2015/0303408 A1 | 10/2015 | Lee et al. | |
| 2016/0133864 A1 * | 5/2016 | Kim | C08G 79/00 257/88 |
| 2016/0172244 A1 * | 6/2016 | Tanaka | H01L 21/78 438/125 |
| 2017/0025544 A1 * | 1/2017 | Yamazaki | H01L 29/7869 |
| 2017/0137571 A1 * | 5/2017 | Nakayama | C08J 5/18 |
| 2018/0040647 A1 | 2/2018 | Yamazaki et al. | |
| 2018/0061638 A1 | 3/2018 | Yamazaki et al. | |

OTHER PUBLICATIONS

Yoon.J et al., "World 1st Large Size 18-inch Flexible OLED Display and the Key Technologies", SID Digest '15 : SID International Symposium Digest of Technical Papers, Jun. 2, 2015, pp. 962-965.

Moon-Soo Ko et al., "Late-News Paper: Joule Heating Induced Lift-off Technology for Large Area Flexible AMOLED Displays", SID Digest '11 : SID International Symposium Digest of Technical Papers, 2011, vol. 42, No. 1, pp. 118-120.

Hong.S et al., "Development of Commercial Flexible AMOLEDs", SID Digest '14 : SID International Symposium Digest of Technical Papers, Jun. 1, 2014, vol. 45, pp. 334-337.

* cited by examiner $$M-O-C + H_2O \rightarrow M-OH + C-OH$$

FIG. 4A1
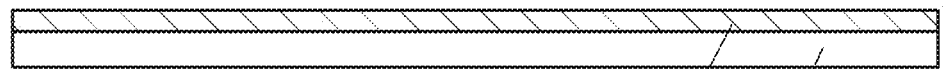
FIG. 4A2
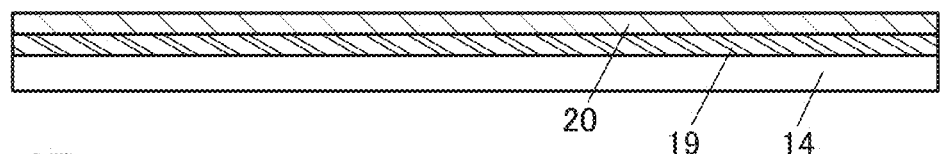
FIG. 4B
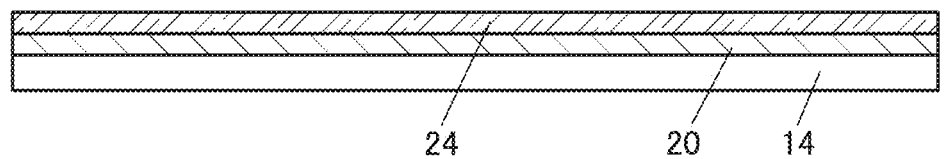
FIG. 4C
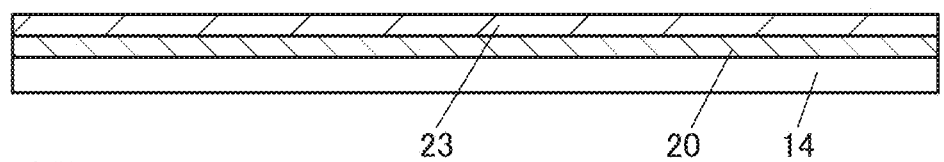
FIG. 4D
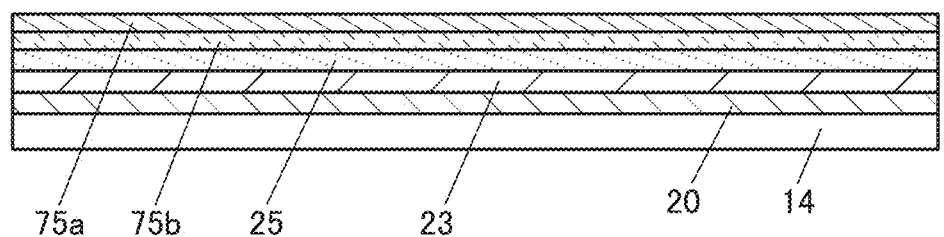
FIG. 4E
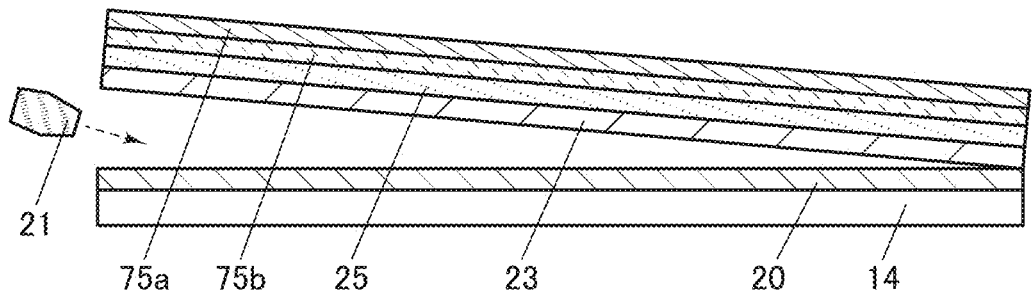

FIG. 6A
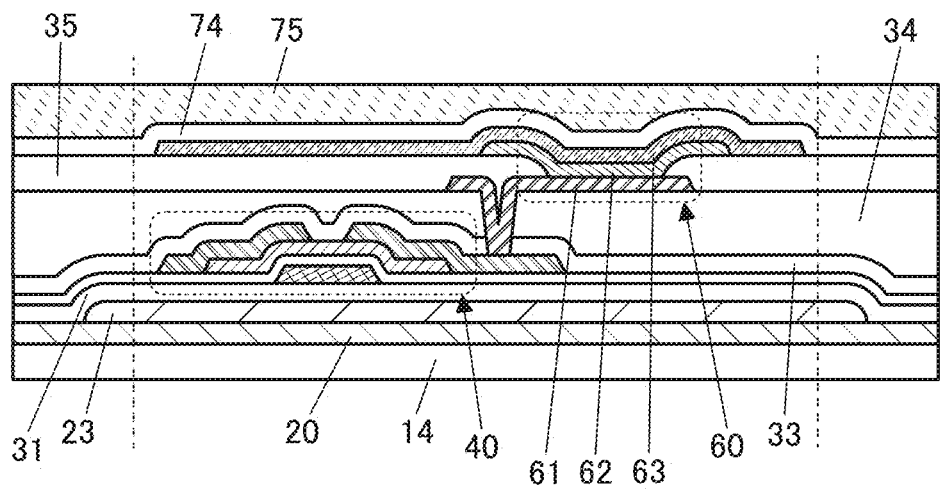
FIG. 6B1
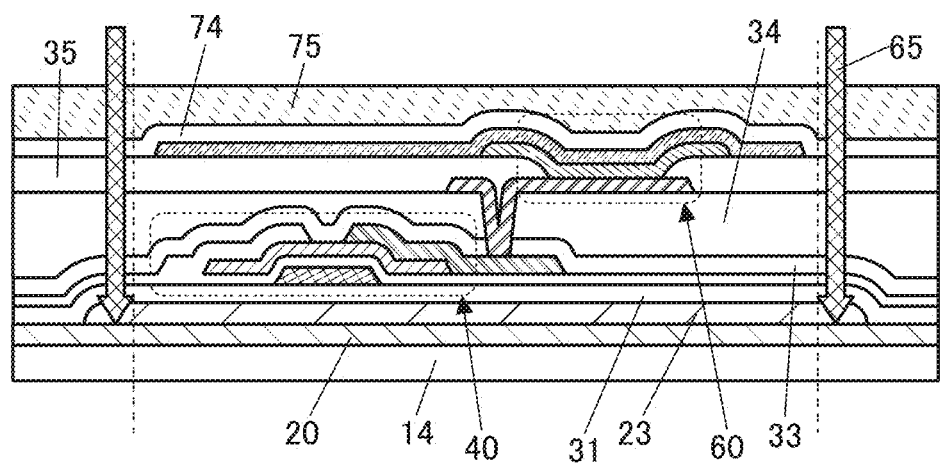
FIG. 6B2
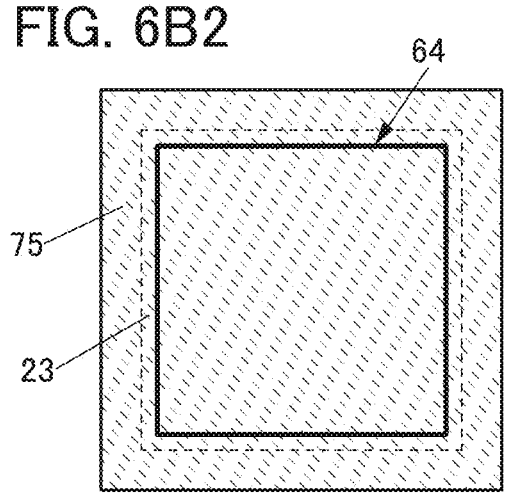
FIG. 6B3
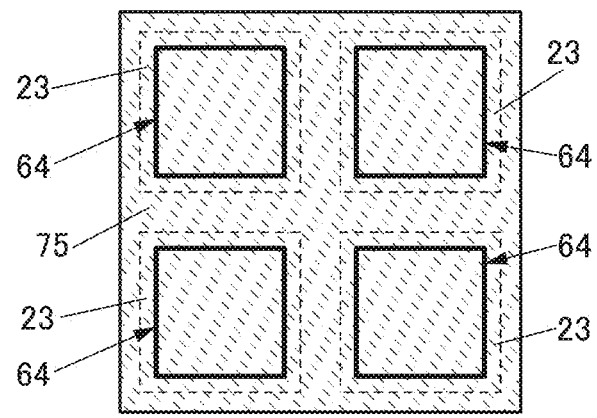

FIG. 21A
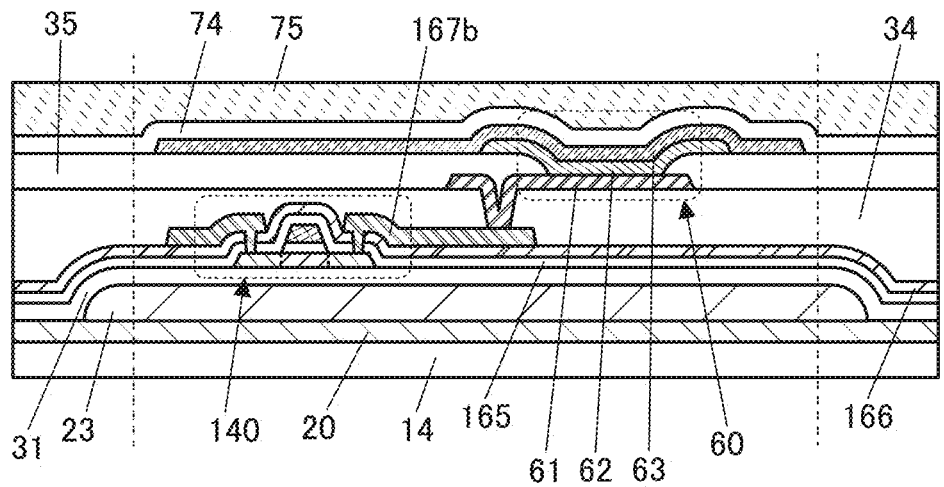
FIG. 21B1
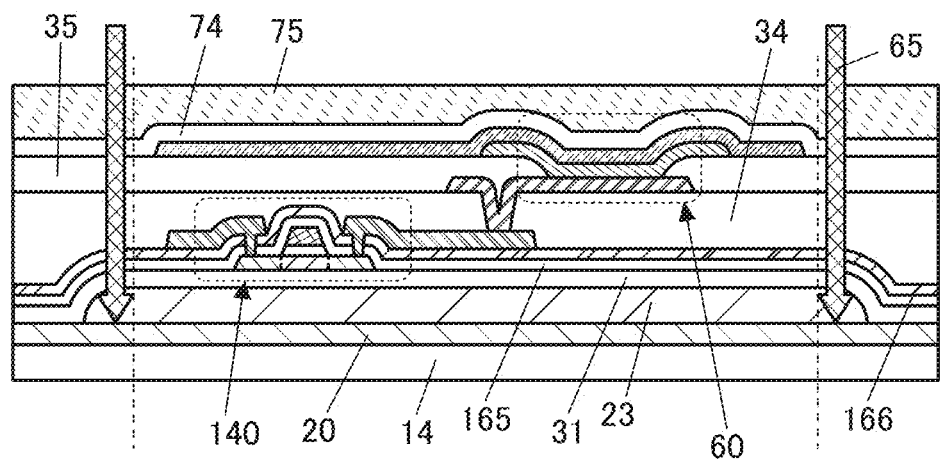
FIG. 21B2
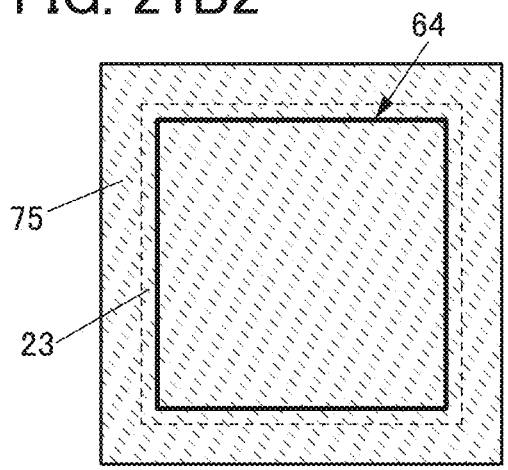
FIG. 21B3
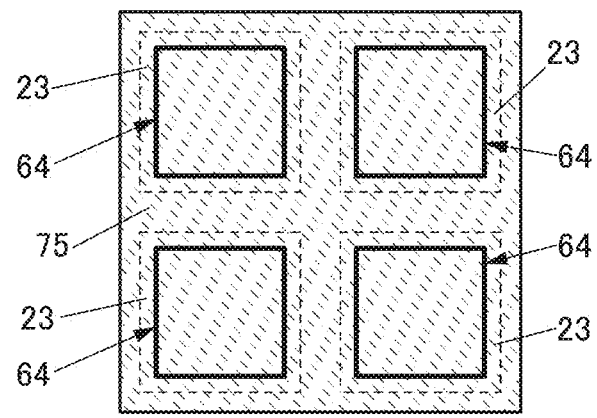

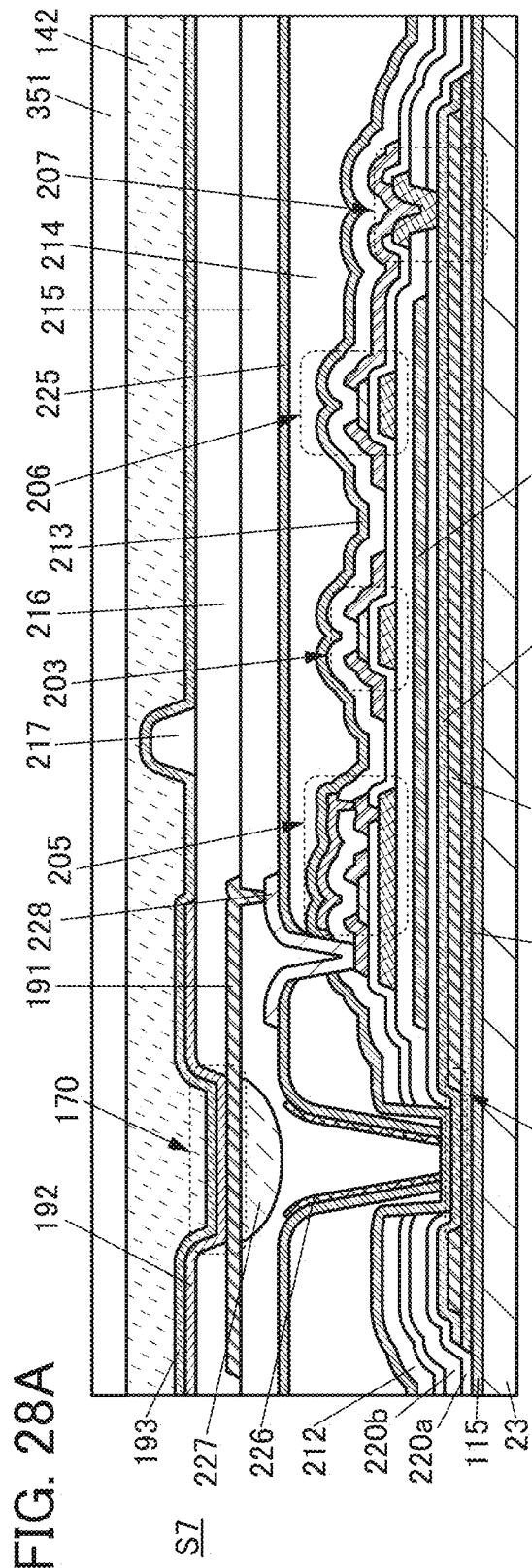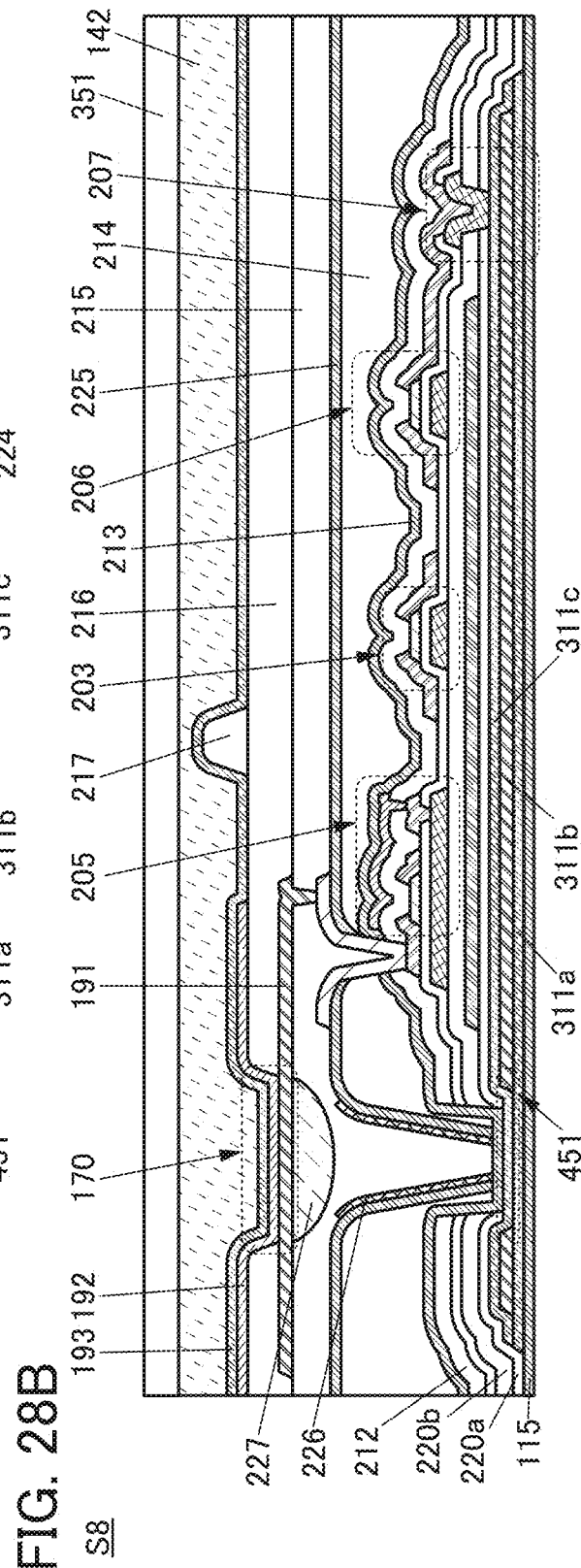

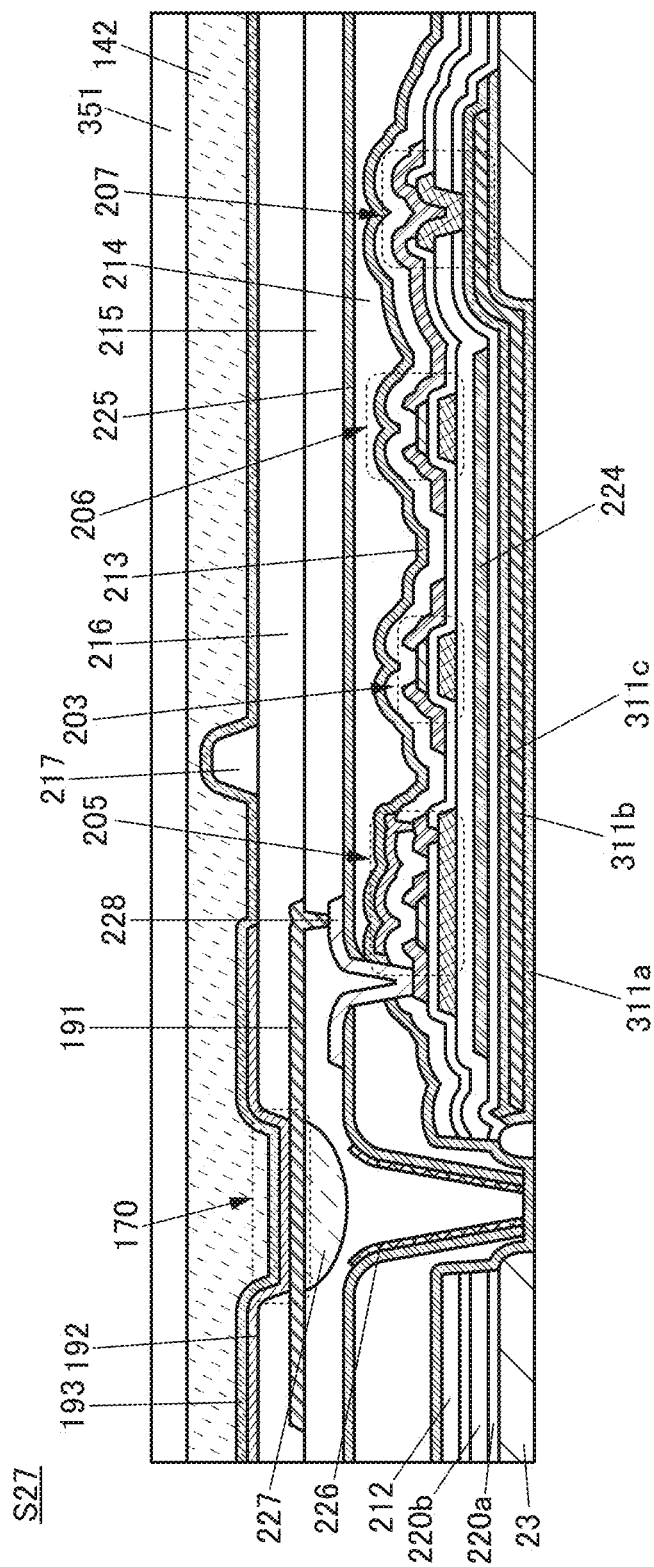

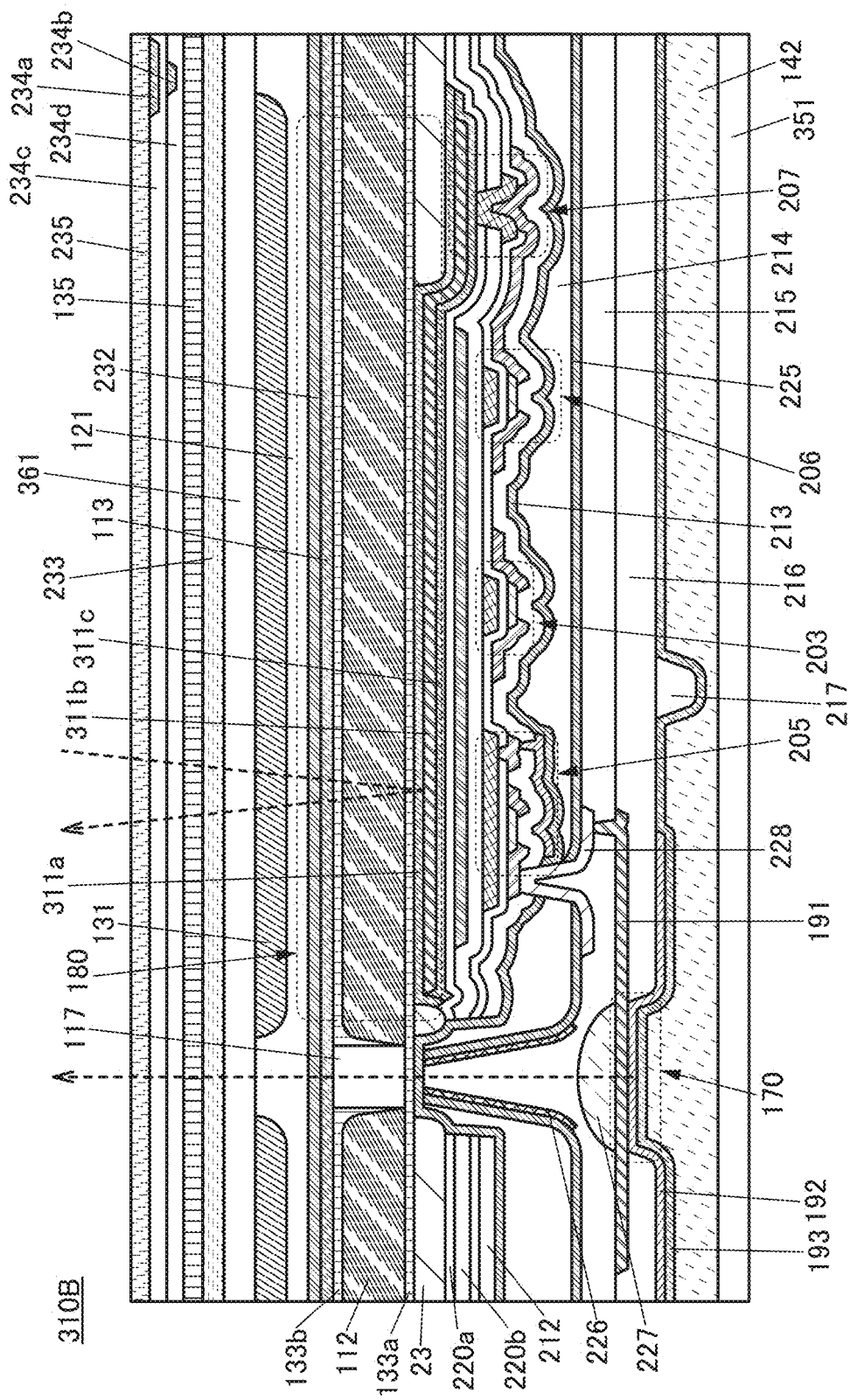

Sample 2A

Sample 2B

Sample 2C

Sample 2D

Sample 2E

Sample 2F

FIG. 47A
FIG. 47B
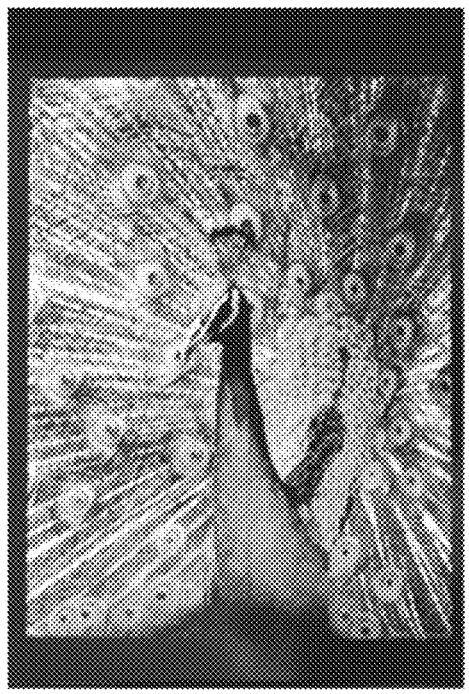
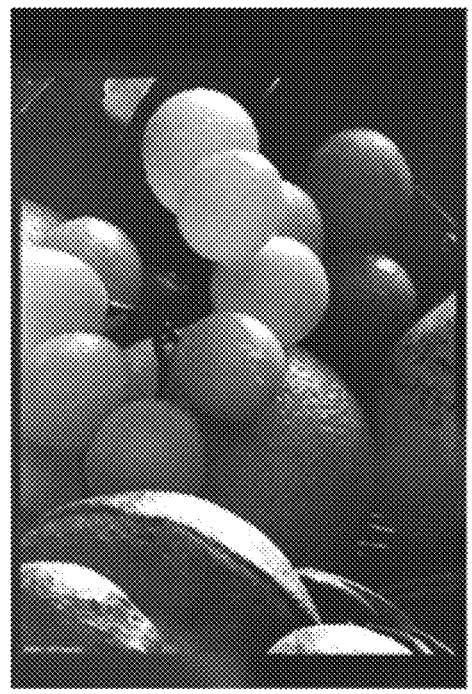

MANUFACTURING METHOD OF SEMICONDUCTOR DEVICE

BACKGROUND OF THE INVENTION

1. Field of the Invention

One embodiment of the present invention relates to a peeling method, a manufacturing method of a semiconductor device, and a manufacturing method of a display device.

Note that one embodiment of the present invention is not limited to the above technical field. Examples of the technical field of one embodiment of the present invention include a semiconductor device, a display device, a light-emitting device, a power storage device, a memory device, an electronic device, a lighting device, an input device (such as a touch sensor), an input/output device (such as a touch panel), a driving method thereof, and a manufacturing method thereof.

Note that in this specification and the like, a semiconductor device generally means a device that can function by utilizing semiconductor characteristics. A transistor, a semiconductor circuit, a display device, a light-emitting device, an input device, an input/output device, an arithmetic device, a memory device, and the like are each an embodiment of a semiconductor device. In addition, an imaging device, an electro-optical device, a power generation device (e.g., a thin film solar cell and an organic thin film solar cell), and an electronic device may each include a semiconductor device.

2. Description of the Related Art

Display devices using organic electroluminescent (EL) elements or liquid crystal elements have been known. Examples of the display device also include a light-emitting device provided with a light-emitting element such as a light-emitting diode (LED), and electronic paper performing display with an electrophoretic method or the like.

The organic EL element generally has a structure in which a layer containing a light-emitting organic compound is provided between a pair of electrodes. When voltage is applied to this element, light emission can be obtained from the light-emitting organic compound. With use of such an organic EL element, thin, lightweight, high-contrast, and low-power-consumption display devices can be achieved.

A flexible display device can be obtained by formation of a semiconductor element such as a transistor or a display element such as an organic EL element over a flexible substrate (film).

In a manufacturing method of a flexible display device that is disclosed in Patent Document 1, laser light irradiation is performed on a supporting substrate (a glass substrate) over which a sacrifice layer, a heat-resistant resin layer, and an electronic element are provided in that order, and the heat-resistant resin layer is peeled from the glass substrate.

REFERENCE

Patent Document

[Patent Document 1] Japanese Published Patent Application No. 2015-223823

SUMMARY OF THE INVENTION

An object of one embodiment of the present invention is to provide a novel peeling method, a novel manufacturing method of a semiconductor device, or a novel manufacturing method of a display device. Another object of one embodiment of the present invention is to provide a peeling method, a manufacturing method of a semiconductor device, or a manufacturing method of a display device each having a low cost and a high productivity. Another object of one embodiment of the present invention is to provide a high-yield peeling method. Another object of one embodiment of the present invention is to manufacture a semiconductor device or a display device using a large-sized substrate. Another object of one embodiment of the present invention is to manufacture a semiconductor device or a display device at low temperatures.

Another object of one embodiment of the present invention is to provide a display device with low power consumption. Another object of one embodiment of the present invention is to provide a display device with high reliability. Another object of one embodiment of the present invention is to reduce the thickness or weight of a display device. Another object of one embodiment of the present invention is to provide a display device having flexibility or a curved surface. Another object of one embodiment of the present invention is to provide a robust display device. Another object of one embodiment of the present invention is to provide a novel display device, a novel input/output device, a novel electronic device, or the like.

Note that the descriptions of these objects do not preclude the existence of other objects. One embodiment of the present invention does not necessarily achieve all the objects. Other objects can be derived from the description of the specification, the drawings, and the claims.

One embodiment of the present invention is a method for manufacturing a semiconductor device that includes a step of forming a first material layer over a substrate; a step of forming a second material layer over the first material layer; and a step of separating the first material layer and the second material layer from each other. The first material layer includes a gas containing either or both of hydrogen and oxygen. The gas is preferably water, for example. The second material layer includes a resin. The first material layer and the second material layer are separated from each other by a break of a hydrogen bond. Examples of the hydrogen bond include a hydrogen bond between the gas included in the first material layer and the second material layer. The first material layer is preferably formed to have lower adhesion to the second material layer than the substrate.

Another embodiment of the present invention is a method for manufacturing a semiconductor device that includes a step of forming a first material layer over a substrate; a step of forming a second material layer over the first material layer; a step of heating the first material layer and the second material layer that are stacked; and a step of separating the first material layer and the second material layer from each other. The first material layer includes a gas containing either or both of hydrogen and oxygen. The gas is preferably water, for example. The second material layer includes a resin. In the step of the heating, water is separated out at the interface between the first material layer and the second material layer or near the interface. The first material layer and the second material layer are separated from each other by reduced adhesion due to the water present at the interface or near the interface.

The first material layer is preferably formed to include one or more of titanium, molybdenum, aluminum, tungsten, silicon, indium, zinc, gallium, tantalum, and tin. The first material layer is preferably formed to include either or both of titanium and titanium oxide. The first material layer is preferably formed to have a structure in which titanium and titanium oxide are stacked.

The second material layer is preferably formed to include a region with a thickness of greater than or equal to 0.1 μm and less than or equal to 5 μm.

The second material layer is preferably formed to include a residue of a compound represented by Structural Formula (100).

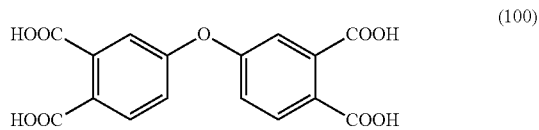 [SMILES: O=C(O)c1ccc(Oc2ccc(C(=O)O)c(C(=O)O)c2)cc1C(=O)O]

The step of separating the first material layer and the second material layer from each other is preferably performed while a liquid is fed to a separation interface. The liquid preferably contains water.

In the step of forming the first material layer, a metal layer may be formed over the substrate and plasma treatment may be performed on a surface of the metal layer to form a metal oxide layer. In the plasma treatment, the surface of the metal layer is preferably exposed to an atmosphere containing either or both of oxygen and water vapor ($H_2O$).

One embodiment of the present invention is a method for manufacturing a semiconductor device that includes a step of forming a metal oxide layer over a substrate; a step of forming a first layer with use of a material containing a resin or a resin precursor over the metal oxide layer; a step of performing heat treatment on the first layer to form a resin layer; and a step of separating the metal oxide layer and the resin layer from each other.

The metal oxide layer may be formed by forming a metal layer over the substrate and performing plasma treatment on a surface of the metal layer. In the plasma treatment, the surface of the metal layer is preferably exposed to an atmosphere containing either or both of oxygen and water vapor ($H_2O$).

The first layer may be formed after performing plasma treatment on a surface of the metal oxide layer. In the plasma treatment, the surface of the metal oxide layer is preferably exposed to an atmosphere containing one or more of oxygen, hydrogen, and water vapor ($H_2O$).

The metal oxide layer may be formed by forming a metal layer over the substrate and heating the metal layer in an oxygen-containing atmosphere.

The first layer may be formed after heating the metal oxide layer in an oxygen-containing atmosphere.

The heat treatment on the first layer may be performed in an air atmosphere. The heat treatment may be performed while an oxygen-containing gas is supplied.

The metal oxide layer and the resin layer are preferably separated from each other while a water-containing liquid is fed to a separation interface. A contact angle between the metal oxide layer and the water-containing liquid is preferably greater than 0° and less than or equal to 60°.

The resin layer is preferably formed to include a region with a thickness of greater than or equal to 0.1 μm and less than or equal to 5 μm.

According to one embodiment of the present invention, a novel peeling method, a novel manufacturing method of a semiconductor device, or a novel manufacturing method of a display device can be provided. According to one embodiment of the present invention, a peeling method, a manufacturing method of a semiconductor device, or a manufacturing method of a display device each having a low cost and a high productivity can be provided. According to one embodiment of the present invention, a high-yield peeling method can be provided. According to one embodiment of the present invention, a semiconductor device or a display device can be manufactured using a large-sized substrate. According to one embodiment of the present invention, a semiconductor device or a display device can be manufactured at low temperatures.

According to one embodiment of the present invention, a display device with low power consumption can be provided. According to one embodiment of the present invention, a display device with high reliability can be provided. According to one embodiment of the present invention, the thickness or weight of a display device can be reduced. According to one embodiment of the present invention, a display device having flexibility or a curved surface can be provided. According to one embodiment of the present invention, a robust display device can be provided. According to one embodiment of the present invention, a novel display device, a novel input/output device, a novel electronic device, or the like can be provided.

Note that the descriptions of these effects do not preclude the existence of other effects. One embodiment of the present invention does not necessarily have all the effects. Other effects can be derived from the description of the specification, the drawings, and the claims.

BRIEF DESCRIPTION OF THE DRAWINGS

FIGS. 4A1, 4A2, 4B, 4C, 4D, and 4E are cross-sectional views illustrating an example of a manufacturing method of a display device.

FIGS. 6A, 6B1, 6B2, and 6B3 are cross-sectional views and top views illustrating examples of a manufacturing method of a display device.

FIGS. 21A, 21B1, 21B2, and 21B3 are cross-sectional views and top views illustrating examples of a manufacturing method of a display device.

FIGS. 28A and 28B are cross-sectional views illustrating an example of a manufacturing method of a display device.

FIG. 32 is a cross-sectional view illustrating an example of a manufacturing method of a display device.

FIG. 33 is a cross-sectional view illustrating an example of an input/output device.

FIGS. 47A and 47B are photographs of a display device in Example 6 displaying images.

DETAILED DESCRIPTION OF THE INVENTION

Figure 1:
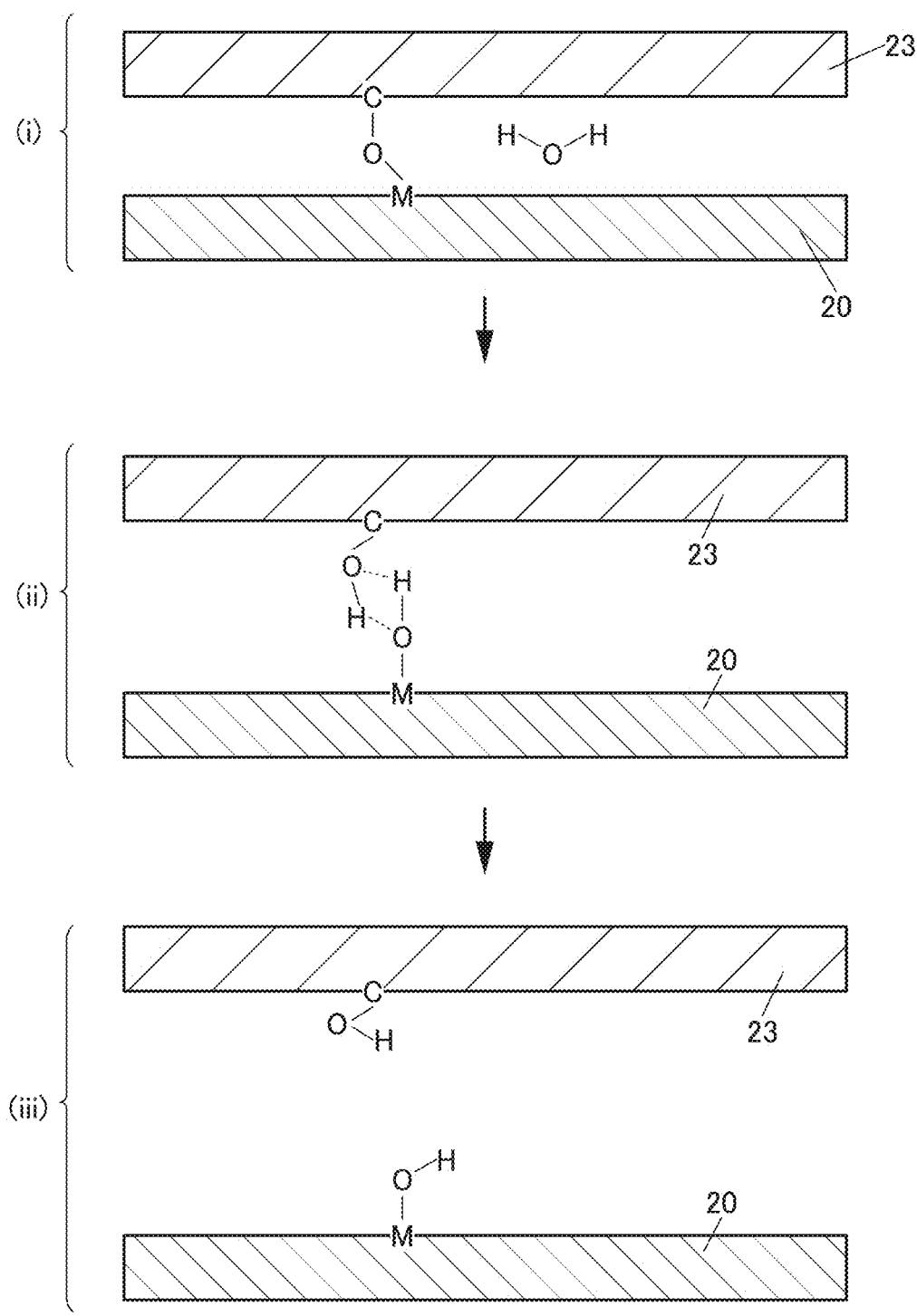
FIG. 1 is a schematic view illustrating an example of a peeling method.

Embodiments will be described in detail with reference to drawings. Note that the present invention is not limited to the following description, and it is easily understood by those skilled in the art that various changes and modifications can be made without departing from the spirit and scope of the present invention. Accordingly, the present invention should not be interpreted as being limited to the description of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not denoted by reference numerals in some cases.

The position, size, range, or the like of components illustrated in drawings is not accurately represented in some cases for easy understanding. Therefore, the disclosed invention is not necessarily limited to the position, size, range, or the like disclosed in the drawings.

Note that the terms "film" and "layer" can be interchanged with each other depending on the case or circumstances. For example, the term "conductive layer" can be changed into the term "conductive film," and the term "insulating film" can be changed into the term "insulating layer."

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor in some cases. In other words, an OS FET is a transistor including a metal oxide or an oxide semiconductor.

In this specification and the like, a metal oxide including nitrogen is also called a metal oxide in some cases. Moreover, a metal oxide including nitrogen may be called a metal oxynitride.

Embodiment 1

In this embodiment, a peeling method of one embodiment of the present invention and a manufacturing method of a display device of one embodiment of the present invention will be described with reference to FIG. 1, FIG. 2, FIG. 3, FIGS. 4A1, 4A2, 4B, 4C, 4D, and 4E, FIGS. 5A to 5E, FIGS. 6A, 6B1, 6B2, and 6B3, FIGS. 7A and 7B, FIGS. 8A to 8C, FIGS. 9A to 9C, FIGS. 10A to 10D, FIGS. 11A and 11B, FIGS. 12A and 12B, FIGS. 13A and 13B, FIGS. 14A and 14B, FIGS. 15A and 15B, FIGS. 16A to 16E, FIGS. 17A and 17B, and FIG. 18.

In this embodiment, a display device that includes a transistor and an organic EL element (also referred to as an active matrix organic EL display device) will be described as an example. The display device can have flexibility by using a flexible material for a substrate. Note that one embodiment of the present invention is not limited to a light-emitting device, a display device, and an input/output device (e.g., a touch panel) that include organic EL elements, and one embodiment of the present invention can be applied to a variety of devices such as a semiconductor device, a light-emitting device, a display device, and an input/output device that include other kinds of functional elements.

In this embodiment, first, a first material layer (which is a metal oxide layer here) is formed over a substrate. Then, a second material layer (which is a resin layer here) is formed over the metal oxide layer. Specifically, the resin layer is formed in such a manner that a first layer is formed using a material that contains a resin or a resin precursor and heat treatment is performed on the first layer. After that, the metal oxide layer and the resin layer are separated from each other.

In this embodiment, a layer serving as a base (also referred to as a base layer) is formed between the substrate and the resin layer. This base layer has lower adhesion (adhesiveness) to the resin layer than the substrate. Although the metal oxide layer is used as the base layer in an example described in this embodiment, one embodiment of the present invention is not limited to this example.

The heat treatment can reduce the adhesion (adhesiveness) between the metal oxide layer and the resin layer.

An example of the mechanism of separation of the metal oxide layer and the resin layer from each other is described with reference to FIG. 1 to FIG. 3.

First, a bond between a metal oxide layer 20 and a resin layer 23 is described with reference to FIG. 1.

In FIG. 1, the metal oxide layer 20 and the resin layer 23 are stacked. Note that the resin layer 23 illustrated in FIG. 1 may be regarded as the first layer (before being heated).

There is probably a bond between the metal oxide layer 20 and the resin layer 23 (or the first layer). Specifically, there is a chemical bond such as a covalent bond, an ionic bond, or a hydrogen bond between the metal oxide layer 20 and the resin layer 23 (or the first layer).

In an example of Step (i) in FIG. 1, a metal M of the metal oxide layer 20 and a carbon atom C of the resin layer 23 are bonded through an oxygen atom O.

Heating the structure in which the metal oxide layer 20 and the resin layer 23 (or the first layer) are stacked causes a reaction represented by Formula (1) (see below and FIG. 1). The heat treatment allows $H_2O$ (water vapor) to break the metal M-oxygen O-carbon C bond. Then, the bond between the metal oxide layer 20 and the resin layer 23 is changed into a hydrogen bond.

M—O—C+$H_2O$→M-OH+C—OH     (1)

In an example of Step (ii) in FIG. 1, the metal atom M of the metal oxide layer 20 and the carbon atom C of the resin layer 23 are bonded to the respective oxygen atoms O. The two oxygen atoms form covalent bonds with the respective hydrogen atoms. One of the two oxygen atoms forms a hydrogen bond with the hydrogen atom that is bonded to the other oxygen atom.

A hydrogen bond is much weaker than a covalent bond and thus can be easily broken. Thus, physical force can easily separate the metal oxide layer 20 and the resin layer 23 from each other.

In an example of Step (iii) in FIG. 1, the oxygen atom and the hydrogen atom that have been hydrogen-bonded are detached from each other and the metal oxide layer 20 and the resin layer 23 are separated from each other. The metal atom M of the metal oxide layer 20 and the carbon atom C of the resin layer 23 are bonded to the respective oxygen atoms O. The two oxygen atoms form covalent bonds with the respective hydrogen atoms.

As described above, heating the structure in which the metal oxide layer 20 and the resin layer 23 (or the first layer) are stacked allows $H_2O$ to change a strong bond between the metal oxide layer 20 and the resin layer 23 (or the first layer) into a hydrogen bond, which is a weak bond. This can reduce the force required for the separation between the metal oxide layer 20 and the resin layer 23.

The effect that $H_2O$ impairs the adhesion between the metal oxide layer 20 and the resin layer 23 (hereinafter referred to as an impairing effect) is described with reference to FIG. 2.

Figure 2:
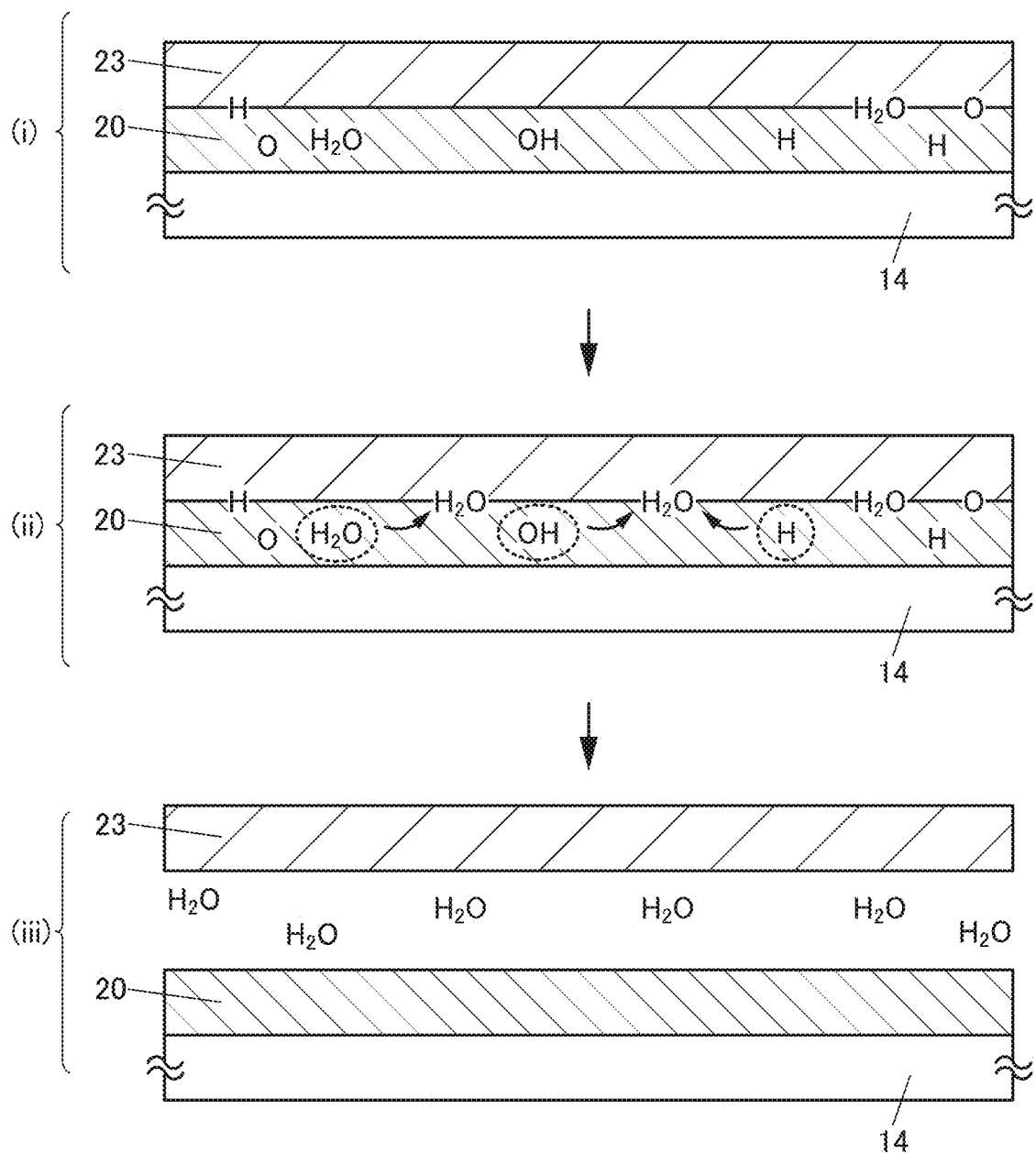
FIG. 2 is a schematic view illustrating an example of a peeling method.

In FIG. 2, the metal oxide layer 20 is provided over a formation substrate 14 and the resin layer 23 is provided over the metal oxide layer 20.

At an interface between the metal oxide layer 20 and the resin layer 23 and/or in the metal oxide layer 20, one or more of $H_2O$, hydrogen (H), oxygen (O), a hydroxyl group (OH), a hydrogen radical (H*), an oxygen radical (O*), and a hydroxyl radical (OH*) are present, which can be supplied by a formation step of the metal oxide layer 20, an addition (doping) step after the formation of the metal oxide layer 20, or the like. In an example of Step (i) in FIG. 2, $H_2O$, H, O, and the like are present both at the interface between the metal oxide layer 20 and the resin layer 23 and in the metal oxide layer 20.

H, O, $H_2O$, and the like supplied into the metal oxide layer 20 and to the interface between the metal oxide layer 20 and the resin layer 23 are sometimes separated out as $H_2O$ at the interface by a step (e.g., heating at 350° C.) in which the resin layer 23 (e.g., a polyimide) is solidified (hardened). In that case, $H_2O$ separated out at the interface between the metal oxide layer 20 and the resin layer 23 might impair the adhesion between the metal oxide layer 20 and the resin layer 23. In other words, $H_2O$ separated out at the interface between the metal oxide layer 20 and the resin layer 23 has an effect of impairing adhesion (an impairing effect). In an example of Step (ii) in FIG. 2, $H_2O$ in the metal oxide layer 20 is separated out at the interface between the metal oxide layer 20 and the resin layer 23. In an example of Step (ii) in FIG. 2, hydrogen and a hydroxyl group (OH) in the metal oxide layer 20 are separated out as $H_2O$ at the interface between the metal oxide layer 20 and the resin layer 23.

In an example of Step (iii) in FIG. 2, the metal oxide layer 20 and the resin layer 23 are separated from each other. $H_2O$ is changed into water vapor by heating to have an expanded volume. As a result, the adhesion between the metal oxide layer 20 and the resin layer 23 is reduced, which allows the separation between the metal oxide layer 20 and the resin layer 23.

Next, $H_2O$ that is involved in the reaction represented by Formula (1) above and the above impairing effect is described.

$H_2O$ is sometimes present in the metal oxide layer 20, in the resin layer 23, and at the interface between the metal oxide layer 20 and the resin layer 23, for example.

In addition, hydrogen (H), oxygen (O), a hydroxyl group (OH), a hydrogen radical (H*), an oxygen radical (O*), a hydroxyl radical (OH*), and the like present in the metal oxide layer 20, in the resin layer 23, and at the interface between the metal oxide layer 20 and the resin layer 23, for example, are sometimes changed into $H_2O$ by heating.

One or more of $H_2O$, hydrogen (H), oxygen (O), a hydroxyl group (OH), a hydrogen radical (H*), an oxygen radical (O*), and a hydroxyl radical (OH*) are preferably added into the metal oxide layer 20, to a surface of the metal oxide layer 20 (the surface in contact with the resin layer 23), or to the interface between the metal oxide layer 20 and the resin layer 23 (or the first layer).

Note that the reaction represented by Formula (1) above and the above impairing effect are sometimes caused at the same time in the peeling method of one embodiment of the present invention. It is estimated that in that case, the adhesion between the metal oxide layer 20 and the resin layer 23 can be further reduced, or in other words, peelability between the metal oxide layer 20 and the resin layer 23 can be further increased.

It is preferable that large amounts of $H_2O$, hydrogen (H), oxygen (O), hydroxyl groups (OH), hydrogen radicals (H*), oxygen radicals (O*), hydroxyl radicals (OH*), and the like be present in the metal oxide layer 20, in the resin layer 23, and at the interface between the metal oxide layer 20 and the resin layer 23, for example. A larger amount of $H_2O$, which contributes to the reaction, promotes the reaction and can further reduce the force required for the separation.

For example, the metal oxide layer 20 is preferably formed such that large amounts of $H_2O$, hydrogen, oxygen, hydroxyl groups, hydrogen radicals (H*), oxygen radicals (O*), hydroxyl radicals (OH*), and the like are present in the metal oxide layer 20 or on a surface thereof.

Specifically, the metal oxide layer 20 is preferably formed in such a manner that a metal layer is formed and then radical treatment is performed on a surface of the metal layer. In the radical treatment, the surface of the metal layer is preferably exposed to an atmosphere containing an oxygen radical and/or a hydroxyl radical. For example, plasma treatment is preferably performed in an atmosphere containing oxygen and/or water vapor ($H_2O$).

Alternatively, a surface of the metal oxide layer 20 is preferably subjected to radical treatment after formation of the metal oxide layer 20. In the radical treatment, the surface of the metal oxide layer 20 is preferably exposed to an atmosphere containing at least one of an oxygen radical, a hydrogen radical, and a hydroxyl radical. For example, plasma treatment is preferably performed in an atmosphere containing one or more of oxygen, hydrogen, and water vapor ($H_2O$).

The radical treatment can be performed with a plasma generation apparatus or an ozone generation apparatus.

For example, oxygen plasma treatment, hydrogen plasma treatment, water plasma treatment, ozone treatment, or the like can be performed. Oxygen plasma treatment can be performed by generating plasma in an oxygen-containing atmosphere. Hydrogen plasma treatment can be performed by generating plasma in a hydrogen-containing atmosphere. Water plasma treatment can be performed by generating plasma in an atmosphere containing water vapor ($H_2O$). Water plasma treatment is particularly preferable because it makes a large amount of moisture present on the surface of the metal oxide layer 20 or in the metal oxide layer 20.

Plasma treatment may be performed in an atmosphere containing two or more of oxygen, hydrogen, water (water vapor), and an inert gas (typically, argon). Examples of the plasma treatment include plasma treatment in an atmosphere containing oxygen and hydrogen, plasma treatment in an atmosphere containing oxygen and water, plasma treatment in an atmosphere containing water and argon, plasma treatment in an atmosphere containing oxygen and argon, and plasma treatment in an atmosphere containing oxygen, water, and argon. The use of an argon gas for the plasma treatment is favorable because the metal layer or the metal oxide layer 20 is damaged during the plasma treatment.

Two or more kinds of plasma treatment may be performed sequentially without exposure to the air. For example, argon plasma treatment may be followed by water plasma treatment.

Figure 3:
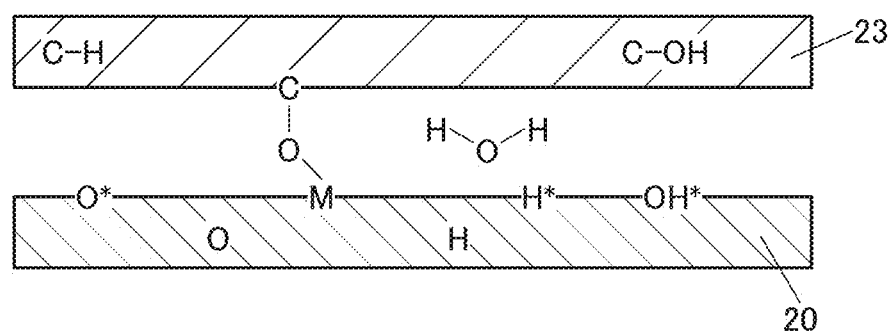
FIG. 3 is a schematic view illustrating an example of an interface between a metal oxide layer and a resin layer.

In the above manner, hydrogen, oxygen, a hydrogen radical (H*), an oxygen radical (O*), a hydroxyl radical (OH*), and the like can be present on the surface of the metal oxide layer 20 or in the metal oxide layer 20 as illustrated in FIG. 3. In the example illustrated in FIG. 3, the resin layer 23 contains a carbon atom C which is bonded to a hydrogen atom H or a hydroxyl group OH. The hydrogen atom H and the hydroxyl group OH are probably changed into $H_2O$ by heating.

The heat treatment is preferably performed in an oxygen-containing atmosphere. Heating the first layer in an atmosphere containing a sufficient amount of oxygen makes the formed resin layer 23 contain much oxygen. The larger the amount of oxygen contained in the resin layer 23 is, the easier it is to separate the resin layer 23 and the metal oxide layer 20 from each other.

For example, the heat treatment can be performed while an oxygen-containing gas is supplied.

It is further preferable to perform the heat treatment in an air atmosphere. Heating the first layer in an air atmosphere makes the formed resin layer 23 contain much oxygen and moisture. The larger the amounts of oxygen and moisture contained in the resin layer 23 are, the easier it is to separate the resin layer 23 and the metal oxide layer 20 from each other. The formed resin layer 23 sometimes contains a larger amount of moisture when the first layer is heated in an air atmosphere (without supplying a gas) than when the heat treatment is performed while a gas is supplied.

The moisture in the resin layer 23 sometimes reduces adhesion or adhesiveness between the resin layer 23 and the metal oxide layer 20. For example, moisture sometimes weakens or breaks a bond between the resin layer 23 and the metal oxide layer 20.

Before or during the separation, a water-containing liquid is preferably fed to the separation interface. Water present at the separation interface further reduces adhesion or adhesiveness between the resin layer 23 and the metal oxide layer 20 and reduces the force required for the separation. Furthermore, feeding a water-containing liquid to the separation interface sometimes weakens or breaks a bond between the resin layer 23 and the metal oxide layer 20. A chemical bond with the liquid is utilized to break a bond between the resin layer 23 and the metal oxide layer 20, which allows the separation to proceed. For example, in the case where there is a hydrogen bond between the resin layer 23 and the metal oxide layer 20, it can be assumed that feeding the water-containing liquid forms a hydrogen bond between the water and the resin layer 23 or the metal oxide layer 20 to break the hydrogen bond between the resin layer 23 and the metal oxide layer 20.

The metal oxide layer 20 preferably has low surface tension and high wettability with respect to a water-containing liquid. In that case, the water-containing liquid can be distributed over the entire surface of the metal oxide layer 20 and can be easily fed to the separation interface. Distribution of the water over the entire metal oxide layer 20 leads to uniform peeling.

The contact angle between the metal oxide layer 20 and the water-containing liquid is preferably greater than 0° and less than or equal to 60°, further preferably greater than 0° and less than or equal to 50°. When the wettability with respect to the water-containing liquid is extremely high (e.g., when the contact angle is approximately 20° or less), it is sometimes difficult to obtain an accurate value of the contact angle. The higher the wettability of the metal oxide layer 20 with respect to the water-containing liquid, the better. Therefore, the wettability with respect to the water-containing liquid may be high enough to prevent an accurate value of the contact angle from being obtained.

The water-containing liquid present at the separation interface can inhibit an adverse effect of static electricity that is caused at the time of separation on a functional element included in a layer to be peeled (e.g., damage to a semiconductor element from static electricity). Static electricity on a surface of the layer to be peeled which is exposed by the separation may be removed with an ionizer or the like.

In the case where a liquid is fed to the separation interface, the surface of the layer to be peeled which is exposed by the separation may be dried.

The substrate temperature during the separation can be room temperature but is not limited thereto. The substrate temperature may be set to higher than room temperature and lower than or equal to 200° C., preferably higher than or equal to 100° C. and lower than or equal to 200° C. before or during the separation. For example, the substrate may be heated to higher than or equal to 130° C. and lower than or equal to 200° C. Setting the substrate temperature to higher than room temperature enhances the effect of water and reduces the force required for the separation in some cases. Peelability in peeling by physical force (also called mechanical energy) can be further increased when the peeling is performed with the substrate temperature increased (with the substrate heated). In other words, an increased substrate temperature at the time of the peeling brings about an assisting effect, which increases peelability.

For example, at least part of the substrate may be heated during the separation of the resin layer and the metal oxide layer from each other. In addition, the layer to be peeled may be cooled during or after its separation from the substrate.

A liquid at a temperature higher than or equal to room temperature and lower than or equal to 100° C. may be fed during the separation of the resin layer and the metal oxide layer from each other.

Before the separation, the substrate over which the resin layer is formed is preferably preserved in a high-humidity environment, further preferably in a high-temperature and high-humidity environment. Specifically, preservation of the substrate where a separation trigger has been formed and the separation interface has been partly exposed enables efficient supply of moisture to the separation interface. As a result, the force required for the separation can be reduced. Specifically, the humidity of the preservation environment is preferably higher than or equal to 50% and lower than or equal to 100%, further preferably higher than or equal to 70% and lower than or equal to 100%. The temperature of the preservation environment is preferably higher than room temperature and lower than or equal to 100° C., further preferably higher than or equal to 50° C. and lower than or equal to 70° C.

Likewise, the separation is preferably performed in a high-humidity environment, further preferably in a high-temperature and high-humidity environment. This supplies moisture to the separation interface and sometimes reduces the force required for the separation.

In this embodiment, the separation of the metal oxide layer and the resin layer from each other can be facilitated by adjusting, for example, formation conditions of the metal oxide layer and the resin layer. Accordingly, a step of irradiating the entire area of the resin layer with laser light to increase the peelability of the resin layer is not needed.

When the entire area of the resin layer is irradiated with laser light, a linear laser beam can be suitably used; however, a laser apparatus for linear laser beam irradiation is expensive and has high running costs. This embodiment eliminates the need for the laser apparatus and thus can reduce costs significantly. In addition, this embodiment can be easily applied to a large-sized substrate.

If a foreign matter such as dust is adhered to the surface of the substrate that is subjected to light irradiation at the time of irradiating the resin layer with laser light through the substrate, in some cases, nonuniformity occurs in the light irradiation and part of the resin layer has low peelability, leading to a reduction in yield of the process for separating the resin layer and the substrate from each other. In this embodiment, the heat treatment improves the peelability of the resin layer. Even when a foreign matter is adhered to the substrate, heating nonuniformity does not easily occur in the resin layer, which inhibits a reduction in yield of the process for separating the resin layer and the substrate from each other.

Since a step of irradiating the entire area of the resin layer with laser light through the substrate is not performed, damage to the substrate by laser light irradiation can be prevented. After being used once, the substrate substantially maintains its strength and thus can be reused, which results in cost reduction.

Alternatively, this embodiment may be as follows. First, the metal oxide layer is formed over the substrate. Then, the first layer is formed over the metal oxide layer with the use of a material containing a resin or a resin precursor. Subsequently, heat treatment is performed on the first layer, so that the resin layer is formed. Next, an insulating layer is formed over the substrate and the resin layer to cover an end portion of the resin layer. Then, a transistor including a metal oxide in a channel formation region is formed over the resin layer with the insulating layer positioned between the resin layer and the transistor. Next, at least part of the resin layer is separated from the metal oxide layer, whereby a separation trigger is formed. Then, the metal oxide layer and the resin layer are separated from each other.

The top surface of the substrate includes a portion in contact with the resin layer and a portion in contact with the insulating layer. The insulating layer is provided to cover the end portion of the resin layer. The insulating layer has higher adhesion or adhesiveness to the metal oxide layer than the resin layer does. When the insulating layer is provided to cover the end portion of the resin layer, unintentional peeling of the resin layer from the substrate can be inhibited. For example, peeling of the resin layer during transfer of the substrate can be inhibited. In addition, the formation of the separation trigger enables the metal oxide layer and the resin layer to be separated from each other at desired timing. In other words, not only is a small force required for the separation, but the timing of the separation between the metal oxide layer and the resin layer can be controlled in this embodiment. This can increase the yield of the process for separating the meal oxide layer and the resin layer from each other and that of the manufacturing process of a display device.

The display device of this embodiment preferably includes a metal oxide in the channel formation region of the transistor. A metal oxide can function as an oxide semiconductor.

In the case where low temperature polysilicon (LTPS) is used for a channel formation region of a transistor, the resin layer is required to have heat resistance because heat at a temperature of approximately 500° C. to 550° C. needs to be applied. In some cases, the resin layer is required to have a larger thickness to relieve the damage in a laser crystallization step.

In contrast, a transistor including a metal oxide in a channel formation region can be formed at a temperature lower than or equal to 350° C., or even lower than or equal to 300° C. Therefore, the resin layer is not required to have high heat resistance. Accordingly, the upper temperature limit of the resin layer may be low, and the range of choices for the materials can be widened. Furthermore, the transistor including a metal oxide in the channel formation region does not need a laser crystallization step; thus, the resin layer can be thin. Since the resin layer is not required to have high heat resistance and can be thinned, the manufacturing costs of a device can be significantly reduced. A metal oxide is preferably used, in which case the process can be simplified as compared with the case where LTPS is used.

Note that the display device of one embodiment of the present invention is not limited to the structure in which the transistor includes a metal oxide in the channel formation region. For example, in the display device of this embodiment, the transistor can include silicon in the channel formation region. As silicon, for example, amorphous silicon or crystalline silicon can be used. Examples of crystalline silicon include microcrystalline silicon, polycrystalline silicon, and single crystal silicon.

LTPS is preferably used for the channel formation region. Polycrystalline silicon, e.g., LTPS, can be formed at a lower temperature than single crystal silicon and has higher field effect mobility and higher reliability than amorphous silicon.

The resin layer may have a thickness of greater than or equal to 0.1 μm and less than or equal to 5 μm. By forming the resin layer thin, the display device can be manufactured at low costs. In addition, the display device can be lightweight and thin. Furthermore, the display device can have higher flexibility.

In this embodiment, the transistor or the like is formed at a temperature lower than or equal to the upper temperature limit of the resin layer. The heat resistance of the resin layer can be measured by, for example, heat-induced weight loss percentage, specifically, 5% weight loss temperature. In the peeling method of this embodiment and the manufacturing method of a display device of this embodiment, the maximum temperature in the process can be low. For example, in this embodiment, the 5% weight loss temperature of the resin layer can be higher than or equal to 200° C. and lower than or equal to 650° C., higher than or equal to 200° C. and lower than or equal to 500° C., higher than or equal to 200° C. and lower than or equal to 400° C., or higher than or equal to 200° C. and lower than or equal to 350° C. Thus, the range of choices for materials is widened. Note that the 5% weight loss temperature of the resin layer may be higher than 650° C.

The manufacturing method of the display device of this embodiment will be specifically described below.

Note that thin films included in the display device (e.g., insulating films, semiconductor films, or conductive films) can be formed by any of a sputtering method, a chemical vapor deposition (CVD) method, a vacuum evaporation method, a pulsed laser deposition (PLD) method, an atomic layer deposition (ALD) method, and the like. As the CVD method, a plasma-enhanced chemical vapor deposition (PECVD) method or a thermal CVD method may be used. As the thermal CVD method, for example, a metal organic chemical vapor deposition (MOCVD) method may be used.

Alternatively, thin films included in the display device (e.g., insulating films, semiconductor films, or conductive films) can be formed by a method such as spin coating, dipping, spray coating, ink-jetting, dispensing, screen printing, or offset printing, or with a doctor knife, a slit coater, a roll coater, a curtain coater, or a knife coater.

When thin films included in the display device are processed, a lithography method or the like can be used for the processing. Alternatively, island-shaped thin films may be formed by a film formation method using a shadow mask. A nanoimprinting method, a sandblast method, a lift-off method, or the like may be used for the processing of thin films. Examples of a photolithography method include a method in which a resist mask is formed over a thin film to be processed, the thin film is processed by etching or the like, and the resist mask is removed, and a method in which a photosensitive thin film is formed and exposed to light and developed to be processed into a desired shape.

In the case of using light in the lithography method, any of an i-line (light with a wavelength of 365 nm), a g-line (light with a wavelength of 436 nm), and an h-line (light with a wavelength of 405 nm), or combined light of any of them can be used for exposure. Alternatively, ultraviolet light, KrF laser light, ArF laser light, or the like can be used. Exposure may be performed by liquid immersion exposure technique. As the light for the exposure, extreme ultra-violet (EUV) light or X-rays may be used. Instead of the light for the exposure, an electron beam can be used. It is preferable to use EUV, X-rays, or an electron beam because extremely minute processing can be performed. Note that in the case of performing exposure by scanning of a beam such as an electron beam, a photomask is not needed.

For etching of thin films, a dry etching method, a wet etching method, a sandblast method, or the like can be used.

[Peeling Method]

First, the metal oxide layer 20 is formed over the formation substrate 14 (FIG. 4A1). Alternatively, a metal layer 19 and the metal oxide layer 20 are stacked over the formation substrate 14 (FIG. 4A2).

The formation substrate 14 has rigidity high enough for easy transfer and has resistance to heat applied in the manufacturing process. Examples of a material that can be used for the formation substrate 14 include glass, quartz, ceramics, sapphire, a resin, a semiconductor, a metal, and an alloy. Examples of the glass include alkali-free glass, barium borosilicate glass, and aluminoborosilicate glass.

As described above, a base layer is formed between the formation substrate 14 and the resin layer 23 in this embodiment. The base layer has lower adhesion (adhesiveness) to the resin layer 23 than the formation substrate 14. Although the metal oxide layer 20 is used in an example described in this embodiment, one embodiment of the present invention is not limited to this example.

Specifically, the base layer can be a layer that includes one or more of titanium, molybdenum, aluminum, tungsten, silicon, indium, zinc, gallium, tantalum, tin, hafnium, yttrium, zirconium, magnesium, lanthanum, cerium, neodymium, bismuth, and niobium. The base layer can contain a metal, an alloy, and a compound thereof (e.g., a metal oxide). The base layer preferably includes one or more of titanium, molybdenum, aluminum, tungsten, silicon, indium, zinc, gallium, tantalum, and tin.

The material for the base layer is not limited to an inorganic material and may be an organic material. For example, any of a variety of organic materials that can be used for an EL layer of an organic EL element may be used. The base layer can be an evaporation film of such an organic material. In that case, a film with low adhesion can be formed.

The metal layer 19 can be formed using any of a variety of metals and alloys, for example.

The metal oxide layer 20 can be formed using an oxide of any of a variety of metals. As examples of the metal oxide, titanium oxide ($TiO_x$), molybdenum oxide, aluminum oxide, tungsten oxide, indium tin oxide containing silicon (ITSO), indium zinc oxide, an In—Ga—Zn oxide, and the like can be given.

As other examples of the metal oxide, indium oxide, indium oxide containing titanium, indium oxide containing tungsten, indium tin oxide (ITO), ITO containing titanium, indium zinc oxide containing tungsten, zinc oxide (ZnO), ZnO containing gallium, hafnium oxide, yttrium oxide, zirconium oxide, gallium oxide, tantalum oxide, magnesium oxide, lanthanum oxide, cerium oxide, neodymium oxide, tin oxide, bismuth oxide, titanate, tantalate, niobate, and the like can be given.

There is no particular limitation on a method for forming the metal oxide layer 20. For example, the metal oxide layer 20 can be formed by a sputtering method, a plasma-enhanced CVD method, an evaporation method, a sol-gel method, an electrophoretic method, a spray method, or the like.

The metal oxide layer 20 can be formed in such a manner that a metal layer is formed and then oxygen is introduced into the metal layer. At this time, only a surface of the metal layer or the entire metal layer is oxidized. In the former case, the introduction of oxygen into the metal layer forms a structure in which the metal layer 19 and the metal oxide layer 20 are stacked (FIG. 4A2).

In the case where the metal layer 19 is provided between the formation substrate 14 and the metal oxide layer 20 as illustrated in FIG. 4A2, the separation process is preferably performed while the formation substrate 14 is heated. Owing to the high thermal conductance of the metal layer 19, heat is evenly transferred throughout the entire metal layer 19 when the metal layer 19 is heated. This probably allows more uniform peeling.

The oxidation of the metal layer can be performed, for example, by heating the metal layer in an oxygen-containing atmosphere. It is preferable that the metal layer be heated while an oxygen-containing gas is supplied. The temperature at which the metal layer is heated is preferably higher than or equal to 100° C. and lower than or equal to 500° C., further preferably higher than or equal to 100° C. and lower than or equal to 450° C., still further preferably higher than or equal to 100° C. and lower than or equal to 400° C., yet still further preferably higher than or equal to 100° C. and lower than or equal to 350° C.

The temperature at which the metal layer is heated is preferably set to lower than or equal to the maximum temperature in manufacturing the transistor. In that case, the maximum temperature in manufacturing the display device can be prevented from increasing. When the temperature at which the metal layer is heated is set to lower than or equal to the maximum temperature in manufacturing the transistor, a manufacturing apparatus for the manufacturing process of the transistor can be utilized, which reduces additional capital investment and the like. As a result, the display device can be manufactured at reduced costs. When the manufacturing temperature of the transistor is lower than or equal to 350° C., for example, the temperature of the heat treatment is preferably lower than or equal to 350° C.

Alternatively, the metal layer can be oxidized by performing radical treatment on the surface of the metal layer. In the radical treatment, the surface of the metal layer is preferably exposed to an atmosphere containing an oxygen radical and/or a hydroxyl radical. For example, plasma treatment is preferably performed in an atmosphere containing oxygen and/or water vapor ($H_2O$).

As described above, the force required for the separation of the metal oxide layer 20 and the resin layer 23 from each other can be reduced when hydrogen, oxygen, a hydrogen radical (H*), an oxygen radical (O*), a hydroxyl radical (OH*), or the like is present on a surface of the metal oxide layer 20 or in the metal oxide layer 20. Accordingly, again, it is preferable that the metal oxide layer 20 be formed by performing radical treatment or plasma treatment.

Performing such radical treatment or plasma treatment on the surface of the metal layer to oxidize the metal layer eliminates the need for a step of heating the metal layer at high temperatures. Accordingly, the maximum temperature in manufacturing the display device can be prevented from increasing. Specifically, the maximum temperature in manufacturing the display device can be readily lower than or equal to 350° C.

Alternatively, the metal oxide layer 20 can be formed in an oxygen atmosphere. For example, a metal oxide film is formed by a sputtering method while an oxygen-containing gas is supplied, whereby the metal oxide layer 20 can be formed. Also in this case, the surface of the metal oxide layer 20 is preferably subjected to radical treatment. In the radical treatment, the surface of the metal oxide layer 20 is preferably exposed to an atmosphere containing at least one of an oxygen radical, a hydrogen radical, and a hydroxyl radical. For example, plasma treatment is preferably performed in an atmosphere containing one or more of oxygen, hydrogen, and water vapor ($H_2O$).

For details of the radical treatment, the above description can be referred to.

Alternatively, oxygen, hydrogen, water, or the like can be introduced by an ion implantation method, an ion doping method, a plasma immersion ion implantation method, or the like.

The metal layer 19 preferably has a thickness of greater than or equal to 1 nm and less than or equal to 100 nm, further preferably greater than or equal to 1 nm and less than or equal to 50 nm, still further preferably greater than or equal to 1 nm and less than or equal to 20 nm.

The metal oxide layer 20 preferably has a thickness of, for example, greater than or equal to 1 nm and less than or equal to 200 nm, further preferably greater than or equal to 5 nm and less than or equal to 100 nm, still further preferably greater than or equal to 5 nm and less than or equal to 50 nm. In the case where the metal oxide layer 20 is formed using the metal layer, the completed metal oxide layer 20 is sometimes thicker than the initially formed metal layer.

The force required for the separation can be reduced by feeding a water-containing liquid to the interface between the metal oxide layer 20 and the resin layer 23 before or during the separation. The smaller the contact angle between the metal oxide layer 20 and the liquid is, the more effective the liquid feeding is. Specifically, the contact angle between the metal oxide layer 20 and the water-containing liquid is preferably greater than 0° and less than or equal to 60°, further preferably greater than 0° and less than or equal to 50°.

The metal oxide layer 20 preferably has a photocatalytic effect. Light irradiation of the metal oxide layer having a photocatalytic effect causes a photocatalytic reaction. As a result, the bonding strength between the metal oxide layer and the resin layer is weakened to allow easy separation without irradiation with high-energy light such as laser light. Titanium oxide, tungsten oxide, or the like is suitable for the metal oxide layer 20. Titanium oxide is preferably used because the cost can be lower than that when tungsten oxide is used.

For example, the metal oxide layer 20 is irradiated with ultraviolet light. Between the formation of the metal oxide layer 20 and formation of a first layer 24, the metal oxide layer can be irradiated with ultraviolet light directly, through no layer. Alternatively, the metal oxide layer 20 may be irradiated with ultraviolet light through the formation substrate 14 before or during the separation. An ultraviolet light lamp can be suitably used for the ultraviolet light irradiation. Examples of the ultraviolet light lamp include a mercury lamp, a mercury-xenon lamp, and a metal halide lamp. The light used for the irradiation is not limited to ultraviolet light, and light of a wavelength such that the metal oxide layer is activated can be appropriately used.

The metal oxide layer 20 may be formed using titanium oxide to which a metal or nitrogen is added. When the metal oxide layer 20 is formed using titanium oxide to which such an element is added, visible light can be used for the activation instead of ultraviolet light.

Next, the first layer 24 is formed over the metal oxide layer 20 (FIG. 4B).

FIG. 4B illustrates an example in which the first layer 24 is formed over the entire area of the metal oxide layer 20 by a coating method. One embodiment of the present invention is not limited to this example and a printing method or the like may be employed to form the first layer 24. The first layer 24 having an island-like shape or the first layer 24 having an opening or unevenness may be formed over the metal oxide layer 20.

The first layer 24 can be formed using any of a variety of resin materials (including resin precursors).

The first layer 24 is preferably formed using a thermosetting material.

The first layer 24 may be formed using a material with photosensitivity or a material without photosensitivity (also called a non-photosensitive material).

When a photosensitive material is used, the resin layer 23 can be formed to have a desired shape by removing part of the first layer 24 by a photolithography method.

The first layer 24 is preferably formed using a material containing a polyimide resin or a polyimide resin precursor. The first layer 24 can be formed using, for example, a material containing a polyimide resin and a solvent or a material containing polyamic acid and a solvent. A polyimide is a material suitable for a planarization film or the like of a display device; therefore, the film formation apparatus and the material can be shared. Thus, there is no need to prepare another apparatus and another material to obtain the structure of one embodiment of the present invention.

Specifically, the resin layer 23 preferably contains a residue of a compound represented by Structural Formula (100) (an oxydiphthalic acid).

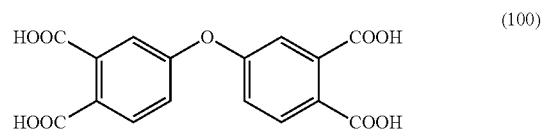 [SMILES: O=C(O)c1ccc(Oc2ccc(C(=O)O)c(C(=O)O)c2)cc1C(=O)O]
(100)

A polyimide resin obtained using an acid component including an oxydiphthalic acid or an oxydiphthalic acid derivative and an amine component including an aromatic amine or an aromatic amine derivative is suitable for the resin layer 23. Examples of the oxydiphthalic acid derivative include an oxydiphthalic anhydride. The resin layer 23 may contain fluorine. In the case where the resin layer 23 contains fluorine, a hydrogen bond between the metal oxide layer 20 and the resin layer 23 is sometimes formed using the fluorine.

Table 1 lists physical properties of materials each of which contains a polyimide resin or a polyimide resin precursor and which can be suitably used for the first layer 24.

TABLE 1

| | Item | Unit | Material A | Material B | Material C | Material D | Material E |
|---|---|---|---|---|---|---|---|
| | Thickness | μm | 20 | 20 | 20 | 1 to 3 | 1 to 2 |
| | Solvent | — | NMP | NMP | NMP | γ-butyrolactone, ethyl lactate | γ-butyrolactone |
| | Solid content | wt % | 18 ± 1.0 | 18 ± 1.0 | 18 ± 1.0 | 17.5 ± 1.0 | 8.0 |
| | Solution viscosity | Pa · S | 5 ± 1 | 5 ± 1 | 100 ± 10 | 0.03 (30 cP) | 0.07 (70 cP) |
| | Maximum treatment temperature | ° C. | 350 | 450 | 450 | 350 | 450 |
| Properties | Tg | ° C. | 274 | 322 | 327 | 200 | 275 |
| of film | Coefficient of linear expansion (50° C. to 200° C.) | ppm/K | 33 | 3 | 3 | 36 | 45 |
| | 5% weight loss temperature | ° C. | 592 | 619 | 609 | 350 | 450 |

The resin layer 23 can be formed using any of Materials A to E listed in Table 1. To make the resin layer 23 highly reliable, the glass transition temperature (Tg) and the 5% weight loss temperature of the material are preferably high.

Examples of resin materials which can be used to form the first layer 24 include an acrylic resin, an epoxy resin, a polyamide resin, a polyimide-amide resin, a siloxane resin, a benzocyclobutene-based resin, a phenol resin, and precursors of these resins.

The first layer 24 is preferably formed with a spin coater. By a spin coating method, a thin film can be uniformly formed over a large-sized substrate.

The first layer 24 is preferably formed using a solution having a viscosity of greater than or equal to 5 cP and less than 500 cP, further preferably greater than or equal to 5 cP and less than 100 cP, still further preferably greater than or equal to 10 cP and less than or equal to 50 cP. The lower the viscosity of the solution is, the easier the application is. The lower the viscosity of the solution is, the more the entry of air bubbles can be inhibited and thus the higher the quality of a formed film can be.

The first layer 24 can be formed by dipping, spray coating, ink-jetting, dispensing, screen printing, or offset printing, or with a doctor knife, a slit coater, a roll coater, a curtain coater, or a knife coater, for example.

Next, heat treatment is performed on the first layer 24, so that the resin layer 23 is formed (FIG. 4C).

The heat treatment can reduce the adhesion or adhesiveness between the metal oxide layer 20 and the resin layer 23.

The heat treatment is preferably performed in an oxygen-containing atmosphere. The larger the amount of oxygen contained in the resin layer 23 is, the smaller the force required for separating the meal oxide layer 20 and the resin layer 23 from each other can be. The higher the proportion of oxygen in the atmosphere of the heat treatment is, the easier it can be to separate the resin layer and the metal oxide layer from each other.

Owing to the moisture present in the metal oxide layer 20, in the resin layer 23, or at the interface between the metal oxide layer 20 and the resin layer 23, for example, the force required for separating the metal oxide layer 20 and the resin layer 23 from each other can be reduced.

The water present between the metal oxide layer 20 and the resin layer 23 lowers the adhesion or adhesiveness between the metal oxide layer 20 and the resin layer 23. As a result, separation can be easily performed at the interface between the metal oxide layer 20 and the resin layer 23.

Furthermore, the heat treatment expands the water between the metal oxide layer 20 and the resin layer 23 (the water changes into water vapor to have an expanded volume). Accordingly, the adhesion or adhesiveness between the metal oxide layer 20 and the resin layer 23 can be lowered.

The heat treatment can be performed with the atmosphere in a chamber of a heating apparatus set to an oxygen-containing atmosphere, for example. Alternatively, the heat treatment can be performed in an air atmosphere with the use of a chamber of a heating apparatus, a hot plate, or the like.

For example, the oxygen partial pressure of the atmosphere during the heat treatment is preferably higher than or equal to 5% and lower than 100%, further preferably higher than or equal to 10% and lower than 100%, still further preferably higher than or equal to 15% and lower than 100%.

It is preferable to perform the heat treatment in an air atmosphere. In the case where the heat treatment is performed in an air atmosphere, moisture is more easily held in the metal oxide layer 20, in the resin layer 23, or at the interface between the metal oxide layer 20 and the resin layer 23, for example, than in the case where the heat treatment is performed while a gas is supplied. Thus, the force required for separating the metal oxide layer 20 and the resin layer 23 from each other can be reduced.

Alternatively, the heat treatment can be performed while an oxygen-containing gas is supplied into the chamber of the heating apparatus. The heat treatment can be performed while only an oxygen gas or a mixed gas containing an oxygen gas is supplied, for example. Specifically, it is possible to use a mixed gas containing oxygen and either nitrogen or a rare gas (e.g., argon).

When the proportion of oxygen in the atmosphere is set high, some heating apparatuses deteriorate. Therefore, when a mixed gas containing an oxygen gas is used, the proportion of the oxygen gas flow rate in the total flow rate of the mixed gas is preferably higher than or equal to 5% and lower than or equal to 50%, further preferably higher than or equal to 10% and lower than or equal to 50%, still further preferably higher than or equal to 15% and lower than or equal to 50%.

The temperature of the heat treatment is preferably higher than or equal to 100° C. and lower than or equal to 500° C., further preferably higher than or equal to 100° C. and lower than or equal to 450° C., still further preferably higher than or equal to 100° C. and lower than or equal to 400° C., yet still further preferably higher than or equal to 100° C. and lower than or equal to 350° C.

The higher the temperature of the heat treatment is, the higher the peelability of the resin layer 23 can be.

By the heat treatment, released gas components (e.g., hydrogen or water) in the resin layer 23 can be reduced. In particular, the heat treatment is preferably performed at a temperature higher than or equal to the fabricating temperature of each layer formed over the resin layer 23. Thus, a gas released from the resin layer 23 in the manufacturing process of the transistor can be significantly reduced.

For example, in the case where the manufacturing temperature of the transistor is lower than or equal to 350° C., a film to be the resin layer 23 is preferably heated at a temperature higher than or equal to 350° C. and lower than or equal to 480° C., further preferably higher than or equal to 350° C. and lower than or equal to 400° C., still further preferably higher than or equal to 350° C. and lower than or equal to 375° C. Thus, a gas released from the resin layer 23 in the manufacturing process of the transistor can be significantly reduced.

The temperature of the heat treatment is preferably set to lower than or equal to the maximum temperature in manufacturing the transistor. When the temperature of the heat treatment is set to lower than or equal to the maximum temperature in manufacturing the transistor, a manufacturing apparatus for the manufacturing process of the transistor can be utilized, which reduces additional capital investment and the like. As a result, the display device can be manufactured at reduced costs. When the manufacturing temperature of the transistor is lower than or equal to 350° C., for example, the temperature of the heat treatment is preferably lower than or equal to 350° C.

The maximum temperature in manufacturing the transistor is preferably equal to the temperature of the heat treatment, in which case it is possible to prevent the heat treatment from increasing the maximum temperature in manufacturing the display device and it is also possible to reduce the released gas components in the resin layer 23.

The longer the duration of the heat treatment is, the higher the peelability of the resin layer 23 can be.

Even when the heating temperature is relatively low, increasing treatment time enables peelability as high as the peelability that is obtained at higher heating temperatures in some cases. It is thus preferable that the treatment time be set long when the heating temperature cannot be set high owing to the structure of the heating apparatus.

The duration of the heat treatment is preferably longer than or equal to five minutes and shorter than or equal to 24 hours, further preferably longer than or equal to 30 minutes and shorter than or equal to 12 hours, still further preferably longer than or equal to one hour and shorter than or equal to six hours, for example. Note that the duration of the heat treatment is not particularly limited to these examples. For example, the duration of the heat treatment that is performed by a rapid thermal annealing (RTA) method may be shorter than five minutes.

As the heating apparatus, it is possible to use, for example, an electric furnace or any apparatus for heating an object by heat conduction or heat radiation from a heating element such as a resistance heating element. For example, an RTA apparatus such as a gas rapid thermal annealing (GRTA) apparatus or a lamp rapid thermal annealing (LRTA) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. With such an RTA apparatus, the treatment time can be shortened and thus the RTA apparatus is preferred for mass production. Alternatively, an in-line heating apparatus may be used in the heat treatment.

Here, in the case where a resin is used for a planarization layer of a display device, for example, to prevent oxidation and deterioration of the resin, the heating is commonly performed with little oxygen and at a temperature that cures the resin and is as low as possible. However, in one embodiment of the present invention, heating is performed at relatively high temperatures (e.g., higher than or equal to 200° C.) in the state where a surface of the first layer 24 that is to be the resin layer 23 is exposed to an atmosphere that intentionally contains oxygen. This allows the resin layer 23 to have high peelability.

Note that the heat treatment sometimes makes the resin layer 23 thinner or thicker than the first layer 24. For example, in some cases, the volume decreases when the solvent contained in the first layer 24 is removed or when the density increases with proceeding curing, which makes the thickness of the resin layer 23 smaller than that of the first layer 24. Instead, in other cases, the volume increases when oxygen is supplied to the resin layer 23 at the time of the heat treatment, which makes the thickness of the resin layer 23 larger than that of the first layer 24.

Before the heat treatment, heat treatment (also referred to as prebaking treatment) for removing the solvent contained in the first layer 24 may be performed. The temperature of the prebaking treatment can be set as appropriate according to the material that is used. For example, the temperature of the prebaking treatment can be higher than or equal to 50° C. and lower than or equal to 180° C., higher than or equal to 80° C. and lower than or equal to 150° C., or higher than or equal to 90° C. and lower than or equal to 120° C. The heat treatment may double as the prebaking treatment, in which case the solvent contained in the first layer 24 can be removed by the heat treatment.

The resin layer 23 has flexibility. The formation substrate 14 has lower flexibility than the resin layer 23.

The resin layer 23 preferably has a thickness of greater than or equal to 0.01 µm and less than 10 µm, further preferably greater than or equal to 0.1 µm and less than or equal to 5 µm, still further preferably greater than or equal to 0.5 µm and less than or equal to 3 µm. By forming the resin layer thin, the display device can be manufactured at low costs. The display device can be lightweight and thin. The display device can have higher flexibility. The use of a solution having low viscosity facilitates the formation of the resin layer 23 having a small thickness. One embodiment of the present invention is not limited to the above examples, and the thickness of the resin layer 23 may be greater than or equal to 10 µm. For example, the resin layer 23 may have a thickness of greater than or equal to 10 µm and less than or equal to 200 µm. The resin layer 23 preferably has a thickness of greater than or equal to 10 µm because the rigidity of the display device can be increased.

The resin layer 23 preferably has a thermal expansion coefficient of greater than or equal to 0.1 ppm/° C. and less than or equal to 50 ppm/° C., further preferably greater than or equal to 0.1 ppm/° C. and less than or equal to 20 ppm/° C., still further preferably greater than or equal to 0.1 ppm/° C. and less than or equal to 10 ppm/° C. The lower the thermal expansion coefficient of the resin layer 23 is, the more the generation of a crack in a layer included in a transistor or the like and breakage of a transistor or the like which are caused owing to the heating can be prevented.

The visible-light-transmitting property of the resin layer 23 is not particularly limited. For example, the resin layer 23 may be a colored layer or a transparent layer. In the case where the resin layer 23 is positioned on the display surface side of the display device, the resin layer 23 preferably has a high visible-light-transmitting property.

Next, a layer 25 to be peeled is formed over the resin layer 23 (FIG. 4D).

An insulating layer or a functional element (e.g., a transistor or a display element), for example, can be provided as the layer 25 to be peeled.

The layer 25 to be peeled preferably includes an insulating layer. The insulating layer preferably has a function of blocking hydrogen, oxygen, and water that are released from the metal oxide layer 20, the resin layer 23, and the like in a later heating step.

The layer to be peeled preferably includes, for example, a silicon nitride film, a silicon oxynitride film, or a silicon nitride oxide film. For example, a silicon nitride film is formed by a plasma-enhanced CVD method using a deposition gas containing a silane gas, a hydrogen gas, and an ammonia ($NH_3$) gas. There are no particular limitations on the thickness of the insulating layer. The thickness can be, for example, greater than or equal to 50 nm and less than or equal to 600 nm, preferably greater than or equal to 100 nm and less than or equal to 300 nm.

Note that in this specification and the like, "silicon oxynitride" contains more oxygen than nitrogen. In this specification and the like, "silicon nitride oxide" contains more nitrogen than oxygen.

Next, a protective layer is formed over the layer 25 to be peeled. The protective layer is a layer positioned on the outermost surface of the display device. The protective layer preferably has a high visible-light-transmitting property. The protective layer preferably includes an organic insulating film because it is possible to prevent the surface of the display device from being damaged or cracked.

FIG. 4D illustrates an example in which a substrate 75*a* is bonded to the layer 25 to be peeled, with the use of an adhesive layer 75*b*.

As the adhesive layer 75*b*, any of a variety of curable adhesives such as a reactive curable adhesive, a thermosetting adhesive, an anaerobic adhesive, and a photo-curable adhesive such as an ultraviolet curable adhesive can be used. Alternatively, an adhesive sheet or the like may be used.

For the substrate 75*a*, a polyester resin such as polyethylene terephthalate (PET) or polyethylene naphthalate (PEN), a polyacrylonitrile resin, an acrylic resin, a polyimide resin, a polymethyl methacrylate resin, a polycarbonate (PC) resin, a polyether sulfone (PES) resin, a polyamide resin (e.g., nylon or aramid), a polysiloxane resin, a cycloolefin resin, a polystyrene resin, a polyamide-imide resin, a polyurethane resin, a polyvinyl chloride resin, a polyvinylidene chloride resin, a polypropylene resin, a polytetrafluoroethylene (PTFE) resin, an ABS resin, or cellulose nanofiber can be used, for example. The substrate 75*a* may be formed using any of a variety of materials such as glass, quartz, a resin, a metal, an alloy, and a semiconductor, each of which is thin enough to be flexible.

Then, the formation substrate 14 and the resin layer 23 are separated from each other. Owing to the low adhesion or adhesiveness between the metal oxide layer 20 and the resin layer 23, separation occurs at the interface between the metal oxide layer 20 and the resin layer 23 (FIG. 4E).

The formation substrate 14 and the resin layer 23 can be separated from each other by applying a perpendicular tensile force to the resin layer 23, for example. Specifically, the resin layer 23 can be peeled from the formation substrate 14 by pulling up the substrate 75a by part of its suction-attached top surface.

Here, if the separation is performed in such a manner that a water-containing liquid such as water or an aqueous solution is added to the separation interface and the liquid penetrates into the separation interface, the ease of the separation can be enhanced. Furthermore, an adverse effect of static electricity caused at the separation on the functional element such as a transistor (e.g., damage to a semiconductor element from static electricity) can be suppressed. FIG. 4E illustrates an example in which a liquid is fed to the separation interface with a liquid feeding mechanism 21.

The liquid to be fed can be water (preferably pure water), a neutral, alkaline, or acidic aqueous solution, an aqueous solution in which a salt is dissolved, or the like. Other examples of the liquid include ethanol and acetone. Any of a variety of organic solvents may also be used.

Before the separation, a separation trigger may be formed by separating part of the resin layer 23 from the formation substrate 14. For example, the separation trigger may be formed by inserting a sharp instrument such as a knife between the formation substrate 14 and the resin layer 23. Alternatively, the separation trigger may be formed by cutting the resin layer 23 from the substrate 75a side with a sharp instrument. Further alternatively, the separation trigger may be formed by a method that uses a laser, such as a laser ablation method.

In this embodiment, the metal oxide layer 20 and the resin layer 23 (or the first layer 24) are stacked, followed by heat treatment. As a result, the adhesion or adhesiveness between the metal oxide layer 20 and the resin layer 23 can be lowered. Accordingly, the formation substrate 14 and the resin layer 23 can be separated from each other without laser irradiation performed on the entire area of the resin layer 23. In this manner, a display device can be manufactured at low costs.

The peeling method of this embodiment makes it possible to provide a manufacturing method of a semiconductor device or a peeling method each having a low cost and a high mass productivity. For example, since the formation substrate 14 (e.g., a glass substrate) or a stack including the formation substrate 14 and the metal oxide layer 20 can be repeatedly used in the peeling method of this embodiment, the manufacturing costs can be reduced.

Manufacturing Method Example 1

Next, manufacturing method examples of the display device of this embodiment will be described. Portions similar to those in the above-described peeling method are not described in some cases.

Figure 5A:
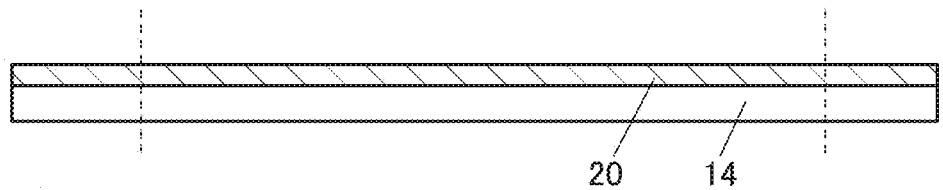
FIGS. 5A to 5E are cross-sectional views illustrating an example of a manufacturing method of a display device.

First, the metal oxide layer 20 is formed over the formation substrate 14 (FIG. 5A). For the metal oxide layer 20, the description of the above peeling method can be referred to.

Figure 5B:
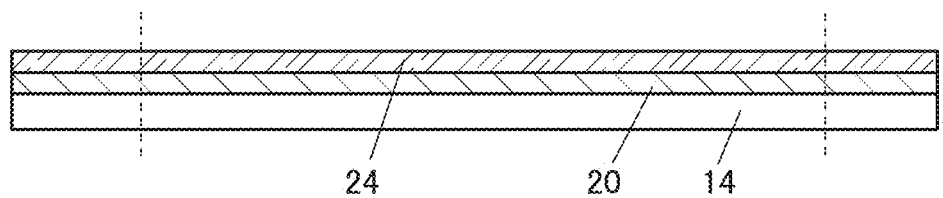

Next, the first layer 24 is formed over the metal oxide layer 20 (FIG. 5B). For the first layer 24, the description of the above peeling method can be referred to.

In this embodiment, the first layer 24 is formed using a photosensitive and thermosetting material. Note that the first layer 24 may be formed using a non-photosensitive material.

Figure 5C:
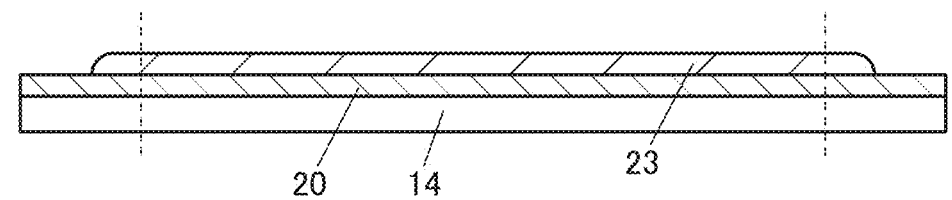

Heat treatment (prebaking treatment) for removing a solvent is performed after formation of the first layer 24, and then light exposure is performed using a photomask. Next, development is performed, whereby an unnecessary portion can be removed. Subsequently, heat treatment is performed on the first layer 24 that has been processed into a desired shape, so that the resin layer 23 is formed (FIG. 5C). In the example illustrated in FIG. 5C, the resin layer 23 having an island-like shape is formed.

Note that the resin layer 23 is not necessarily in the form of a single island and may be in the form of a plurality of islands or have an opening, for example. In addition, unevenness may be formed on the surface of the resin layer 23 by an exposure technique using a half-tone mask or a gray-tone mask, a multiple exposure technique, or the like.

The resin layer 23 with a desired shape can be formed in such a manner that a mask such as a resist mask or a hard mask is formed over the first layer 24 or the resin layer 23 and etching is performed. This method is particularly suitable for the case of using a non-photosensitive material.

For example, an inorganic film is formed over the resin layer 23, and a resist mask is formed over the inorganic film. After the inorganic film is etched with the use of the resist mask, the resin layer 23 can be etched using the inorganic film as a hard mask.

As examples of an inorganic film that can be used as the hard mask, a variety of inorganic insulating films, metal films and alloy films that can be used for a conductive layer, and the like can be given.

It is preferable to form the mask with an extremely small thickness and remove the mask concurrently with the etching, in which case a step of removing the mask can be eliminated.

For details of the heat treatment, the description of the heat treatment in the above peeling method can be referred to.

Figure 5D:
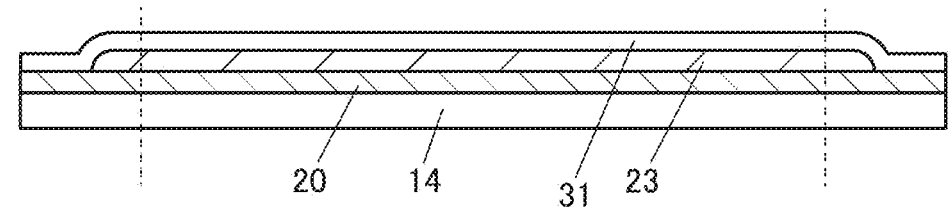

Next, an insulating layer 31 is formed over the resin layer 23 (FIG. 5D). The insulating layer 31 is formed to cover an end portion of the resin layer 23. The metal oxide layer 20 includes a portion over which the resin layer 23 is not provided. Accordingly, the insulating layer 31 can be formed over and in contact with the metal oxide layer 20.

The insulating layer 31 is formed at a temperature lower than or equal to the upper temperature limit of the resin layer 23. The insulating layer 31 is preferably formed at a temperature lower than the temperature of the heat treatment.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

As the insulating layer 31, an inorganic insulating film such as a silicon nitride film, a silicon oxynitride film, a silicon oxide film, a silicon nitride oxide film, an aluminum oxide film, or an aluminum nitride film can be used, for example. A hafnium oxide film, an yttrium oxide film, a zirconium oxide film, a gallium oxide film, a tantalum oxide film, a magnesium oxide film, a lanthanum oxide film, a cerium oxide film, a neodymium oxide film, or the like may be used. A stack including two or more of the above insulating films may also be used. It is particularly preferable that a silicon nitride film be formed over the resin layer 23 and a silicon oxide film be formed over the silicon nitride film.

An inorganic insulating film is preferably formed at high temperatures because the film can have higher density and a higher barrier property as the deposition temperature becomes higher.

The substrate temperature during the formation of the insulating layer 31 is preferably higher than or equal to room temperature (25° C.) and lower than or equal to 350° C., further preferably higher than or equal to 100° C. and lower than or equal to 300° C.

Figure 5E:
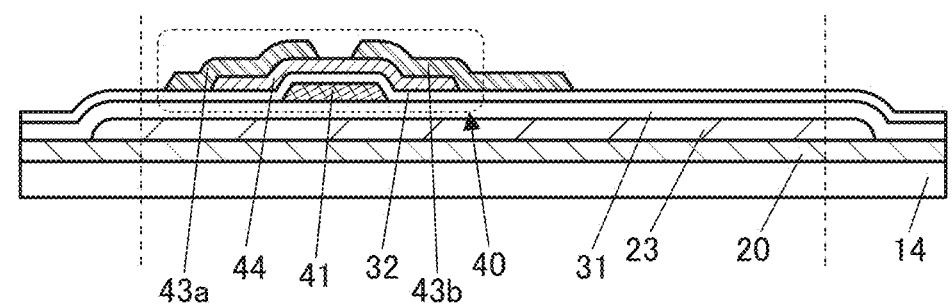

Next, a transistor 40 is formed over the insulating layer 31 (FIG. 5E).

There is no particular limitation on the structure of the transistor included in the display device. For example, a planar transistor, a staggered transistor, or an inverted staggered transistor may be used. A top-gate transistor or a bottom-gate transistor may be used. Gate electrodes may be provided above and below a channel.

In this example, a bottom-gate transistor including a metal oxide layer 44 is formed as the transistor 40. The metal oxide layer 44 can function as a semiconductor layer of the transistor 40. A metal oxide can function as an oxide semiconductor.

In this embodiment, an oxide semiconductor is used as a semiconductor of a transistor. A semiconductor material having a wider bandgap and a lower carrier density than silicon is preferably used because off-state current of the transistor can be reduced.

The transistor 40 is formed at a temperature lower than or equal to the upper temperature limit of the resin layer 23. The transistor 40 is preferably formed at a temperature lower than the temperature of the heat treatment.

Specifically, first, a conductive layer 41 is formed over the insulating layer 31. The conductive layer 41 can be formed in the following manner: a conductive film is formed, a resist mask is formed, the conductive film is etched, and the resist mask is removed.

The substrate temperature during the formation of the conductive film is preferably higher than or equal to room temperature and lower than or equal to 350° C., further preferably higher than or equal to room temperature and lower than or equal to 300° C.

The conductive layers included in the display device can each have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. Alternatively, a light-transmitting conductive material such as indium oxide, indium tin oxide (ITO), indium oxide containing tungsten, indium zinc oxide containing tungsten, indium oxide containing titanium, ITO containing titanium, indium zinc oxide, zinc oxide (ZnO), ZnO containing gallium, or ITO containing silicon may be used. Alternatively, a semiconductor such as polycrystalline silicon or an oxide semiconductor whose resistance is lowered by adding an impurity element, for example, or silicide such as nickel silicide may be used. A film including graphene may be used as well. The film including graphene can be formed, for example, by reducing a film including graphene oxide. A semiconductor such as an oxide semiconductor containing an impurity element may be used. Alternatively, the conductive layers may be formed using a conductive paste of silver, carbon, copper, or the like or a conductive polymer such as a polythiophene. A conductive paste is preferable because it is inexpensive. A conductive polymer is preferable because it is easily applied.

Next, an insulating layer 32 is formed. For the insulating layer 32, the description of the inorganic insulating film that can be used for the insulating layer 31 can be referred to.

Then, the metal oxide layer 44 is formed. The metal oxide layer 44 can be formed in the following manner: a metal oxide film is formed, a resist mask is formed, the metal oxide film is etched, and the resist mask is removed.

The substrate temperature during the formation of the metal oxide film is preferably lower than or equal to 350° C., further preferably higher than or equal to room temperature and lower than or equal to 200° C., still further preferably higher than or equal to room temperature and lower than or equal to 130° C.

The metal oxide film can be formed using either or both of an inert gas and an oxygen gas. Note that there is no particular limitation on the flow ratio of oxygen (the partial pressure of oxygen) in the step of forming the metal oxide film. In the case where a transistor having high field-effect mobility is obtained, the flow ratio of oxygen (the partial pressure of oxygen) in the step of forming the metal oxide film is preferably higher than or equal to 0% and lower than or equal to 30%, further preferably higher than or equal to 5% and lower than or equal to 30%, still further preferably higher than or equal to 7% and lower than or equal to 15%.

The metal oxide film preferably contains at least indium or zinc. In particular, indium and zinc are preferably contained.

The energy gap of the metal oxide is preferably 2 eV or more, further preferably 2.5 eV or more, and still further preferably 3 eV or more. The use of such a metal oxide having a wide energy gap leads to a reduction in off-state current of a transistor.

The metal oxide film can be formed by a sputtering method. Alternatively, a PLD method, a PECVD method, a thermal CVD method, an ALD method, a vacuum evaporation method, or the like may be used.

Next, a conductive layer 43a and a conductive layer 43b are formed. The conductive layer 43a and the conductive layer 43b can be formed in the following manner: a conductive film is formed, a resist mask is formed, the conductive film is etched, and the resist mask is removed. Each of the conductive layers 43a and 43b is connected to the metal oxide layer 44.

Note that during the processing for forming the conductive layer 43a and the conductive layer 43b, the metal oxide layer 44 might be partly etched to be thinner in a region not covered by the resist mask.

The substrate temperature during the formation of the conductive film is preferably higher than or equal to room temperature and lower than or equal to 350° C., further preferably higher than or equal to room temperature and lower than or equal to 300° C.

In the above manner, the transistor 40 can be fabricated (FIG. 5E). In the transistor 40, part of the conductive layer 41 functions as a gate, part of the insulating layer 32 functions as a gate insulating layer, and the conductive layer 43a and the conductive layer 43b function as a source and a drain.

Next, an insulating layer 33 covering the transistor 40 is formed (FIG. 6A). The insulating layer 33 can be formed using a method similar to that of the insulating layer 31.

It is preferable to use an oxide insulating film, such as a silicon oxide film or a silicon oxynitride film, formed in an oxygen-containing atmosphere for the insulating layer 33. An insulating film with low oxygen diffusibility and oxygen permeability, such as a silicon nitride film, is preferably stacked over the silicon oxide film or the silicon oxynitride film. The oxide insulating film formed in an oxygen-containing atmosphere can easily release a large amount of oxygen by heating. When a stack including such an oxide insulating film that releases oxygen and such an insulating film with low oxygen diffusibility and oxygen permeability is heated, oxygen can be supplied to the metal oxide layer 44. As a result, oxygen vacancies in the metal oxide layer 44 can be filled and defects at the interface between the metal oxide layer 44 and the insulating layer 33 can be repaired, leading to a reduction in defect levels. Accordingly, a display device with extremely high reliability can be manufactured.

Through the above steps, the insulating layer 31, the transistor 40, and the insulating layer 33 can be formed over the resin layer 23 (FIG. 6A).

If the formation substrate 14 and the transistor 40 are separated from each other at this stage by a method described later, a device including no display element can be manufactured. Forming the transistor 40 or forming a capacitor, a resistor, a wiring, and the like in addition to the transistor 40 can provide a semiconductor device, for example.

Then, an insulating layer 34 is formed over the insulating layer 33 (FIG. 6A). The display element is formed on the insulating layer 34 in a later step; thus, the insulating layer 34 preferably functions as a planarization layer. For the insulating layer 34, the description of the organic insulating film or the inorganic insulating film that can be used for the insulating layer 31 can be referred to.

The insulating layer 34 is formed at a temperature lower than or equal to the upper temperature limit of the resin layer 23. The insulating layer 34 is preferably formed at a temperature lower than the temperature of the heat treatment.

In the case of using an organic insulating film for the insulating layer 34, it is preferable that the temperature applied to the resin layer 23 in forming the insulating layer 34 be higher than or equal to room temperature and lower than or equal to 350° C., further preferably higher than or equal to room temperature and lower than or equal to 300° C.

In the case of using an inorganic insulating film as the insulating layer 34, the substrate temperature during the film formation is preferably higher than or equal to room temperature and lower than or equal to 350° C., further preferably higher than or equal to 100° C. and lower than or equal to 300° C.

Next, an opening reaching the conductive layer 43b is formed in the insulating layer 34 and the insulating layer 33.

After that, a conductive layer 61 is formed. The conductive layer 61 partly functions as a pixel electrode of a light-emitting element 60. The conductive layer 61 can be formed in the following manner: a conductive film is formed, a resist mask is formed, the conductive film is etched, and the resist mask is removed.

The conductive layer 61 is formed at a temperature lower than or equal to the upper temperature limit of the resin layer 23. The conductive layer 61 is preferably formed at a temperature lower than the temperature of the heat treatment.

The substrate temperature during the formation of the conductive film is preferably higher than or equal to room temperature and lower than or equal to 350° C., further preferably higher than or equal to room temperature and lower than or equal to 300° C.

Next, an insulating layer 35 is formed to cover an end portion of the conductive layer 61. For the insulating layer 35, the description of the organic insulating film or the inorganic insulating film that can be used for the insulating layer 31 can be referred to.

The insulating layer 35 is formed at a temperature lower than or equal to the upper temperature limit of the resin layer 23. The insulating layer 35 is preferably formed at a temperature lower than the temperature of the heat treatment.

In the case of using an organic insulating film for the insulating layer 35, it is preferable that the temperature applied to the resin layer 23 in forming the insulating layer 35 be higher than or equal to room temperature and lower than or equal to 350° C., further preferably higher than or equal to room temperature and lower than or equal to 300° C.

In the case of using an inorganic insulating film as the insulating layer 35, the substrate temperature during the film formation is preferably higher than or equal to room temperature and lower than or equal to 350° C., further preferably higher than or equal to 100° C. and lower than or equal to 300° C.

Then, an EL layer 62 and a conductive layer 63 are formed. Part of the conductive layer 63 functions as a common electrode of the light-emitting element 60.

The EL layer 62 can be formed by an evaporation method, a coating method, a printing method, a discharge method, or the like. In the case where the EL layer 62 is formed for each individual pixel, an evaporation method using a shadow mask such as a metal mask, an ink-jet method, or the like can be used. In the case of sharing the EL layer 62 by some pixels, an evaporation method not using a metal mask can be used.

Either a low molecular compound or a high molecular compound can be used for the EL layer 62, and an inorganic compound may also be included.

The conductive layer 63 can be formed by an evaporation method, a sputtering method, or the like.

The conductive layer 63 is formed at a temperature that is lower than or equal to the upper temperature limit of the resin layer 23 and lower than or equal to the upper temperature limit of the EL layer 62. The conductive layer 63 is preferably formed at a temperature lower than the temperature of the heat treatment.

In the above manner, the light-emitting element 60 can be formed (FIG. 6A). In the light-emitting element 60, the conductive layer 61 part of which functions as the pixel electrode, the EL layer 62, and the conductive layer 63 part of which functions as the common electrode are stacked.

Although an example where a top-emission light-emitting element is formed as the light-emitting element 60 is described here, one embodiment of the present invention is not limited thereto.

The light-emitting element may be a top-emission, bottom-emission, or dual-emission light-emitting element. A conductive film that transmits visible light is used as the electrode through which light is extracted. A conductive film that reflects visible light is preferably used as the electrode through which light is not extracted.

Next, an insulating layer 74 is formed so as to cover the conductive layer 63 (FIG. 6A). The insulating layer 74 functions as a protective layer that prevents diffusion of impurities such as water into the light-emitting element 60. The light-emitting element 60 is sealed with the insulating layer 74. After the conductive layer 63 is formed, the insulating layer 74 is preferably formed without exposure to the air.

The insulating layer 74 is formed at a temperature that is lower than or equal to the upper temperature limit of the resin layer 23 and lower than or equal to the upper temperature limit of the light-emitting element 60. The insulating layer 74 is preferably formed at a temperature lower than the temperature of the heat treatment.

The insulating layer 74 preferably includes an inorganic insulating film with a high barrier property that can be used for the insulating layer 31, for example. A stack including an inorganic insulating film and an organic insulating film can also be used.

The insulating layer 74 can be formed by an ALD method, a sputtering method, or the like. An ALD method and a sputtering method are preferable because a film can be formed at low temperatures. An ALD method is preferable because the coverage with the insulating layer 74 is improved.

Then, a protective layer 75 is formed over the insulating layer 74 (FIG. 6A). The adhesive layer 75b and the substrate 75a may be used as the protective layer 75 as illustrated in FIG. 4D.

Next, a separation trigger is formed in the resin layer 23 (FIGS. 6B1 and 6B2).

For example, a sharp instrument 65, e.g., a knife, is inserted from the protective layer 75 side into a portion located inward from an end portion of the resin layer 23 to make a cut 64 in a frame-like shape.

Alternatively, the resin layer 23 may be irradiated with laser light in a frame-like shape.

In the case where a plurality of display devices are manufactured using one formation substrate (a multiple panel method), the plurality of display devices can be formed using one resin layer 23. For example, the plurality of display devices are provided inside the cut 64 shown in FIG. 6B2. In that case, the plurality of display devices can be separated from the formation substrate at a time.

Alternatively, a plurality of resin layers 23 may be separately formed for display devices. In the example illustrated in FIG. 6B3, four resin layers 23 are formed over a formation substrate. The cut 64 is made in a frame-like shape in each of the four resin layers 23, whereby the display devices can be separated from the formation substrate at different timings.

In the manufacturing method example 1, the top surface of the metal oxide layer 20 includes a portion in contact with the resin layer 23 and a portion in contact with the insulating layer 31. The adhesion (adhesiveness) between the metal oxide layer 20 and the insulating layer 31 is higher than that between the metal oxide layer 20 and the resin layer 23. Therefore, unintentional peeling of the resin layer 23 from the metal oxide layer 20 can be inhibited. In addition, the formation of the separation trigger enables the metal oxide layer 20 and the resin layer 23 to be separated from each other at desired timing. Accordingly, the timing of the separation can be controlled and the force required for the separation is small. This can increase the yield of the separation process and that of the manufacturing process of a display device.

Figure 7A:
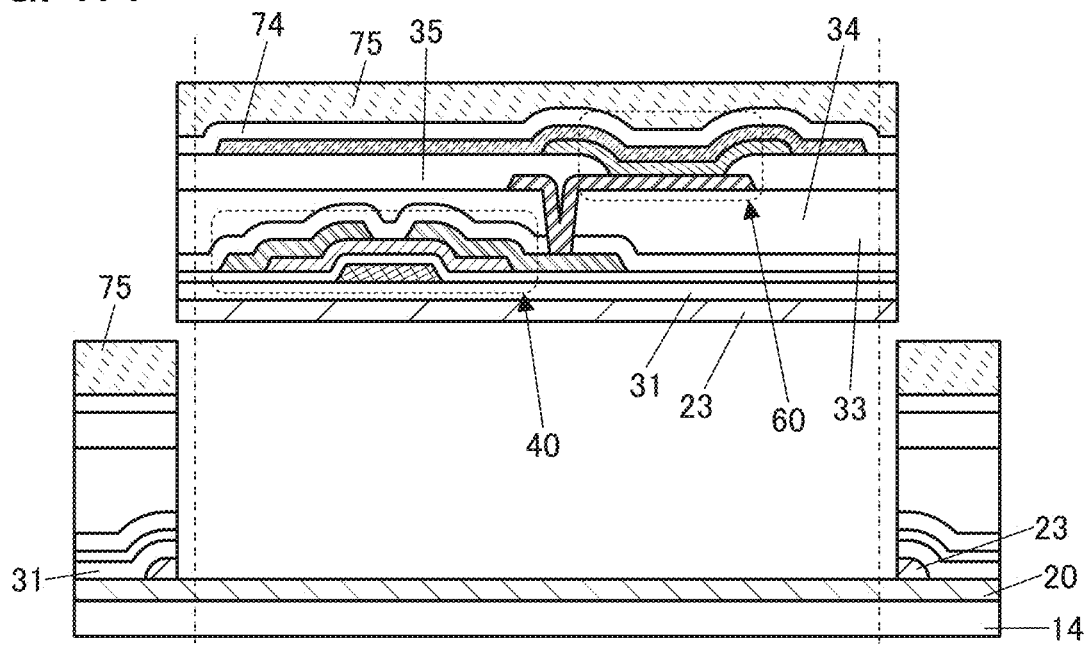
FIGS. 7A and 7B are cross-sectional views illustrating an example of a manufacturing method of a display device.

Then, the metal oxide layer 20 and the resin layer 23 are separated from each other (FIG. 7A).

Figure 7B:
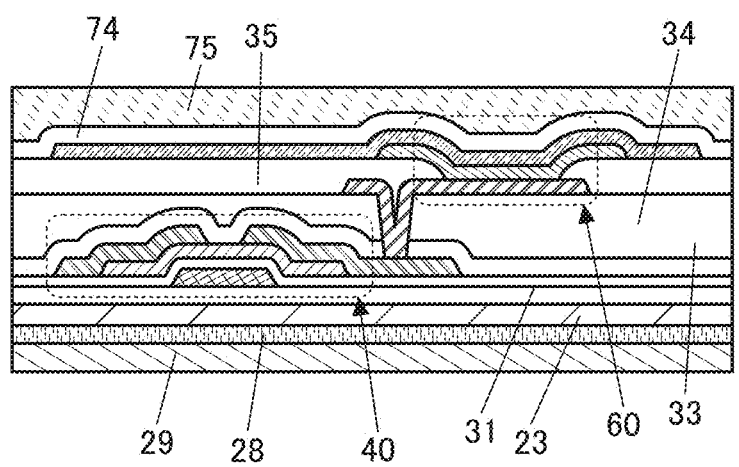

After that, a substrate 29 is bonded to the exposed resin layer 23 with an adhesive layer 28 (FIG. 7B).

The substrate 29 can serve as a supporting substrate of the display device. The substrate 29 is preferably a film, further preferably a resin film. In that case, the display device can be reduced in weight and thickness. The display device using a film substrate is more robust than a display device using glass, metal, or the like. In addition, the display device can have higher flexibility.

With the use of the peeling method described in this embodiment, the transistor 40, the light-emitting element 60, and the like that are fabricated over the formation substrate 14 can be peeled from the formation substrate 14 and transferred onto the substrate 29.

The adhesive layer 28 can be formed using the material that can be used for the adhesive layer 75b. The substrate 29 can be formed using the material that can be used for the substrate 75a.

Note that the resin layer 23 used in this embodiment is colored in some cases. When the light from the light-emitting element 60 is extracted through the resin layer 23 that is colored, a problem such as a reduced light extraction efficiency, a change in the color of the extracted light, or reduced display quality might occur. Thus, the colored resin layer 23 is preferably removed after being exposed by the peeling.

The resin layer 23 can be removed with a wet etching apparatus, a dry etching apparatus, an ashing apparatus, or the like. In particular, the resin layer 23 is preferably removed by ashing using oxygen plasma.

In the manufacturing method example 1, the metal oxide layer 20 and the resin layer 23 (or the first layer 24) are stacked, followed by heat treatment. As a result, the adhesion or adhesiveness between the metal oxide layer 20 and the resin layer 23 can be lowered. Accordingly, the formation substrate 14 and the resin layer 23 can be separated from each other without laser irradiation performed on the entire area of the resin layer 23. In this manner, a display device can be manufactured at low costs.

Structure Example 1 of Display Device

Figure 8A:
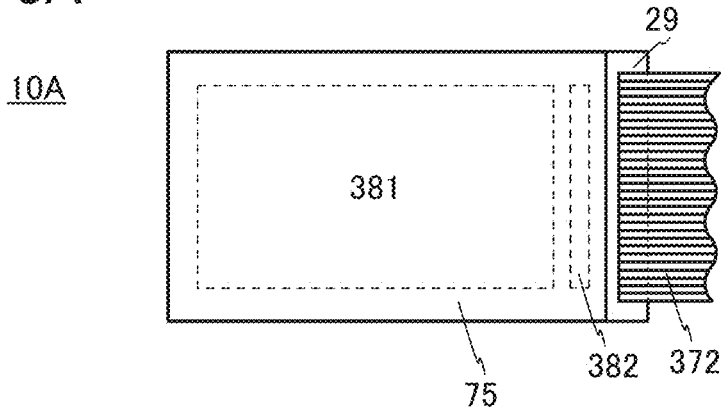
FIGS. 8A to 8C are a top view and cross-sectional views illustrating examples of a display device.
Figure 8B:
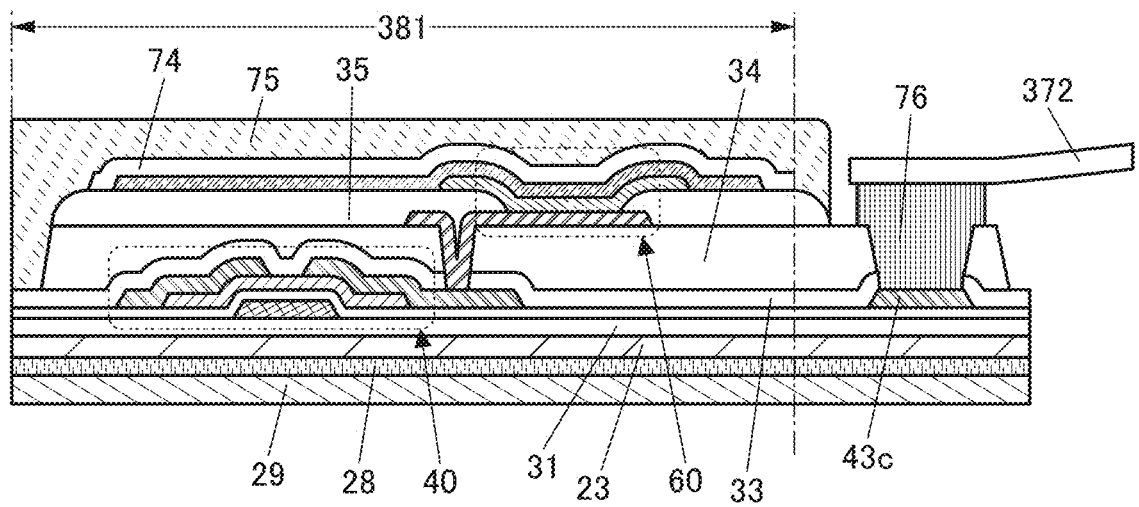
Figure 8C:
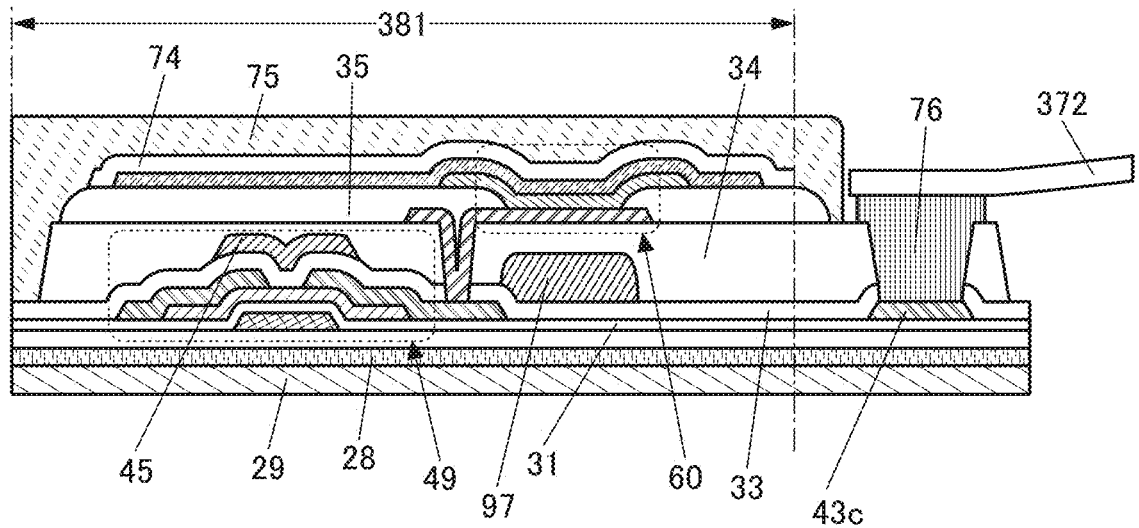

FIG. 8A is a top view of a display device 10A. FIGS. 8B and 8C are each an example of a cross-sectional view illustrating a display portion 381 of the display device 10A and a portion for connection to an FPC 372.

The display device 10A can be manufactured with the use of the above manufacturing method example 1. The display device 10A can be held in a bent state and can be bent repeatedly, for example.

The display device 10A includes a protective layer 75 and a substrate 29. The protective layer 75 side is the display surface side of the display device. The display device 10A includes the display portion 381 and a driver circuit portion 382. The FPC 372 is attached to the display device 10A.

A conductive layer 43c and the FPC 372 are electrically connected through a connector 76 (FIGS. 8B and 8C). The conductive layer 43c can be formed using the same material and the same step as those of the source and the drain of the transistor.

As the connector 76, any of a variety of anisotropic conductive films (ACF), anisotropic conductive pastes (ACP), and the like can be used.

The display device illustrated in FIG. 8C is different from the structure illustrated in FIG. 8B in that not the transistor 40 but a transistor 49 is provided, that the resin layer 23 is not included, and that a coloring layer 97 is provided over the insulating layer 33. In the case where the light-emitting element 60 has a bottom-emission structure, the coloring layer 97 may be provided closer to the substrate 29 than the light-emitting element 60 is. In the case where the resin layer 23 is colored, the display device can have improved display quality by not including the resin layer 23.

The transistor 49 illustrated in FIG. 8C includes a conductive layer 45 serving as a gate, as well as the components of the transistor 40 in FIG. 8B.

The transistor 49 has a structure in which the semiconductor layer where a channel is formed is provided between two gates. Such a structure enables the control of the threshold voltage of the transistor. The two gates may be connected to each other and supplied with the same signal to operate the transistor. Such a transistor can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or resolution.

Alternatively, by supplying a potential for controlling the threshold voltage to one of the two gates and a potential for driving to the other, the threshold voltage of the transistor can be controlled.

Manufacturing Method Example 2

Figure 9A:
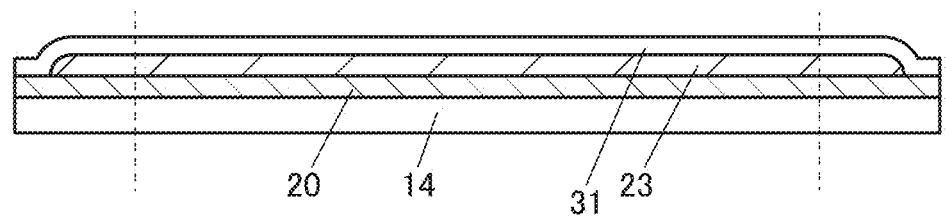
FIGS. 9A to 9C are cross-sectional views illustrating an example of a manufacturing method of a display device.

First, the components from the metal oxide layer 20 to the insulating layer 31 are formed over the formation substrate 14 as in the above peeling method (FIG. 9A).

Figure 9B:
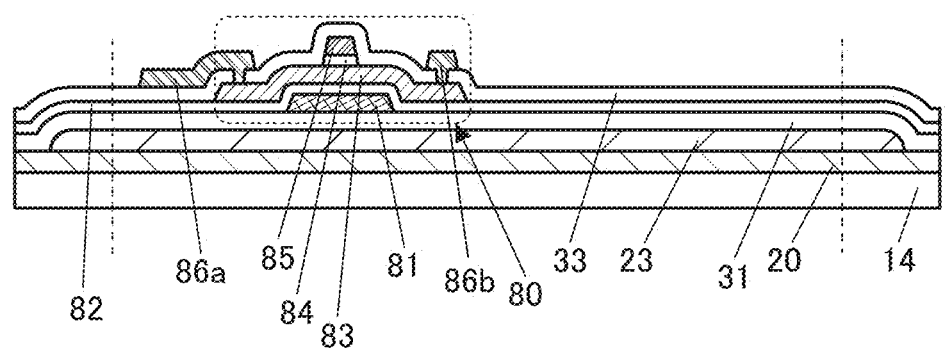

Next, a transistor 80 is formed over the insulating layer 31 (FIG. 9B).

In this example, a transistor including a metal oxide layer 83 and two gates is fabricated as the transistor 80.

The transistor 80 is formed at a temperature lower than or equal to the upper temperature limit of the resin layer 23. The transistor 80 is preferably formed at a temperature lower than the temperature of the heat treatment.

Specifically, first, a conductive layer 81 is formed over the insulating layer 31. The conductive layer 81 can be formed in the following manner: a conductive film is formed, a resist mask is formed, the conductive film is etched, and the resist mask is removed.

Next, an insulating layer 82 is formed. For the insulating layer 82, the description of the inorganic insulating film that can be used for the insulating layer 31 can be referred to.

Then, the metal oxide layer 83 is formed. The metal oxide layer 83 can be formed in the following manner: a metal oxide film is formed, a resist mask is formed, the metal oxide film is etched, and the resist mask is removed. For materials of the metal oxide layer 83, the description of the materials that can be used for the metal oxide layer 44 can be referred to.

Then, an insulating layer 84 and a conductive layer 85 are formed. For the insulating layer 84, the description of the inorganic insulating film that can be used for the insulating layer 31 can be referred to. The insulating layer 84 and the conductive layer 85 can be formed in the following manner: an insulating film to be the insulating layer 84 and a conductive film to be the conductive layer 85 are formed, a resist mask is formed, the insulating film and the conductive film are etched, and the resist mask is removed.

Next, the insulating layer 33 that covers the metal oxide layer 83, the insulating layer 84, and the conductive layer 85 is formed. The insulating layer 33 can be formed using a method similar to that of the insulating layer 31.

The insulating layer 33 preferably contains hydrogen. The hydrogen contained in the insulating layer 33 is diffused to the metal oxide layer 83 in contact with the insulating layer 33, so that part of the metal oxide layer 83 has reduced resistance. Since part of the metal oxide layer 83 serves as a low-resistance region, the on-state current and the field-effect mobility of the transistor 80 can be increased.

Next, openings reaching the metal oxide layer 83 are formed in the insulating layer 33.

Next, a conductive layer 86a and a conductive layer 86b are formed. The conductive layer 86a and the conductive layer 86b can be formed in the following manner: a conductive film is formed, a resist mask is formed, the conductive film is etched, and the resist mask is removed. The conductive layers 86a and 86b are electrically connected to the metal oxide layer 83 through the openings formed in the insulating layer 33.

In the above manner, the transistor 80 can be fabricated (FIG. 9B). In the transistor 80, part of the conductive layer 81 serves as a gate, part of the insulating layer 84 serves as a gate insulating layer, part of the insulating layer 82 serves as a gate insulating layer, and part of the conductive layer 85 serves as a gate. The metal oxide layer 83 includes a channel region and a low-resistance region. The channel region and the conductive layer 85 overlap with each other with the insulating layer 84 provided therebetween. The low-resistance region has a portion connected to the conductive layer 86a and a portion connected to the conductive layer 86b.

Figure 9C:
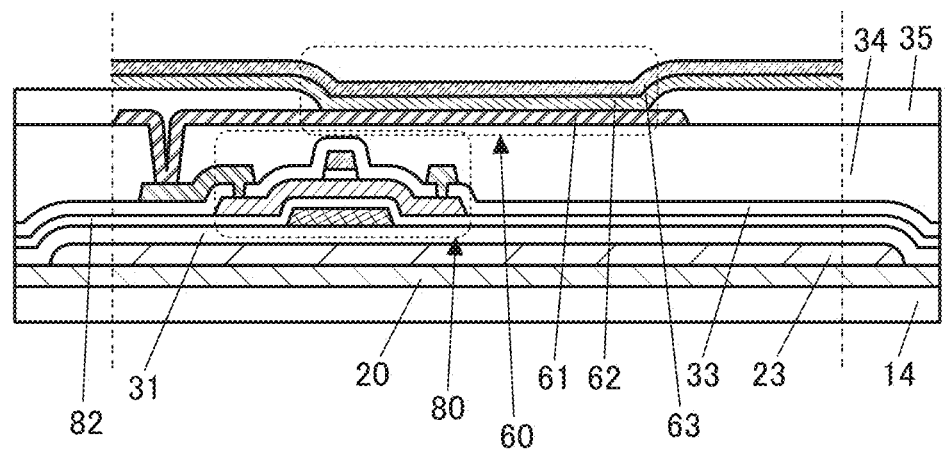

Next, the components from the insulating layer 34 to the light-emitting element 60 are formed over the insulating layer 33 (FIG. 9C). For the steps, the manufacturing method example 1 can be referred to.

Figure 10A:
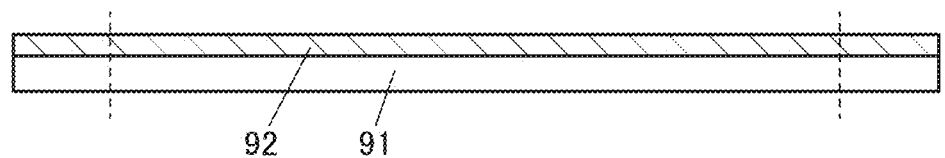
FIGS. 10A to 10D are cross-sectional views illustrating an example of a manufacturing method of a display device.
Figure 10B:
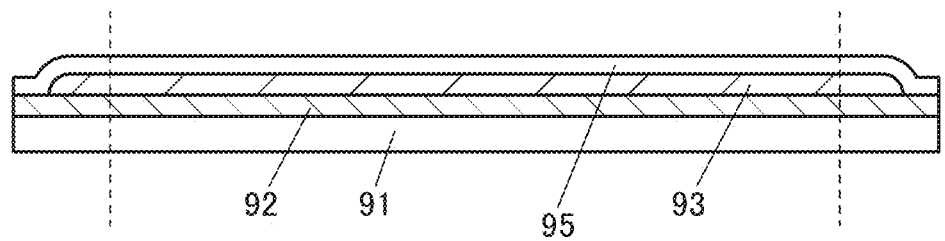
Figure 10C:
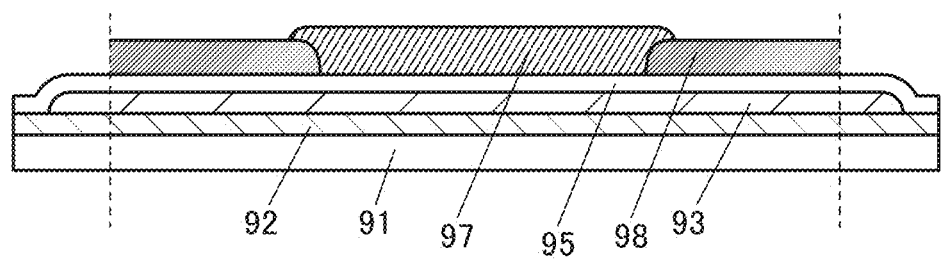

Furthermore, the steps illustrated in FIGS. 10A to 10C are performed independently of the steps illustrated in FIGS. 9A to 9C. First, a metal oxide layer 92 is formed over a formation substrate 91 in a manner similar to that of the step of forming the metal oxide layer 20 over the formation substrate 14 (FIG. 10A). After that, a first layer is formed over the metal oxide layer 92 in a manner similar to that of the step of forming the resin layer 23 over the metal oxide layer 20, and heat treatment is performed to form a resin layer 93 (FIG. 10B). Then, in a manner similar to that of the step of forming the insulating layer 31 over the resin layer 23, an insulating layer 95 covering an end portion of the resin layer 93 is formed over the resin layer 93 (FIG. 10B).

Next, the coloring layer 97 and a light-blocking layer 98 are formed over the insulating layer 95 (FIG. 10C).

A color filter or the like can be used as the coloring layer 97. The coloring layer 97 is provided to overlap with a display region of the light-emitting element 60.

As the light-blocking layer 98, a black matrix or the like can be used. The light-blocking layer 98 is provided to overlap with the insulating layer 35.

Figure 10D:
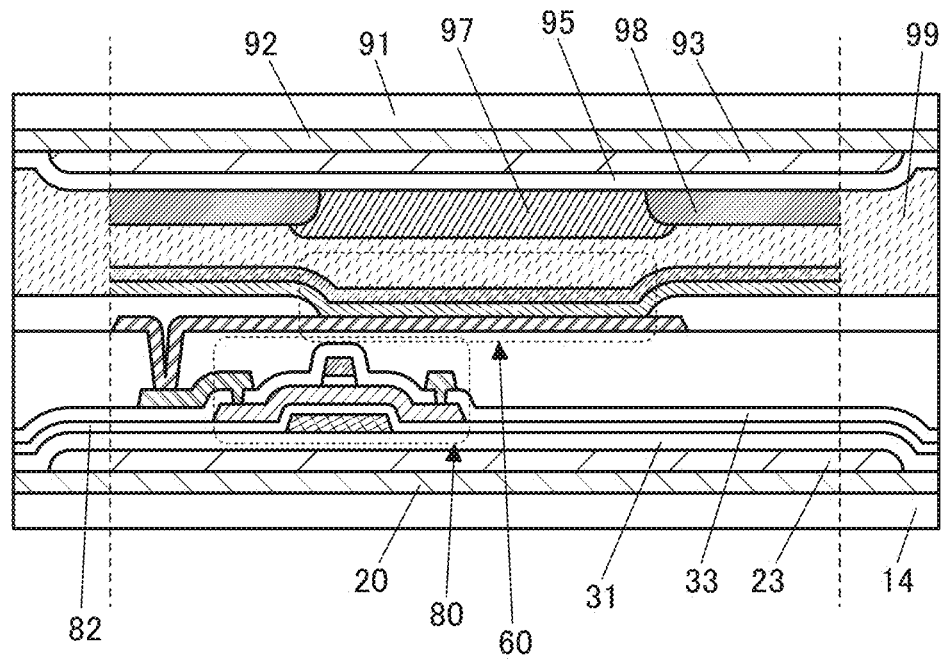

Then, with the use of an adhesive layer 99, the formation substrate 14 and the formation substrate 91 are bonded to each other such that the surface of the formation substrate 14 over which the transistor 80 and the like are formed faces the surface of the formation substrate 91 over which the resin layer 93 and the like are formed (FIG. 10D).

Figure 11A:
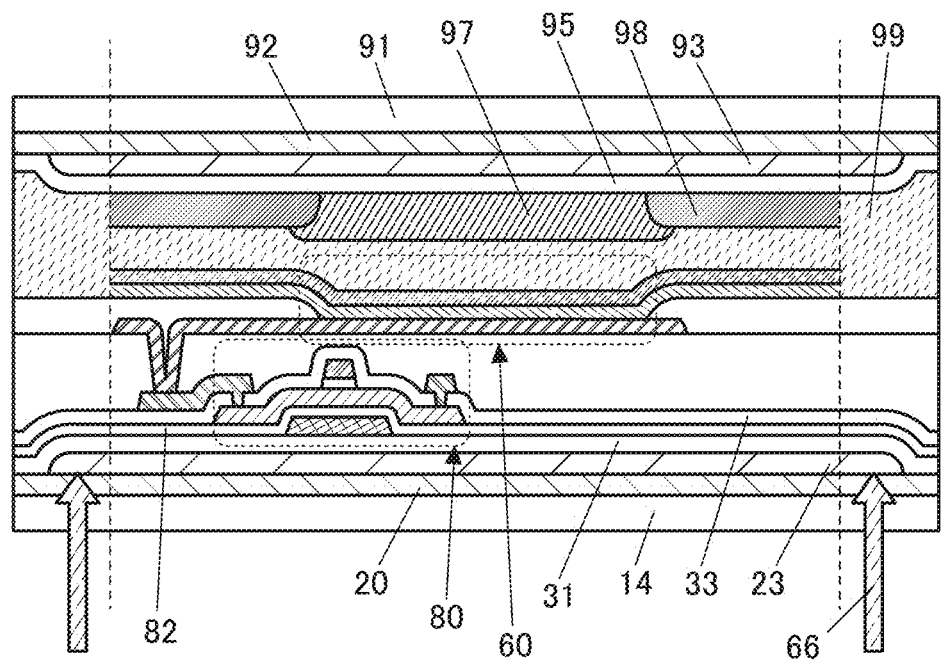
FIGS. 11A and 11B are a cross-sectional view and a top view illustrating an example of a manufacturing method of a display device.
Figure 11B:
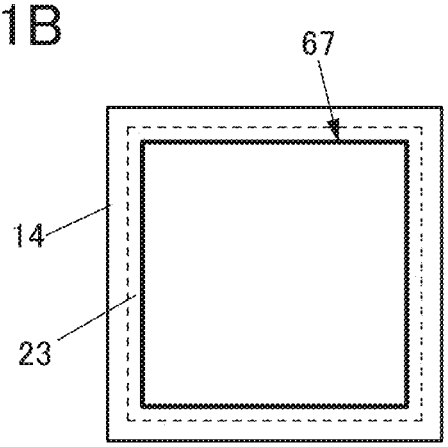

Next, a separation trigger is formed in the resin layer 23 (FIGS. 11A and 11B). Any of the formation substrate 14 and the formation substrate 91 may be separated first. In this example, separation of the formation substrate 14 precedes that of the formation substrate 91.

For example, the resin layer 23 is irradiated with laser light 66 in a frame-like shape from the formation substrate 14 side (see a laser-light irradiation region 67 illustrated in FIG. 11B). This example is suitable for the case where hard substrates such as glass substrates are used as the formation substrate 14 and the formation substrate 91.

There is no particular limitation on a laser used to form the separation trigger. For example, a continuous wave laser or a pulsed oscillation laser can be used. Note that a condition for laser irradiation such as frequency, power density, energy density, or beam profile is controlled as appropriate in consideration of thicknesses, materials, or the like of the formation substrate and the resin layer.

In the manufacturing method example 2, the top surface of the metal oxide layer 20 includes a portion in contact with the resin layer 23 and a portion in contact with the insulating layer 31. The adhesion (adhesiveness) between the metal oxide layer 20 and the insulating layer 31 is higher than that between the metal oxide layer 20 and the resin layer 23. Therefore, unintentional peeling of the resin layer 23 from the metal oxide layer 20 can be inhibited. In a similar manner, the top surface of the metal oxide layer 92 includes a portion in contact with the resin layer 93 and a portion in contact with the insulating layer 95. The adhesion (adhesiveness) between the metal oxide layer 92 and the insulating layer 95 is higher than that between the metal oxide layer 92 and the resin layer 93. Therefore, unintentional peeling of the resin layer 93 from the metal oxide layer 92 can be inhibited.

A separation trigger is formed on either the resin layer 23 or the resin layer 93. The timing of forming a separation trigger can be different between the resin layer 23 and the resin layer 93; therefore, the formation substrate 14 and the formation substrate 91 can be separated in different steps. This can increase the yield of the separation process and that of the manufacturing process of a display device.

Irradiation with the laser light 66 does not need to be performed on the entire area of the resin layer 23 and is performed on part of the resin layer. Accordingly, an expensive laser apparatus requiring high running costs is not needed.

Figure 12A:
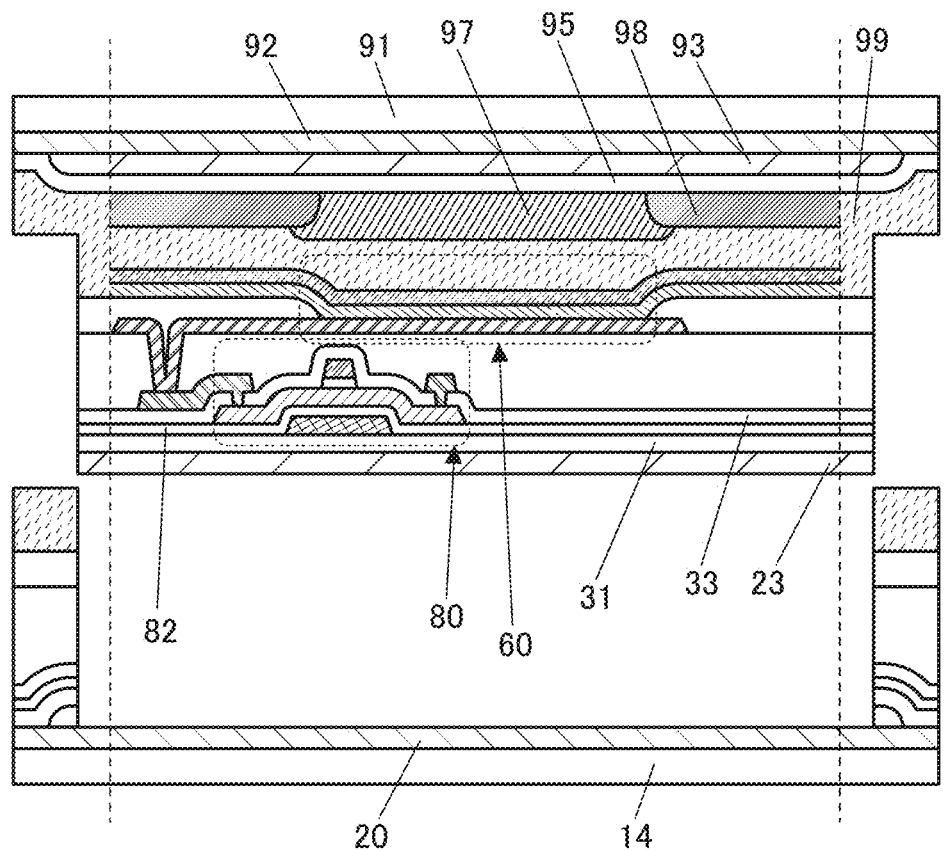
FIGS. 12A and 12B are cross-sectional views illustrating an example of a manufacturing method of a display device.

Next, the formation substrate 14 and the transistor 80 are separated from each other (FIG. 12A). In this example, the formation substrate 14 and a portion inside the region irradiated with the laser light 66 in a frame-like shape (i.e., a portion inside the laser-light irradiation region 67 illustrated in FIG. 11B) are separated from each other. Although in the example illustrated in FIG. 12A separation occurs in the adhesive layer 99 (cohesive failure of the adhesive layer 99 occurs) outside the region irradiated with the laser light 66 in a frame-like shape, one embodiment of the present invention is not limited to this example. For example, outside the irradiation region 67, separation (interfacial failure or adhesive failure) might occur at the interface between the adhesive layer 99 and the insulating layer 95 or the insulating layer 33.

In the manufacturing method example 2, the metal oxide layer 20 and the resin layer 23 (or the first layer 24) are stacked, followed by heat treatment. As a result, the adhesion or adhesiveness between the metal oxide layer 20 and the resin layer 23 can be lowered. Accordingly, the formation substrate 14 and the resin layer 23 can be separated from each other without laser irradiation performed on the entire area of the resin layer 23. In this manner, a display device can be manufactured at low costs.

Figure 12B:
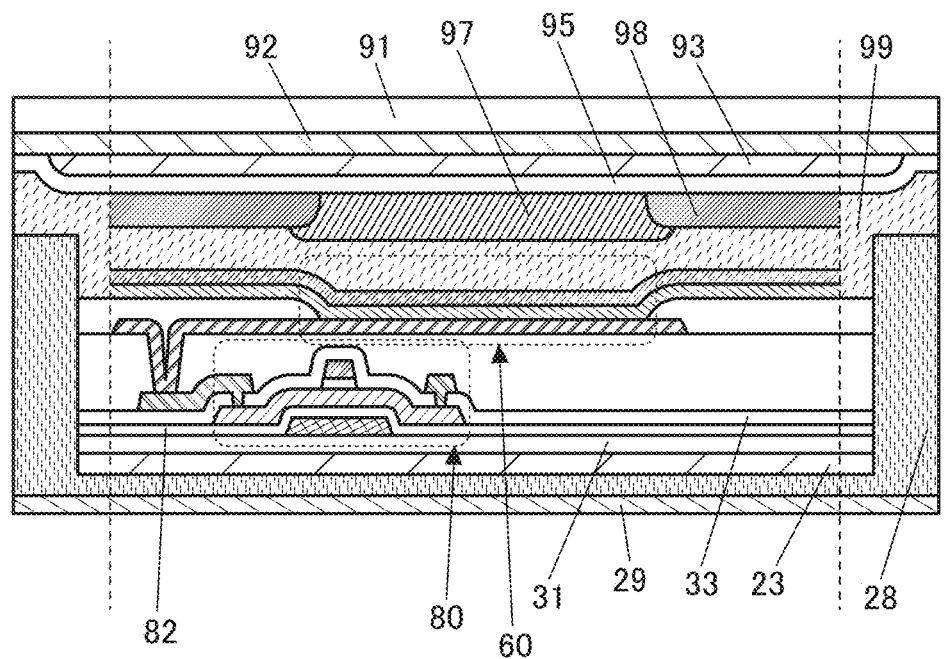

Next, the substrate 29 and the resin layer 23 that is exposed by being separated from the formation substrate 14 are bonded to each other using the adhesive layer 28 (FIG. 12B). The substrate 29 can serve as a supporting substrate of the display device.

Figure 13A:
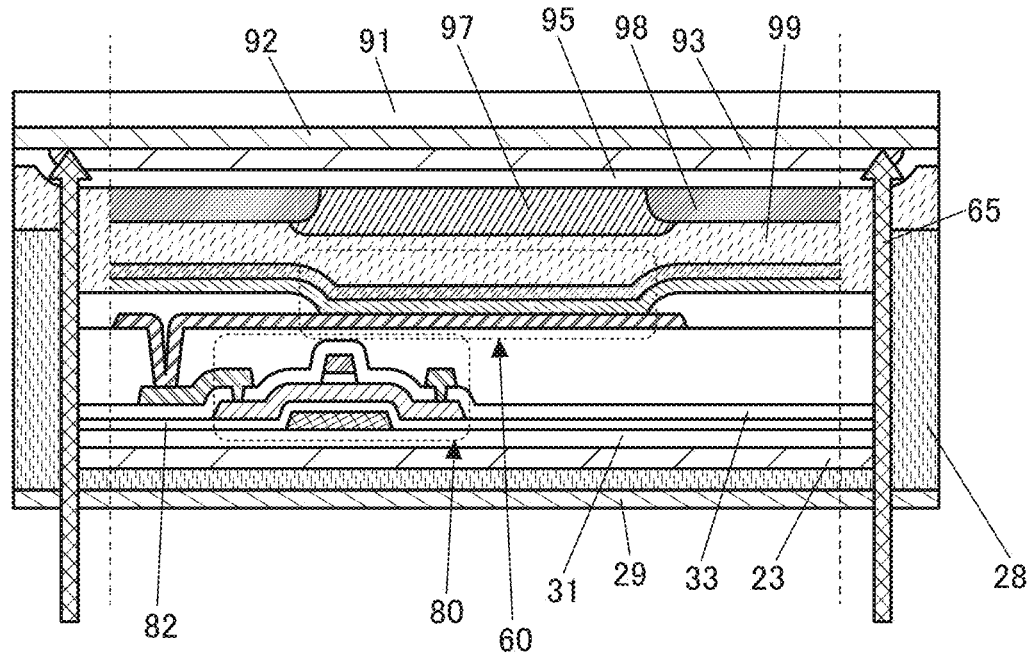
FIGS. 13A and 13B are cross-sectional views illustrating an example of a manufacturing method of a display device.

Next, a separation trigger is formed in the resin layer 93 (FIG. 13A).

In the example illustrated in FIG. 13A, the sharp instrument 65, e.g., a knife, is inserted from the substrate 29 side into a portion located inward from an end portion of the resin layer 93 to make a cut in a frame-like shape. This method is suitable for the case where a resin is used for the substrate 29.

Alternatively, in a manner similar to that of the formation of the separation trigger in the resin layer 23, the resin layer 93 may be irradiated with laser light in a frame-like shape from the formation substrate 91 side.

The formation of the separation trigger enables the formation substrate 91 and the resin layer 93 to be separated from each other at desired timing. Accordingly, the timing of the separation can be controlled and the force required for the separation is small. This can increase the yield of the separation process and that of the manufacturing process of a display device.

Figure 13B:
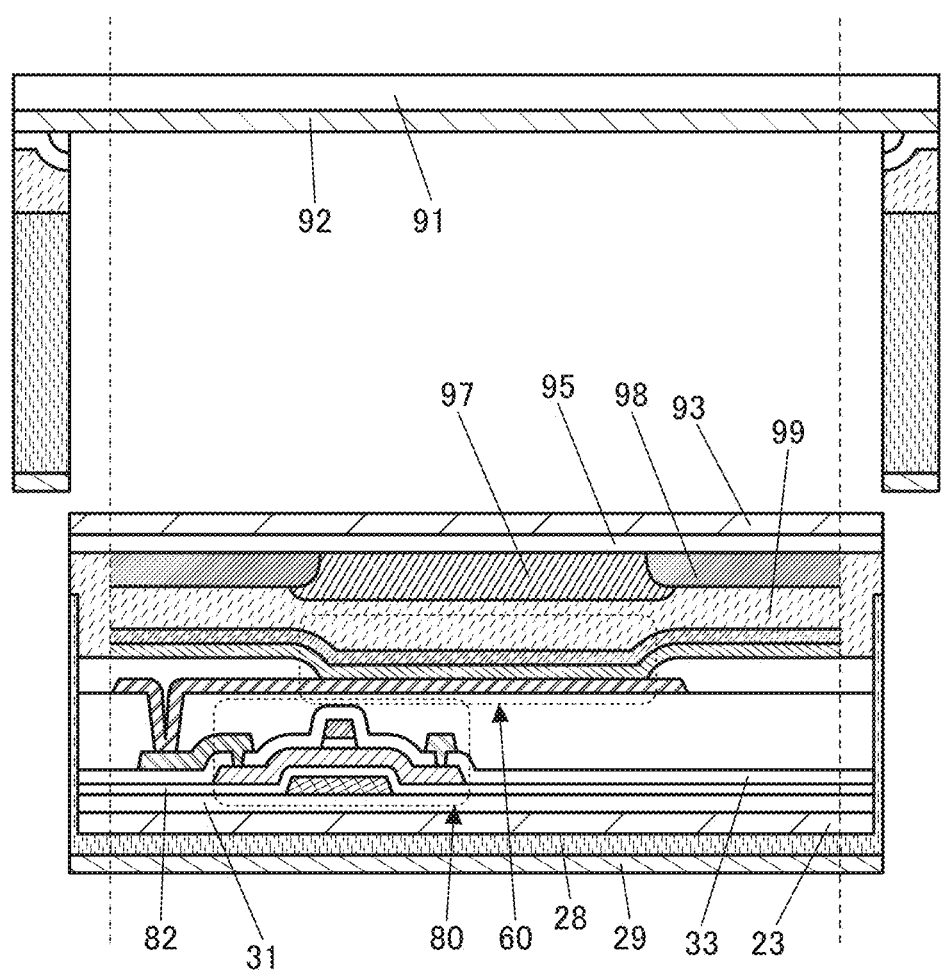

Next, the formation substrate 91 and the transistor 80 are separated from each other (FIG. 13B). In this example, the formation substrate 91 and a portion inside the frame-like cut are separated from each other.

In the manufacturing method example 2, the metal oxide layer 92 and the resin layer 93 (or the first layer) are stacked, followed by heat treatment. As a result, the adhesion or adhesiveness between the metal oxide layer 92 and the resin layer 93 can be lowered. Accordingly, the formation substrate 91 and the resin layer 93 can be separated from each other without laser irradiation performed on the entire area of the resin layer 93. In this manner, a display device can be manufactured at low costs.

Figure 14A:
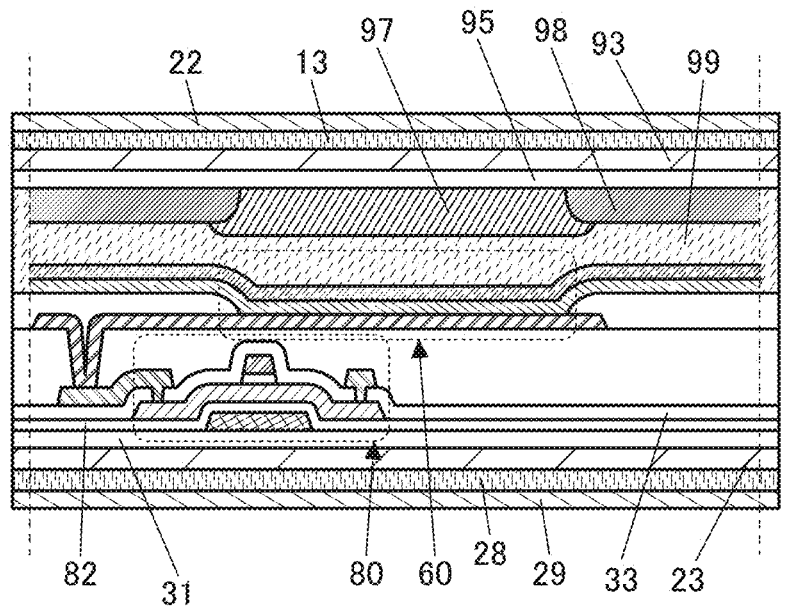
FIGS. 14A and 14B are cross-sectional views illustrating an example of a manufacturing method of a display device.

Next, a substrate 22 and the resin layer 93 that is exposed by being separated from the formation substrate 91 are bonded to each other using an adhesive layer 13 (FIG. 14A). The substrate 22 can serve as a supporting substrate of the display device.

In the example illustrated in FIG. 14A, light emitted from the light-emitting element 60 is extracted to the outside of the display device through the coloring layer 97, the insulating layer 95, and the resin layer 93. It is thus preferable that the resin layer 93 have a high visible light transmittance. In one embodiment of the present invention, the resin layer 93 can have a small thickness. Accordingly, the resin layer 93 can have a high visible light transmittance, which inhibits a reduction in light extraction efficiency of the light-emitting element 60.

Figure 14B:
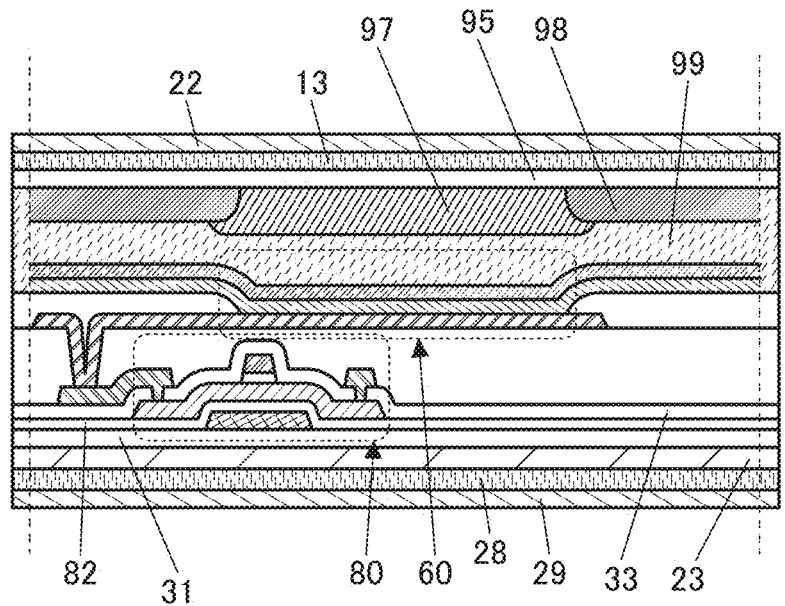

The resin layer 93 may be removed. In that case, the light extraction efficiency of the light-emitting element 60 can be further increased. FIG. 14B illustrates an example in which the resin layer 93 is removed and the substrate 22 is bonded to the insulating layer 95 with the adhesive layer 13.

The adhesive layer 13 can be formed using the material that can be used for the adhesive layer 75b.

The substrate 22 can be formed using the material that can be used for the substrate 75a.

In the manufacturing method example 2, the peeling method of one embodiment of the present invention is conducted twice to manufacture a display device. In one embodiment of the present invention, each of the functional elements and the like included in the display device is formed over the formation substrate; thus, even in the case where a high-resolution display device is manufactured, high alignment accuracy of a flexible substrate is not required. It is thus easy to attach the flexible substrate.

Modification Example

In the manufacturing method example 2 (FIG. 10D), the adhesive layer 99 overlaps with both a portion where the metal oxide layer 20 and the insulating layer 31 are in contact with each other and a portion where the metal oxide layer 92 and the insulating layer 95 are in contact with each other.

The adhesion (adhesiveness) between the metal oxide layer 20 and the insulating layer 31 is higher than that between the metal oxide layer 20 and the resin layer 23. The adhesion (adhesiveness) between the metal oxide layer 92 and the insulating layer 95 is higher than that between the metal oxide layer 92 and the resin layer 93.

When peeling is caused at the interface between the metal oxide layer 20 and the insulating layer 31 or the interface between the metal oxide layer 92 and the insulating layer 95, peeling might be failed, for example, reducing the yield of peeling. Therefore, the process is suitable in which only the portion that overlaps with the resin layer is separated from the formation substrate after formation of a separation trigger in the resin layer in a frame-like shape.

Figure 15A:
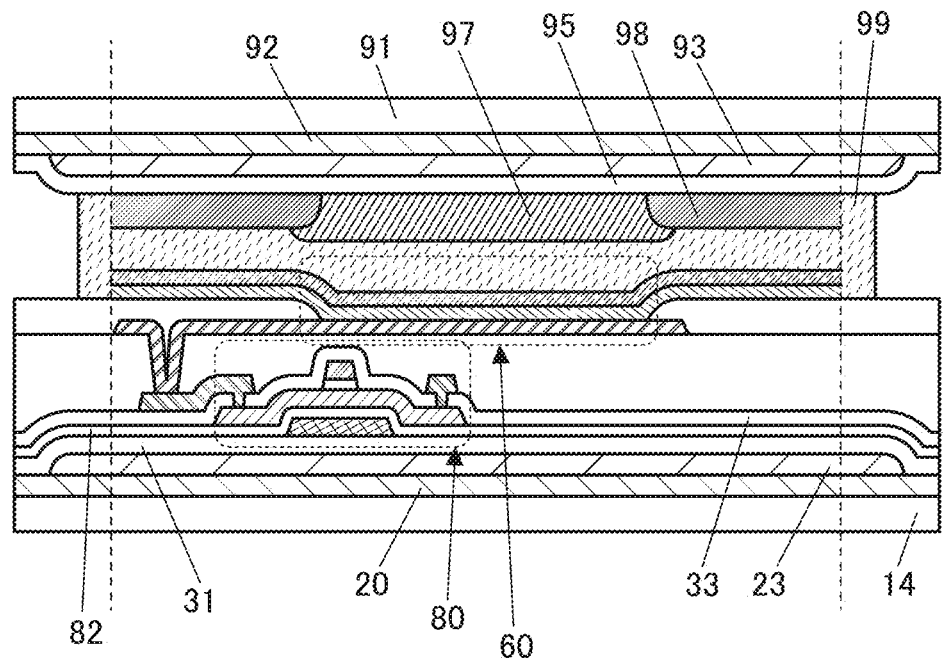
FIGS. 15A and 15B are cross-sectional views illustrating examples of a manufacturing method of a display device.
Figure 15B:
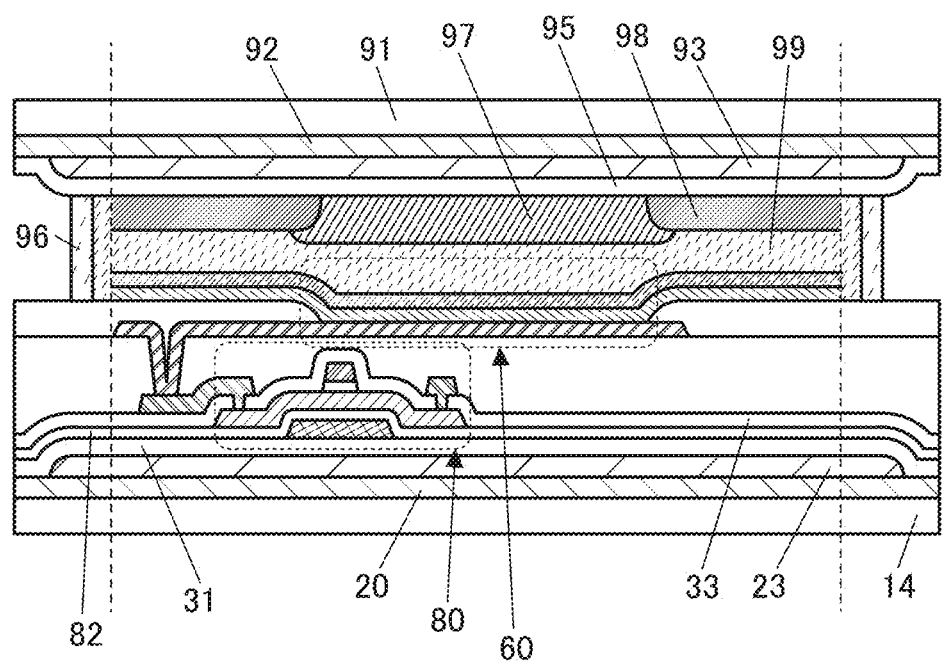

It is also possible to employ a structure in which the adhesive layer 99 does not overlap with the portion where the metal oxide layer 20 and the insulating layer 31 are in contact with each other and the portion where the metal oxide layer 92 and the insulating layer 95 are in contact with each other, as illustrated in FIGS. 15A and 15B.

When an adhesive or an adhesive sheet having a low fluidity, for example, is used for the adhesive layer 99, the adhesive layer 99 can be easily formed to have an island-like shape (FIG. 15A).

Alternatively, a partition 96 having a frame-like shape may be formed and the space surrounded by the partition 96 may be filled with the adhesive layer 99 (FIG. 15B).

In the case where the partition 96 is used as a component of a display device, the partition 96 is preferably formed using a cured resin. In that case, it is preferable that the partition 96 not overlap with the portion where the metal oxide layer 20 and the insulating layer 31 are in contact with each other and the portion where the metal oxide layer 92 and the insulating layer 95 are in contact with each other, either.

In the case where the partition 96 is not used as a component of a display device, the partition 96 is preferably formed using an uncured resin or a semi-cured resin. In that case, the partition 96 may overlap with one or both of the portion where the metal oxide layer 20 and the insulating layer 31 are in contact with each other and the portion where the metal oxide layer 92 and the insulating layer 95 are in contact with each other.

In the example described in this embodiment, the partition 96 is formed using an uncured resin, and the partition 96 does not overlap with the portion where the metal oxide layer 20 and the insulating layer 31 are in contact with each other and the portion where the metal oxide layer 92 and the insulating layer 95 are in contact with each other.

Description is made on a method for forming a separation trigger in the case where the adhesive layer 99 does not overlap with the portion where the metal oxide layer 20 and the insulating layer 31 are in contact with each other and the portion where the metal oxide layer 92 and the insulating layer 95 are in contact with each other. An example in which the formation substrate 91 is peeled is described below. A method similar to this method can be used when the formation substrate 14 is peeled.

FIGS. 16A to 16E illustrate positions of irradiation with the laser light 66 in the case where the formation substrate 91 and the resin layer 93 are separated from each other.

Figure 16A:
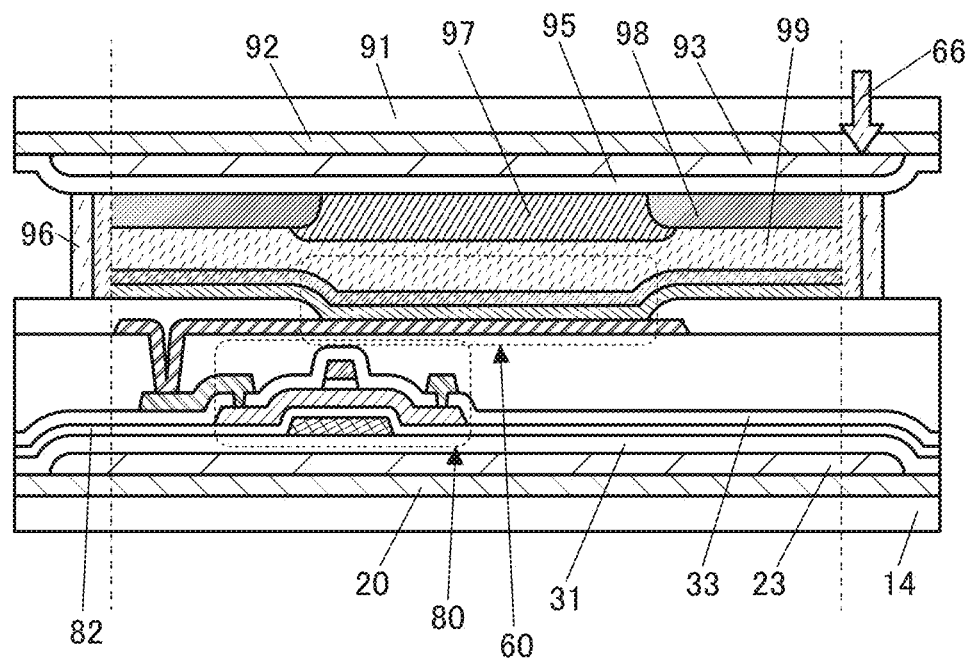
FIGS. 16A to 16E are a cross-sectional view and top views illustrating examples of a manufacturing method of a display device.

As illustrated in FIG. 16A, at least one place of a region where the resin layer 93 and the adhesive layer 99 overlap with each other is irradiated with the laser light 66, whereby the separation trigger can be formed.

It is preferable that the force for separating the formation substrate 91 and the resin layer 93 from each other be locally exerted on the separation trigger; therefore, the separation trigger is preferably formed in the vicinity of an end portion of the adhesive layer 99 rather than at the center of the adhesive layer 99. It is particularly preferable to form the separation trigger in the vicinity of the corner portion compared to the vicinity of the side portion among the vicinities of the end portion.

FIGS. 16B to 16E illustrate examples of the laser-light irradiation region 67.

Figure 16B:
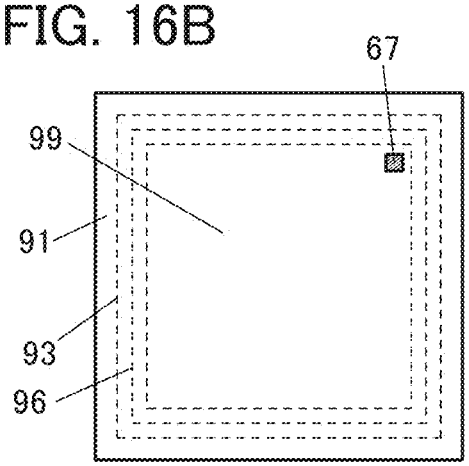

In FIG. 16B, one laser-light irradiation region 67 is provided at the corner portion of the adhesive layer 99.

Figure 16C:
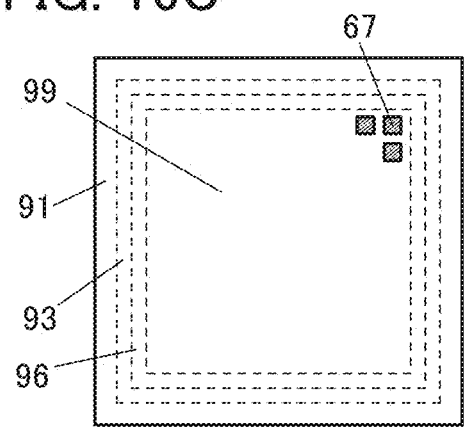
Figure 16D:
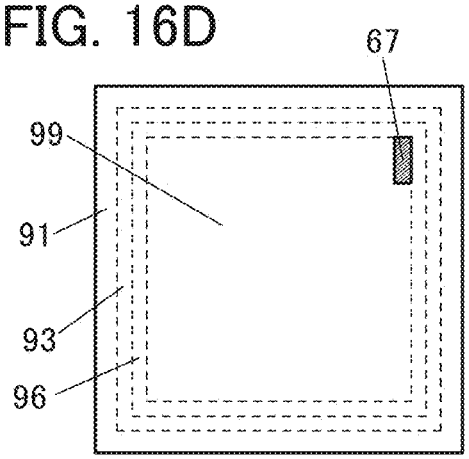
Figure 16E:
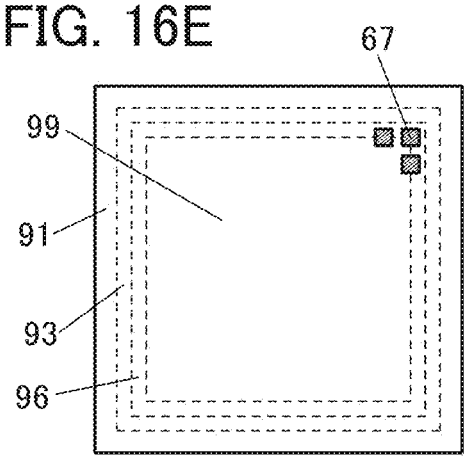

The separation trigger can be formed in the form of a solid line or a dashed line by continuous or intermittent irradiation with laser light. In FIG. 16C, three laser-light irradiation regions 67 are provided at the corner portion of the adhesive layer 99. FIG. 16D illustrates an example in which the laser-light irradiation region 67 abuts on and extends along one side of the adhesive layer 99. As illustrated in FIG. 16E, the laser-light irradiation region 67 may be positioned not only in a region where the adhesive layer 99 and the resin layer 93 overlap with each other but also in a region where the partition 96 not cured and the resin layer 93 overlap with each other.

Then, the formation substrate 91 and the resin layer 93 can be separated from each other. Note that part of the partition 96 remains on the formation substrate 14 side in some cases. The partition 96 may be removed or the next step may be performed without removal of the partition 96.

Structure Example 2 of Display Device

Figure 17A:
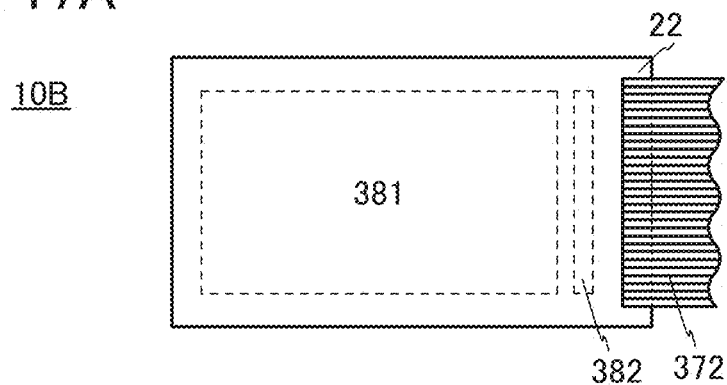
FIGS. 17A and 17B are a top view and a cross-sectional view illustrating an example of a display device.
Figure 17B:
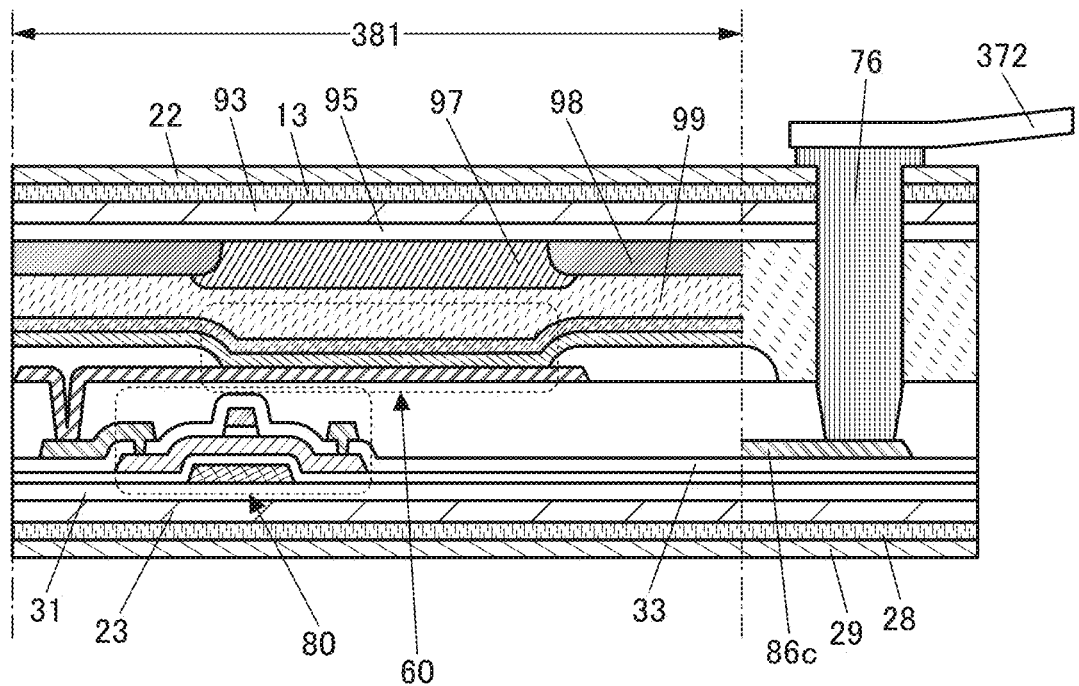

FIG. 17A is a top view of a display device 10B. FIG. 17B is an example of a cross-sectional view illustrating the display portion 381 of the display device 10B and a portion for connection to the FPC 372.

The display device 10B can be manufactured with the use of the above manufacturing method example 2. The display device 10B can be held in a bent state and can be bent repeatedly, for example.

The display device 10B includes the substrate 22 and the substrate 29. The substrate 22 side is the display surface side of the display device 10B. The display device 10B includes the display portion 381 and the driver circuit portion 382. The FPC 372 is attached to the display device 10B.

Each of the substrate 22 and the substrate 29 is preferably a film, further preferably a resin film. In that case, the display device can be reduced in weight and thickness. The display device using a film substrate is more robust than a display device using glass, metal, or the like. In addition, the display device can have higher flexibility.

A conductive layer 86c and the FPC 372 are electrically connected through the connector 76 (FIG. 17B). The conductive layer 86c can be formed using the same material and the same step as those of the source and the drain of the transistor.

Example of Stack Manufacturing Apparatus

Next, an example of a stack manufacturing apparatus will be described with reference to FIG. 18. With the stack manufacturing apparatus illustrated in FIG. 18, a layer to be peeled can be peeled from a formation substrate by the peeling method of this embodiment and transferred to another substrate. With the use of the stack manufacturing apparatus illustrated in FIG. 18, a stack such as a semiconductor device or a display device can be manufactured.

Figure 18:
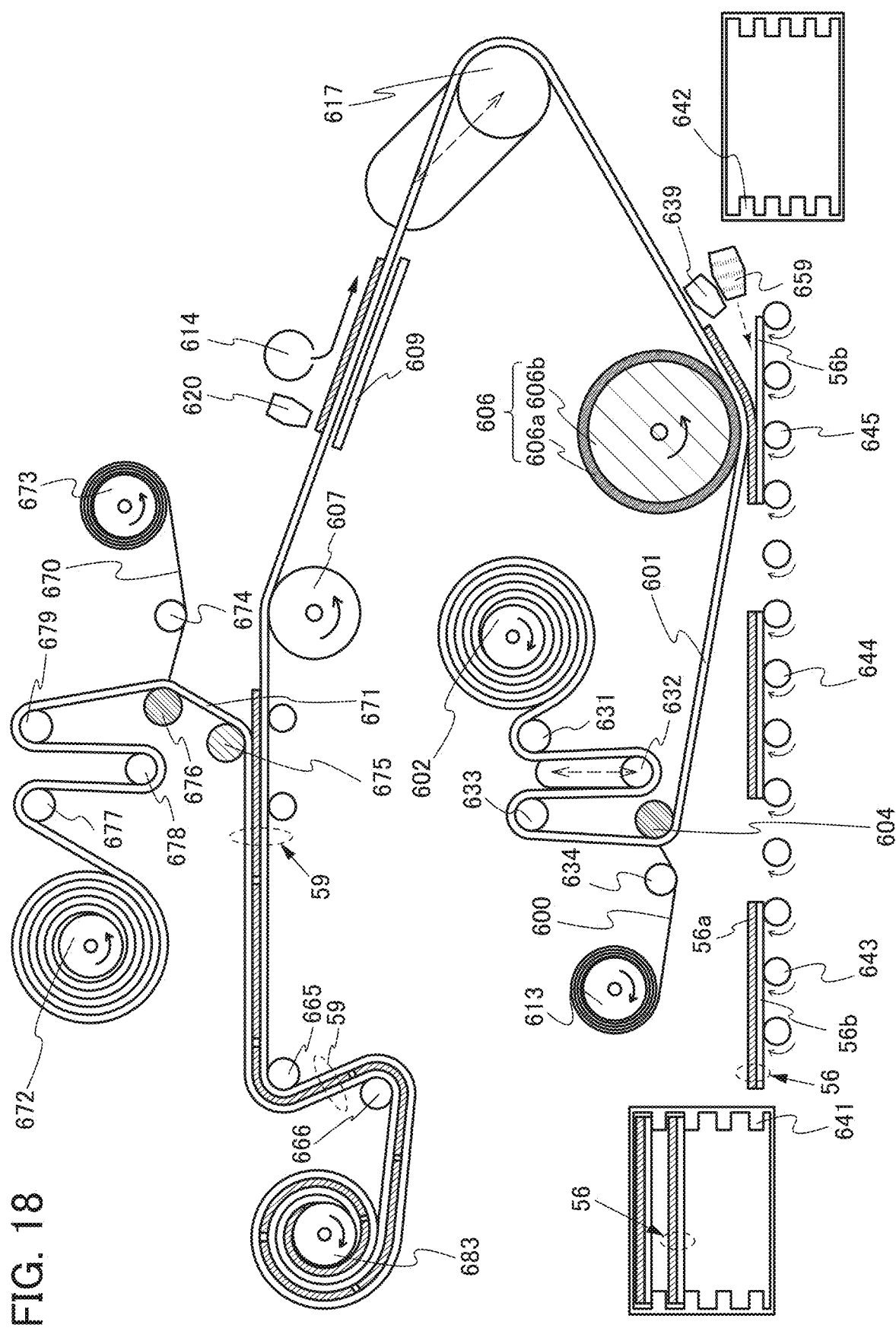
FIG. 18 illustrates an example of a stack manufacturing apparatus.

The stack manufacturing apparatus in FIG. 18 includes a plurality of transfer rollers (e.g., transfer rollers 643, 644, and 645), a tape reel 602, a wind-up reel 683, a direction changing roller 604, and a press roller 606.

The tape reel 602 can unwind the support 601 in a rolled sheet form. The speed at which the support 601 is unwound is preferably adjustable. When the speed is set relatively low, for example, failure in peeling of the stack or a crack in a peeled member can be inhibited.

The wind-up reel 683 can wind up the stack 59.

The tape reel 602 and the wind-up reel 683 can apply tension to the support 601.

The support 601 is sent out intermittently or continuously. It is preferable to unwind the support 601 continuously because peeling can be performed at a uniform speed and with a uniform force. In a peeling process, the peeling is preferably performed successively without a stop, and is further preferably performed at a constant speed. When the peeling stops in the middle of the process and then resumes from the same region, distortion or the like occurs in the region, unlike in the case of successive peeling. Thus, a minute structure of the region or the characteristics of an electronic device or the like in the region are changed, which might influence display of a display device, for example.

As the support 601, a film in a rolled sheet form made of an organic resin, a metal, an alloy, glass, or the like can be used.

In the example illustrated in FIG. 18, the support 601 is a member that constitutes a device to be manufactured (e.g., a flexible device) together with a remaining portion 56a, which is typified by a flexible substrate. The support 601 may be a member that does not constitute the device to be manufactured, which is typified by a carrier tape.

The plurality of transfer rollers can transfer the stack 56. The transfer mechanism that transfers the stack 56 is not limited to a transfer roller and may be a conveyor belt, a transfer robot, or the like. Furthermore, the stack 56 may be placed over a stage over the transfer mechanism.

The transfer roller 643, the transfer roller 644, and the transfer roller 645, each of which is one of the arranged transfer rollers, are provided at predetermined intervals and rotate in the direction in which the stack 56 (or one surface layer 56b) is sent (the clockwise direction as indicated by solid arrows). The plurality of arranged transfer rollers are each rotated by a driving portion (e.g., a motor) which is not illustrated.

The delivery direction of the support 601 can be changed by the direction changing roller 604. In the example illustrated in FIG. 18, the direction changing roller 604 is positioned between the tape reel 602 and the press roller 606.

The support 601 is bonded to the stack 56 (remaining portion 56a) by the press roller 606 and the transfer roller 645.

In the structure illustrated in FIG. 18, the support 601 can be prevented from being in contact with the stack 56 before reaching the press roller 606. Accordingly, air bubbles can be inhibited from being trapped between the support 601 and the stack 56.

The press roller 606 is rotated by a driving portion (e.g., a motor) which is not illustrated. When the press roller 606 rotates, the force of peeling the remaining portion 56a is applied to the stack 56; thus, the remaining portion 56a is peeled. At this time, the stack 56 preferably has a peeling trigger. Peeling of the remaining portion 56a starts from the peeling trigger. As a result, the stack 56 is divided into the remaining portion 56a and one surface layer 56b.

The mechanism that separates the remaining portion 56a from the stack 56 is not limited to the press roller 606, and a structure body having a convex surface (or a convex curved surface) can be used. For example, a cylindrical (e.g., circular cylindrical, right circular cylindrical, elliptic cylindrical, or parabolic cylindrical) or spherical structure body can be used. Furthermore, a roller such as a drum type roller can be used, for example. Examples of the shape of the structure body include a column with a bottom surface whose boundary includes a curved line (e.g., a cylinder with a perfect circle-shaped bottom surface or an elliptic cylinder with an ellipse-shaped bottom surface), and a column with a bottom surface whose boundary includes a curved line and a straight line (e.g., a column with a semicircular bottom surface or a semi-elliptical bottom surface). If the shape of the structure body is any of such columns, the convex surface corresponds to a curved surface of the column.

Examples of a material for the structure body include a metal, an alloy, an organic resin, and rubber. The structure body may have a space or a hollow inside. Examples of the rubber include natural rubber, urethane rubber, nitrile rubber, and neoprene rubber. In the case of using rubber, it is preferable to use a material unlikely to be charged by friction or peeling or to take countermeasures to prevent static electricity. For example, the press roller 606 illustrated in FIG. 18 includes a hollow cylinder 606a formed of rubber or an organic resin and a circular cylinder 606b formed of a metal or an alloy and positioned inside the cylinder 606a.

The rotation speed of the press roller 606 is preferably adjustable. By adjusting the rotation speed of the press roller 606, the yield of peeling can be further increased.

The press roller 606 and the plurality of transfer rollers may be movable in at least one direction (e.g., the vertical direction, the horizontal direction, or the depth direction). The distance between the convex surface of the press roller 606 and a supporting surface of the transfer roller is preferably adjustable because peeling can be performed on stacks with various thicknesses.

There is no particular limitation on an angle at which the press roller 606 bends the support 601. FIG. 18 illustrates an example where the press roller 606 bends the support 601 at an obtuse angle.

The stack manufacturing apparatus illustrated in FIG. 18 further includes a roller 617. The roller 617 can deliver the support 601 from the press roller 606 to the wind-up reel 683 along the convex surface.

The roller 617 is movable in one or more directions.

The roller 617 can apply tension to the support 601 by moving the shaft of the roller 617. That is, the roller 617 is also referred to as a tension roller. Specifically, the roller 617 can pull the support 601 in the delivery direction changed with the press roller 606.

Moving the shaft of the roller 617 enables the roller 617 to control the angle at which the press roller 606 bends the support 601.

The roller 617 can bend back the support 601 to change the delivery direction of the support 601. For example, the delivery direction of the support 601 may be changed to the horizontal direction. Alternatively, the following structure may be employed: the roller 617 bends back the support 601 to change the delivery direction of the support 601; then, the delivery direction of the support 601 is further changed to the horizontal direction by a direction changing roller 607 located between the roller 617 and the wind-up reel 683.

The stack manufacturing apparatus illustrated in FIG. 18 further includes guide rollers (e.g., guide rollers 631, 632, and 633), a wind-up reel 613, a liquid feeding mechanism 659, a drying mechanism 614, and ionizers (e.g., ionizers 639 and 620).

The stack manufacturing apparatus may include a guide roller that guides the support 601 to the wind-up reel 683. One guide roller may be used, or a plurality of guide rollers may be used. Like the guide roller 632, the guide roller may be capable of applying tension to the support 601.

A tape 600 (also called separate film) may be bonded to at least one surface of the support 601. In this case, the stack manufacturing apparatus preferably includes a reel that can wind up the tape 600 bonded to one surface of the support 601. FIG. 18 illustrates an example in which the wind-up reel 613 is positioned between the tape reel 602 and the press roller 606. Furthermore, the stack manufacturing apparatus may include a guide roller 634. The guide roller 634 can guide the tape 600 to the wind-up reel 613.

The stack manufacturing apparatus may include the drying mechanism 614. Since the functional element (e.g., a transistor or a thin film integrated circuit) included in the remaining portion 56a is vulnerable to static electricity, it is preferable that liquid be fed to the interface between the remaining portion 56a and the one surface layer 56b before peeling or that the peeling be performed while liquid is fed to the interface. The presence of the liquid in the portion where the peeling proceeds can decrease the force required for the peeling. The peeling can be performed while liquid is fed to the interface with the liquid feeding mechanism 659. Since a watermark might be formed if the liquid adhered to the remaining portion 56a is vaporized, the liquid is preferably removed immediately after the peeling. Thus, the remaining portion 56a including a functional element is preferably blow-dried to remove a droplet left on the remaining portion 56a. Therefore, watermark generation can be suppressed. A carrier plate 609 may be provided to prevent slack in the support 601.

It is preferable that an air flow downward along the inclination of the support 601 so that the droplet drips down while the support 601 is transferred in an oblique direction relative to the horizontal plane.

Although the transfer direction of the support 601 may be perpendicular to the horizontal plane, the transfer direction is preferably oblique to the horizontal plane for higher stability and less shaking of the support 601 during the transfer.

During the process, a static eliminator included in the stack manufacturing apparatus is preferably used at a position where static electricity might be generated. There is no particular limitation on the static eliminator, and for example, a corona discharge ionizer, a soft X-ray ionizer, or an ultraviolet ionizer can be used.

For example, it is preferable that the stack manufacturing apparatus be provided with an ionizer and static elimination be performed by spraying the remaining portion 56a with air, a nitrogen gas, or the like from the ionizer to reduce adverse effects of static electricity on the functional element. It is particularly preferable to use the ionizer in a step of bonding two members to each other and a step of dividing one member.

For example, the stack 56 is preferably divided into the remaining portion 56a and the one surface layer 56b while the vicinity of the interface between the remaining portion 56a and the one surface layer 56b is irradiated with ions using the ionizer 639 to remove static electricity.

The stack manufacturing apparatus may include a substrate load cassette 641 and a substrate unload cassette 642. For example, the stack 56 can be supplied to the substrate load cassette 641. The substrate load cassette 641 can supply the stack 56 to the transfer mechanism or the like. Furthermore, the one surface layer 56b can be supplied to the substrate unload cassette 642.

The stack manufacturing apparatus illustrated in FIG. 18 attaches a support 601 to the stack 56 and pulls the support 601, so that the remaining portion 56a is peeled from the stack 56. Since the stack 56 can be automatically divided with the use of the support 601, the processing time can be shortened and the manufacturing yield of products can be improved.

The remaining portion 56a separated from the one surface layer 56b is bonded to a support 671 with an adhesive. As a result, a stack 59 in which the support 601, the remaining portion 56a, and the support 671 are stacked in this order can be manufactured.

A tape reel 672 can unwind the support 671 in rolled sheet form. For the support 671, a material similar to that for the support 601 can be used.

The tape reel 672 and the wind-up reel 683 can apply tension to the support 671.

The stack manufacturing apparatus may include guide rollers 677, 678, and 679 that guide the support 671 to the wind-up reel 683.

The delivery direction of the support 671 can be changed by the direction changing roller 676.

The press roller 675 can bond the remaining portion 56a to the support 671 that is unwound by the tape reel 672 while applying pressure to them. Accordingly, inclusion of bubbles between the support 671 and the remaining portion 56a can be inhibited.

A separation tape 670 may be bonded to at least one surface of the support 671. A reel 673 can wind up the separation tape 670. A guide roller 674 can guide the separation tape 670 to the reel 673.

The manufactured stack 59 may be wound up or cut. FIG. 18 illustrates an example in which the wind-up reel 683 winds up the stack 59. A guide roller guiding the stack 59 to the wind-up reel 683, such as guide rollers 665 and 666, may be provided.

In the stack manufacturing apparatus illustrated in FIG. 18, the remaining portion 56a is peeled from the stack 56 by the press roller 606 and transferred to the support 671 by the press roller 675.

As described above, in the peeling method described in this embodiment, the metal oxide layer and the resin layer are stacked over the formation substrate and the peelability of the resin layer with respect to the metal oxide layer is adjusted by heating. Treatment using an expensive apparatus, such as linear laser beam irradiation, is not needed and thus, the peeling method is low in cost. Furthermore, the top surface of the metal oxide layer includes a portion in contact with the resin layer and a portion in contact with an insulating layer, so that the resin layer can be peeled from the formation substrate at desired timing. Therefore, display devices and the like can be manufactured at low costs and with high mass productivity by the peeling method described in this embodiment.

This embodiment can be combined with any other embodiment as appropriate. In the case where a plurality of structure examples are described in one embodiment in this specification, some of the structure examples can be combined as appropriate.

Embodiment 2

In this embodiment, a manufacturing method of a display device of one embodiment of the present invention will be described with reference to FIGS. 19A to 19E, FIGS. 20A to 20E, FIGS. 21A, 21B1, 21B2, and 21B3, FIGS. 22A and 22B, and FIGS. 23A to 23C.

In this embodiment, the case where low-temperature polysilicon (LTPS) is used for a channel formation region of the transistor will be described.

In the case where LTPS is used, a resin layer is preferably formed using a material having high heat resistance. Furthermore, the resin layer is preferably formed to be thick. Thus, a high-temperature process becomes possible and damage in a step for laser crystallization can be reduced.

Figure 19A:
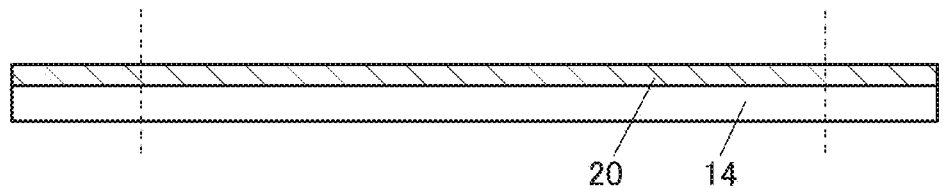
FIGS. 19A to 19E are cross-sectional views illustrating an example of a manufacturing method of a display device.

First, the metal oxide layer 20 is formed over the formation substrate 14 (FIG. 19A). For the material and the formation method of the metal oxide layer 20, Embodiment 1 can be referred to.

Figure 19B:
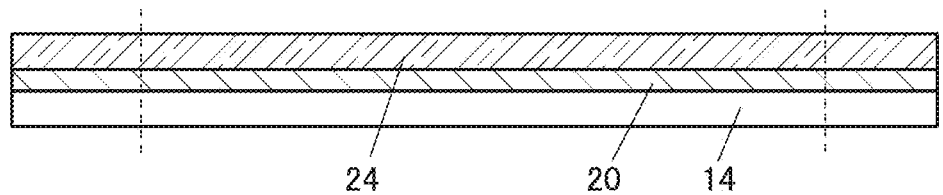

Next, the first layer 24 is formed over the metal oxide layer 20 (FIG. 19B).

For the material and the formation method of the first layer 24, Embodiment 1 can be referred to. It is preferable that the heat resistance of the material of the first layer 24 used in this embodiment be sufficiently high.

Figure 19C:
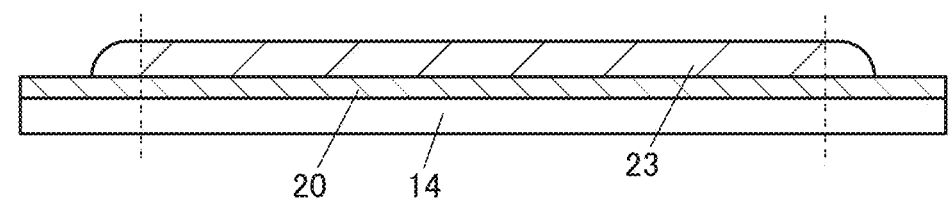

Next, heat treatment is performed on the first layer 24 having a desired shape, whereby the resin layer 23 is formed (FIG. 19C). Here, the resin layer 23 having an island shape is formed.

Conditions of the heat treatment can be referred to the description in Embodiment 1.

In this embodiment, since the first layer 24 is formed using a material having high heat resistance, the resin layer 23 can have high heat resistance.

In this embodiment, since a material having high heat resistance is used for the first layer 24, the heat treatment can be performed at a temperature higher than the heating temperature in Embodiment 1. For example, the temperature of the heat treatment is preferably higher than or equal to 400° C. and lower than or equal to 600° C., further preferably higher than or equal to 450° C. and lower than or equal to 550° C.

The thickness of the resin layer 23 is preferably greater than or equal to 10 μm and less than or equal to 200 μm, further preferably greater than or equal to 10 μm and less than or equal to 100 μm, still further preferably greater than or equal to 10 μm and less than or equal to 50 μm. When the thickness of the resin layer 23 is sufficiently large, damage in a step of laser crystallization can be reduced. The rigidity of the display device can be increased.

The 5% weight loss temperature of the resin layer 23 is preferably higher than or equal to 400° C. and lower than or equal to 600° C., further preferably higher than or equal to 450° C. and lower than or equal to 600° C., still further preferably higher than or equal to 500° C. and lower than or equal to 600° C.

Figure 19D:
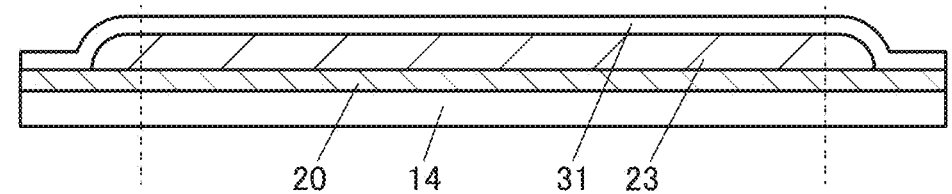
Figure 19E:
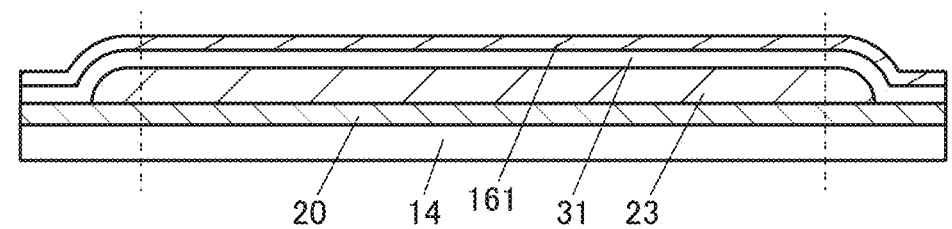

Next, the insulating layer 31 is formed over the formation substrate 14 and the resin layer 23 (FIG. 19D).

The insulating layer 31 is formed at a temperature lower than or equal to the upper temperature limit of the resin layer 23. The insulating layer 31 is preferably formed at a temperature lower than the temperature of the heat treatment.

The insulating layer 31 can be used as a barrier layer that prevents diffusion of impurities contained in the resin layer 23 into a transistor and a display element formed later. For example, the insulating layer 31 preferably prevents moisture and the like contained in the resin layer 23 from diffusing into the transistor and the display element when the resin layer 23 is heated. Thus, the insulating layer 31 preferably has a high barrier property.

For the insulating layer 31, any of the materials described in Embodiment 1 can be used.

Next, a transistor 140 is formed over the insulating layer 31 (FIG. 19E and FIGS. 20A to 20E).

Here, the case where a top-gate transistor including LTPS in a channel formation region is formed as the transistor 140 is shown.

First, a semiconductor film is formed over the insulating layer 31 by a sputtering method, a CVD method, or the like. In this embodiment, a 50-nm-thick amorphous silicon film 161 is formed with a plasma CVD apparatus.

Next, heat treatment is preferably performed on the amorphous silicon film 161. Thus, hydrogen can be released from the amorphous silicon film 161. Specifically, the amorphous silicon film 161 is preferably heated at a temperature higher than or equal to 400° C. and lower than or equal to 550° C. For example, when the amount of hydrogen contained in the amorphous silicon film 161 is smaller than or equal to 5 atomic %, manufacturing yield in the crystallization step can be improved. The heat treatment may be omitted in the case where the amount of hydrogen contained in the amorphous silicon film 161 is small.

In this embodiment, since the resin layer 23 has high heat resistance, the amorphous silicon film 161 can be heated at high temperatures. Thus, hydrogen in the amorphous silicon film 161 can be sufficiently released and the manufacturing yield in the crystallization step can be increased.

Figure 20A:
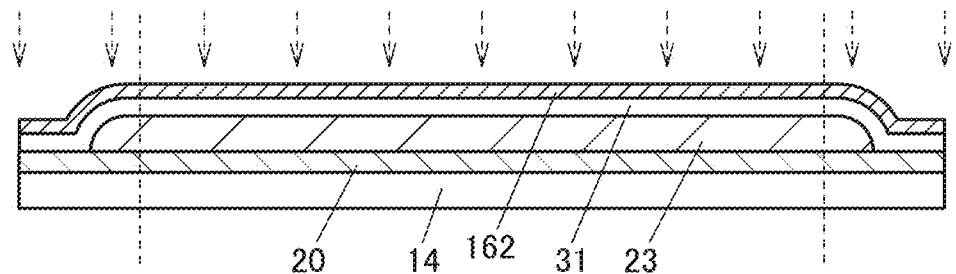
FIGS. 20A to 20E are cross-sectional views illustrating an example of a manufacturing method of a display device.
Figure 20B:
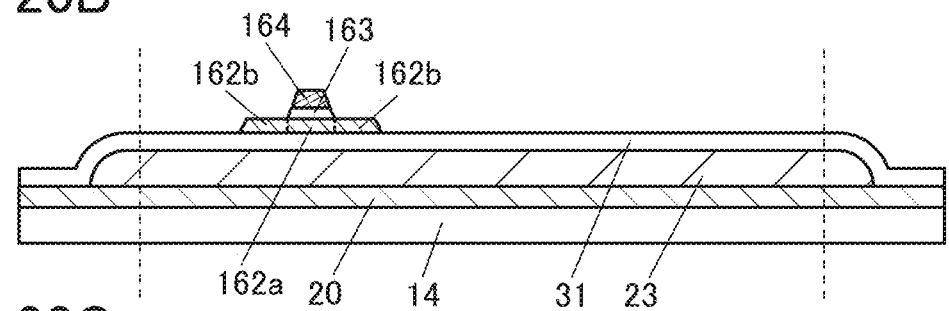

Next, the semiconductor film is crystallized to form a semiconductor film 162 having a crystalline structure (FIG. 20A).

The semiconductor film can be crystallized by irradiation with laser light from above the semiconductor film. The laser light with a wavelength of 193 nm, 248 nm, 308 nm, or 351 nm, for example, can be used. Alternatively, the semiconductor film may be crystallized by using a metal catalyst element.

In this embodiment, since the resin layer 23 has high heat resistance and is formed to be thick, damage due to crystallization can be reduced.

Next, channel doping may be performed on the semiconductor film 162 having a crystalline structure.

Next, the semiconductor film 162 having a crystalline structure is processed to form an island-shaped semiconductor film.

The semiconductor film can be processed by a wet etching method and/or a dry etching method.

Next, an insulating layer 163 and a conductive layer 164 are formed over the insulating layer 31 and the semiconductor film. For the insulating layer 163, the description of the inorganic insulating film that can be used for the insulating layer 31 can be referred to. The insulating layer 163 and the conductive layer 164 can be formed in the following manner: an insulating film to be the insulating layer 163 is formed; a conductive film to be the conductive layer 164 is formed; a mask is formed; the insulating film and the conductive film are etched; and the mask is removed.

An impurity element is added to part of the semiconductor film, whereby a channel region 162a and low-resistance regions 162b (also referred to as a source region and a drain region) are formed. The impurity element may be added a plurality of times (where light doping and heavy doping are performed) to form a lightly doped drain (LDD) region between the channel region 162a and each of the low resistance regions 162b. The insulating layer 163, the conductive layer 164, and a mask for forming these layers can function as a mask for adding impurity elements.

In the case of forming an n-channel transistor, an impurity element imparting n-type conductivity to a semiconductor film is used. For example, an element such as P, As, Sb, S, Te, or Se can be used.

In the case of forming a p-channel transistor, an impurity element imparting p-type conductivity to a semiconductor film is used. For example, an element such as B, Al, or Ga can be used.

Figure 20C:
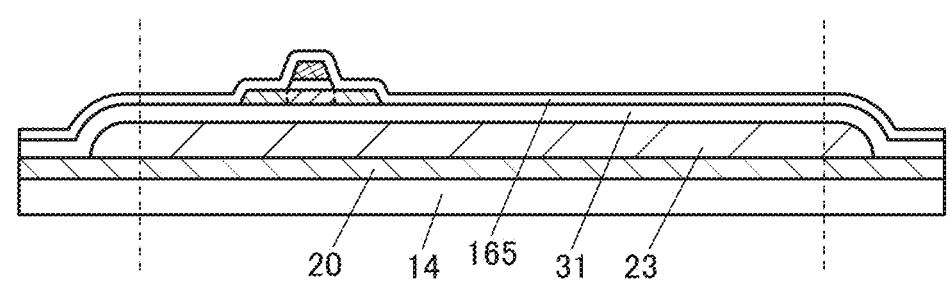

Next, an insulating layer 165 that covers the semiconductor layer, the insulating layer 163, and the conductive layer 164 is formed (FIG. 20C). The insulating layer 165 can be formed in a manner similar to that of the insulating layer 31.

Next, heat treatment is performed. Thus, the impurity element which is added to the semiconductor film is activated. The heat treatment is preferably performed after the formation of the insulating layer 165 so as to prevent oxidation of the conductive layer 164.

In this embodiment, since the heat resistance of the resin layer 23 is high, heat treatment for activating the impurity element can be performed at high temperatures. Thus, the characteristics of the transistor can be improved.

Figure 20D:
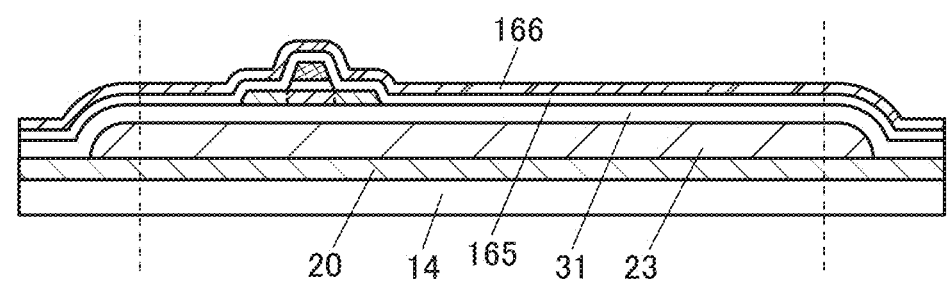

Next, an insulating layer 166 is formed over the insulating layer 165 (FIG. 20D). The insulating layer 166 can be formed in a manner similar to that of the insulating layer 31, and specifically, an insulating film containing hydrogen is formed as the insulating layer 166.

Next, heat treatment is performed. Consequently, hydrogen is supplied from the insulating layer 166 containing hydrogen into the semiconductor film (especially into the channel region 162a); thus, defects in the semiconductor film can be terminated with hydrogen. The heat treatment is preferably performed after the insulating layer 166 containing hydrogen is formed. The heat treatment is performed at a temperature lower than the temperature of the heat treatment which is performed on the amorphous silicon film 161 in order to release hydrogen.

In this embodiment, since heat resistance of the resin layer 23 is high, heat treatment for hydrogenation can be performed at high temperatures. Thus, the characteristics of the transistor can be improved.

Next, openings reaching the low-resistance regions 162b of the semiconductor layer are formed in the insulating layers 165 and 166.

Then, the conductive layer 167a and the conductive layer 167b are formed. The conductive layers 167a and 167b can be formed in the following manner: a conductive film is formed; a resist mask is formed; the conductive film is etched; and the resist mask is removed. The conductive layers 167a and 167b are electrically connected to the low-resistance regions 162b through the openings formed in the insulating layers 165 and 166.

Figure 20E:
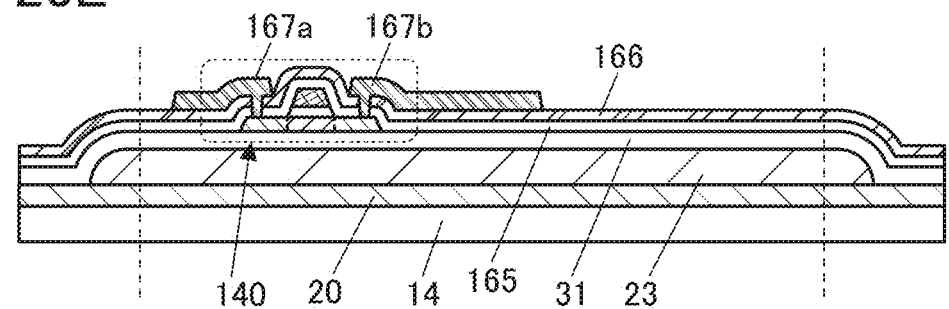

In the above manner, the transistor 140 can be fabricated (FIG. 20E). In the transistor 140, part of the conductive layer 164 functions as a gate and part of the insulating layer 163 functions as a gate insulating layer. The semiconductor layer includes the channel region 162a and the low-resistance regions 162b. The channel region 162a and the conductive layer 164 overlap with each other with the insulating layer 163 provided therebetween. The low-resistance regions 162b include a portion connected to the conductive layer 167a and a portion connected to the conductive layer 167b.

Next, constituents from the insulating layer 34 to the protective layer 75 are formed over the insulating layer 166 (see FIG. 21A). For these steps, Embodiment 1 can be referred to.

Then, a separation trigger is formed in the resin layer 23 (FIGS. 21B1 and 21B2). For the method for forming the separation trigger, Embodiment 1 can be referred to.

In the case where a plurality of display devices are manufactured using one formation substrate (a multiple panel method), the plurality of display devices can be formed using one resin layer 23. For example, the plurality of display devices are provided inside the cut 64 shown in FIG. 21B2. In that case, the plurality of display devices can be separated from the formation substrate at a time.

Alternatively, a plurality of resin layers 23 may be separately formed for display devices. In the example illustrated in FIG. 21B3, four resin layers 23 are formed over a formation substrate. The cut 64 is made in a frame-like shape in each of the four resin layers 23, whereby the display devices can be separated from the formation substrate at different timings.

In this embodiment, the top surface of the metal oxide layer 20 includes a portion in contact with the resin layer 23 and a portion in contact with the insulating layer 31. The adhesion (adhesiveness) between the metal oxide layer 20 and the insulating layer 31 is higher than that between the metal oxide layer 20 and the resin layer 23. Therefore, unintentional peeling of the resin layer 23 from the metal oxide layer 20 can be inhibited. In addition, the formation of the separation trigger enables the metal oxide layer 20 and the resin layer 23 to be separated from each other at desired timing. Accordingly, the timing of the separation can be controlled and the force required for the separation is small. This can increase the yield of the separation process and that of the manufacturing process of a display device.

Figure 22A:
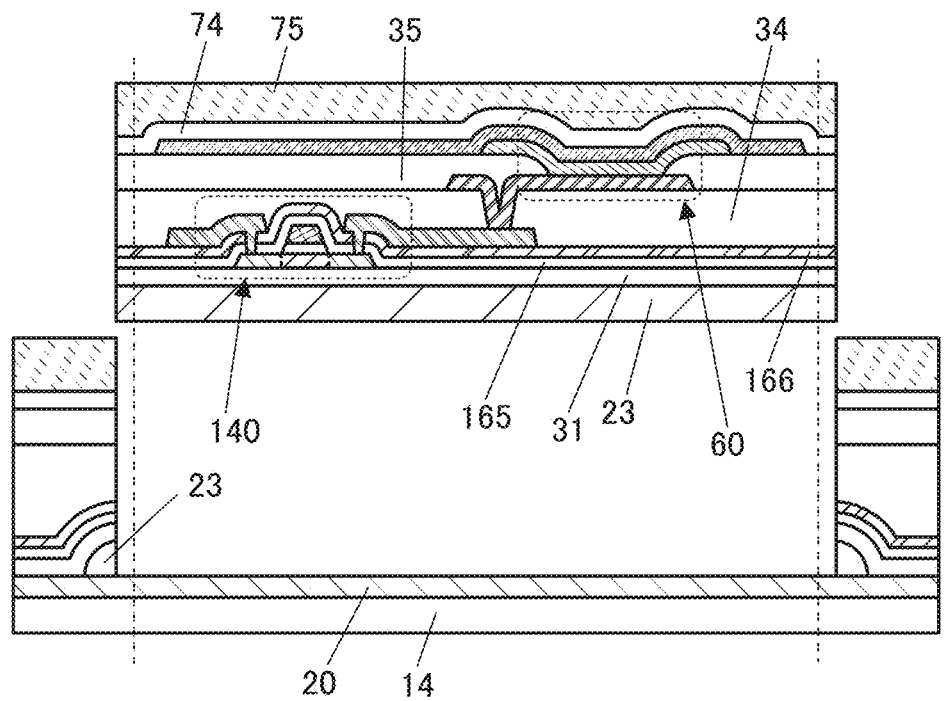
FIGS. 22A and 22B are cross-sectional views illustrating an example of a manufacturing method of a display device.

Then, the metal oxide layer 20 and the resin layer 23 are separated from each other (FIG. 22A).

Figure 22B:
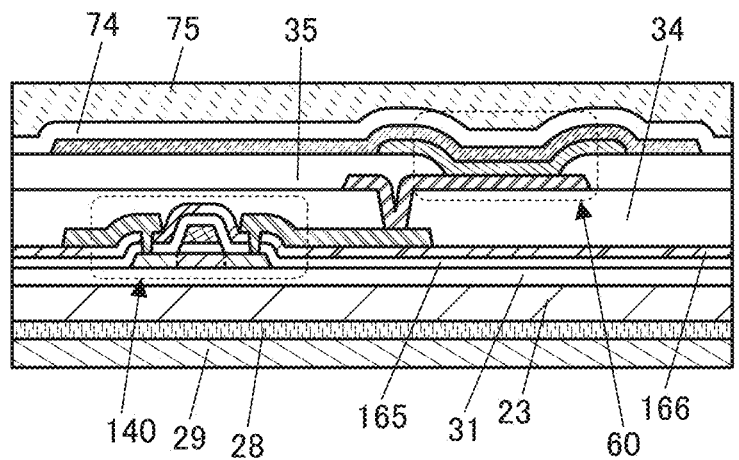

After that, the substrate 29 is bonded to the exposed resin layer 23 with the adhesive layer 28 (FIG. 22B).

The substrate 29 can serve as a supporting substrate of the display device. The substrate 29 is preferably a film, further preferably a resin film. In that case, the display device can be reduced in weight and thickness. The display device using a film substrate is more robust than a display device using glass, metal, or the like. In addition, the display device can have higher flexibility.

As described above, the resin layer is formed to be thick using a high heat-resistant material, whereby a display device including LTPS in a transistor can be manufactured.

Structure Example 3 of Display Device

Figure 23A:
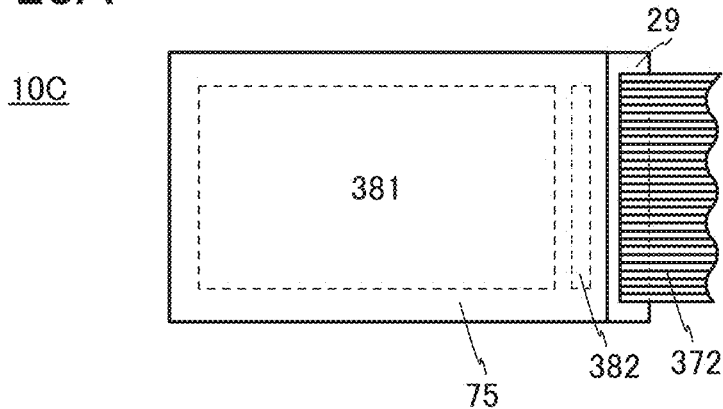
FIGS. 23A to 23C are a top view and cross-sectional views illustrating examples of a display device.
Figure 23B:
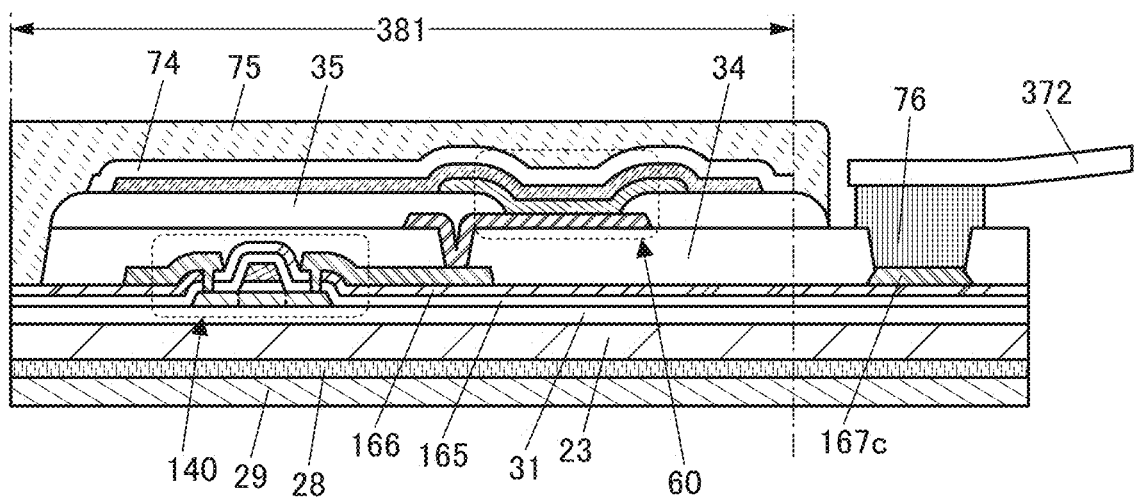
Figure 23C:
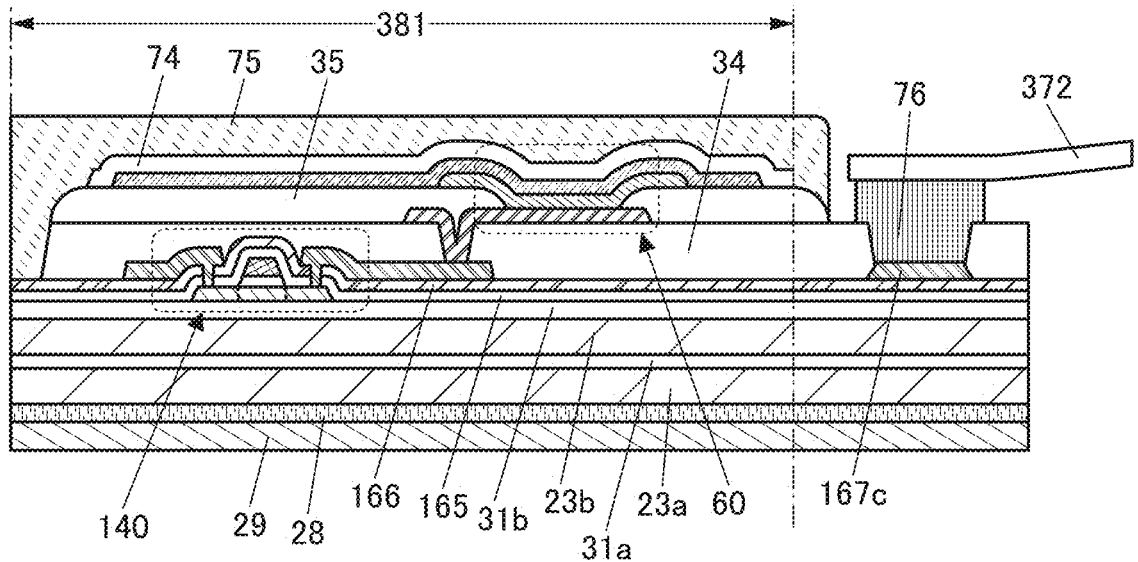

FIG. 23A is a top view of a display device 10C. FIGS. 23B and 23C are each an example of a cross-sectional view illustrating the display portion 381 of the display device 10C and a portion for connection to the FPC 372.

The display device 10C can be held in a bent state and can be bent repeatedly, for example.

The display device 10C includes the protective layer 75 and the substrate 29. The protective layer 75 side is the display surface side of the display device. The display device 10C includes the display portion 381 and the driver circuit portion 382. The FPC 372 is attached to the display device 10C.

The conductive layer 43c and the FPC 372 are electrically connected through the connector 76 (FIGS. 23B and 23C). The conductive layer 43c can be formed using the same material and the same step as those of the source and the drain of the transistor.

The display device illustrated in FIG. 23C does not include the resin layer 23 and the insulating layer 31 but includes a stack including a resin layer 23a, an insulating layer 31a, a resin layer 23b, and an insulating layer 31b. Such a stack can improve the reliability of the display device.

This embodiment can be combined with any other embodiment as appropriate.

Embodiment 3

In this embodiment, a display device and an input/output device that can be manufacturing by applying one embodiment of the present invention will be described with reference to FIG. 24, FIG. 25, FIG. 26, FIG. 27, FIGS. 28A and 28B, FIG. 29, FIG. 30, FIG. 31, FIG. 32, and FIG. 33.

The display device of this embodiment includes a first display element reflecting visible light and a second display element emitting visible light.

The display device of this embodiment has a function of displaying an image using one or both of light reflected by the first display element and light emitted from the second display element.

As the first display element, an element which displays an image by reflecting external light can be used. Such an element does not include a light source (or does not require an artificial light source); thus, power consumed in displaying an image can be significantly reduced.

As a typical example of the first display element, a reflective liquid crystal element can be given. As the first display element, an element using a microcapsule method, an electrophoretic method, an electrowetting method, an Electronic Liquid Powder (registered trademark) method, or the like can also be used, other than a microelectromechanical systems (MEMS) shutter element or an optical interference type MEMS element.

As the second display element, a light-emitting element is preferably used. Since the luminance and the chromaticity of light emitted from such a display element are not affected by external light, a clear image that has high color reproducibility (wide color gamut) and a high contrast can be displayed.

As the second display element, a self-luminous light-emitting element such as an organic light-emitting diode (OLED), a light-emitting diode (LED), or a quantum-dot light-emitting diode (QLED) can be used.

The display device of this embodiment has a first mode in which an image is displayed using only the first display element, a second mode in which an image is displayed using only the second display element, and a third mode in which an image is displayed using both the first display element and the second display element. The display device of this embodiment can be switched between these modes automatically or manually.

In the first mode, an image is displayed using the first display element and external light. Because a light source is unnecessary in the first mode, power consumed in this mode is extremely low. When sufficient external light enters the display device (e.g., in a bright environment), for example, an image can be displayed by using light reflected by the first display element. The first mode is effective in the case where external light is white light or light near white light and is sufficiently strong, for example. The first mode is suitable for displaying text. Furthermore, the first mode enables eye-friendly display owing to the use of reflected external light, which leads to an effect of easing eyestrain.

In the second mode, an image is displayed using light emitted from the second display element. Thus, an extremely vivid image (with high contrast and excellent color reproducibility) can be displayed regardless of the illuminance and the chromaticity of external light. The second mode is effective in the case of extremely low illuminance, such as in a night environment or in a dark room, for example. When a bright image is displayed in a dark environment, a user may feel that the image is too bright. To prevent this, an image with reduced luminance is preferably displayed in the second mode. In that case, glare can be reduced, and power consumption can also be reduced. The second mode is suitable for displaying a vivid (still and moving) image or the like.

In the third mode, an image is displayed using both light reflected by the first display element and light emitted from the second display element. An image displayed in the third mode can be more vivid than an image displayed in the first mode while power consumption can be lower than that in the second mode. The third mode is effective in the case where the illuminance is relatively low or in the case where the chromaticity of external light is not white, for example, in an environment under indoor illumination or in the morning or evening.

With such a structure, a highly convenient display device with high visibility regardless of the ambient brightness can be fabricated. Specifically, a highly convenient display device with high visibility under external light and indoors can be fabricated.

Note that the third mode can be referred to as a mode employing a hybrid display method.

The display device and the input/output device described in this embodiment can be referred to as a hybrid display.

Hybrid display is a method for displaying a letter and/or an image using reflected light and self-emitted light together in one panel that complement the color tone or light intensity of each other. Alternatively, hybrid display is a method for displaying a letter and/or an image using light from a plurality of display elements in one pixel or one subpixel. Note that when a hybrid display performing hybrid display is locally observed, a pixel or a subpixel performing display using any one of the plurality of display elements and a pixel or a subpixel performing display using two or more of the plurality of display elements are included in some cases.

Note that in the present specification and the like, hybrid display satisfies any one or a plurality of the above-described descriptions.

Furthermore, a hybrid display includes a plurality of display elements in one pixel or one subpixel. Note that as an example of the plurality of display elements, a reflective element that reflects light and a self-luminous element that emits light can be given. Note that the reflective element and the self-luminous element can be controlled independently. A hybrid display has a function of displaying a letter and/or an image using one or both of reflected light and self-emitted light in a display portion.

The display device of this embodiment includes a plurality of first pixels including the first display elements and a plurality of second pixels including the second display elements. The first pixels and the second pixels are preferably arranged in matrices.

Each of the first pixels and the second pixels can include one or more sub-pixels. For example, each pixel can include one sub-pixel (e.g., a white (W) sub-pixel), three sub-pixels (e.g., red (R), green (G), and blue (B) sub-pixels, or yellow (Y), cyan (C), and magenta (M) sub-pixels), or four sub-pixels (e.g., red (R), green (G), blue (B), and white (W) sub-pixels, or red (R), green (G), blue (B), and yellow (Y) sub-pixels).

In the display device of this embodiment, the first pixels and the second pixels can be used to display a full-color image. Alternatively, the display device of this embodiment can display a black-and-white image or a grayscale image using the first pixels and can display a full-color image using the second pixels. The first pixels that can be used for displaying a black-and-white image or a grayscale image are suitable for displaying information that need not be displayed in color such as text information.

Figure 24:
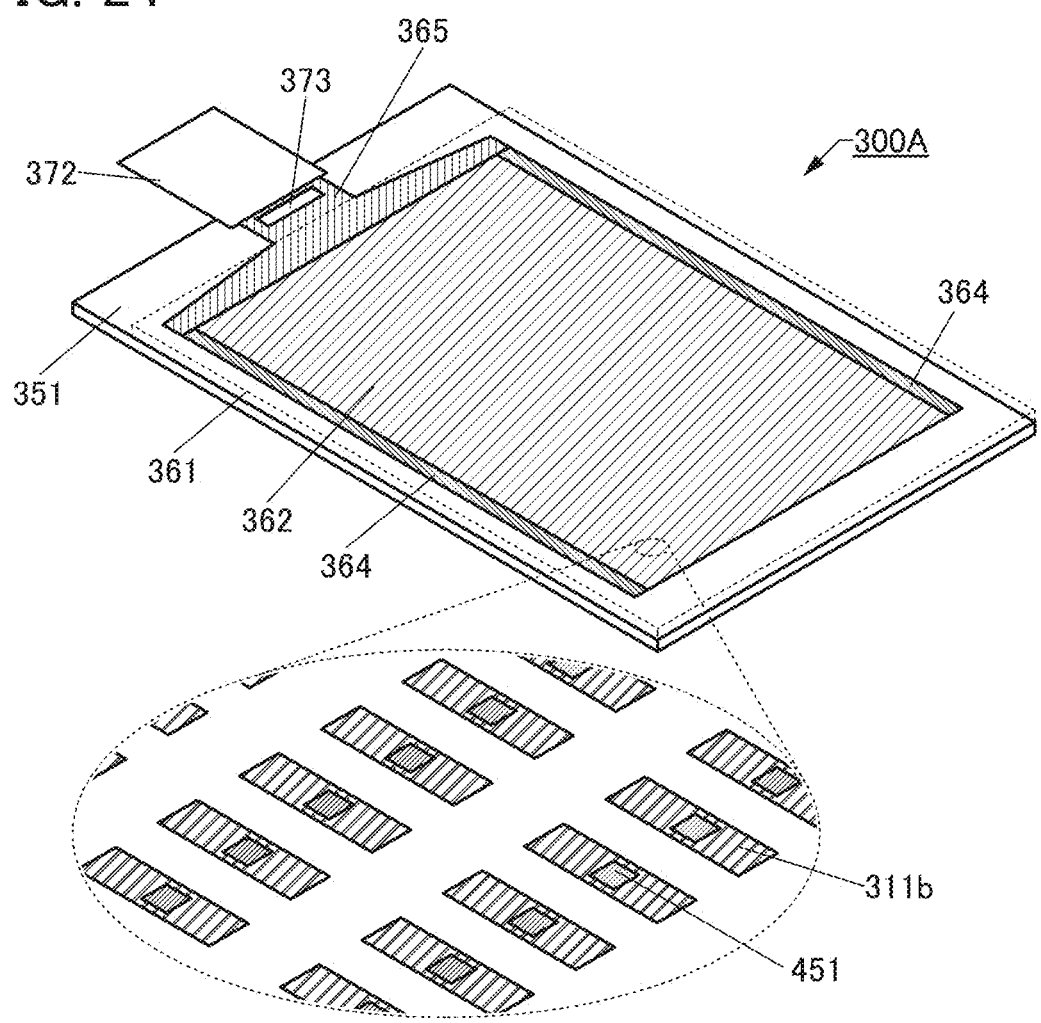
FIG. 24 is a perspective view illustrating an example of a display device.

FIG. 24 is a schematic perspective view of a display device 300A. In the display device 300A, the substrate 351 and the substrate 361 are bonded to each other. In FIG. 24, the substrate 361 is denoted by a dashed line.

The display device 300A includes a display portion 362, a circuit 364, a wiring 365, and the like. FIG. 24 illustrates an example in which the display device 300A is provided with an integrated circuit (IC) 373 and an FPC 372. Thus, the structure illustrated in FIG. 24 can be regarded as a display module including the display device 300A, the IC, and the FPC.

As the circuit 364, for example, a scan line driver circuit can be used.

The wiring 365 has a function of supplying a signal and power to the display portion 362 and the circuit 364. The signal and power are input to the wiring 365 from the outside through the FPC 372 or from the IC 373.

FIG. 24 illustrates an example in which the IC 373 is provided over the substrate 351 by a chip on glass (COG) method, a chip on film (COF) method, or the like. An IC including a scan line driver circuit, a signal line driver circuit, or the like can be used as the IC 373, for example. Note that the display device 300A and the display module are not necessarily provided with an IC. The IC may be provided over the FPC by a COF method or the like.

FIG. 24 illustrates an enlarged view of part of the display portion 362. Electrodes 311b included in a plurality of display elements are arranged in a matrix in the display portion 362. The electrode 311b has a function of reflecting visible light, and serves as a reflective electrode of the liquid crystal element 180.

As illustrated in FIG. 24, the electrode 311b includes an opening 451. In addition, the display portion 362 includes the light-emitting element 170 that is positioned closer to the substrate 351 than the electrode 311b. Light from the light-emitting element 170 is emitted to the substrate 361 side through the opening 451 in the electrode 311b. The area of the light-emitting region of the light-emitting element 170 may be equal to the area of the opening 451. One of the area of the light-emitting region of the light-emitting element 170 and the area of the opening 451 is preferably larger than the other because a margin for misalignment can be increased. It is particularly preferable that the area of the opening 451 be larger than the area of the light-emitting region of the light-emitting element 170. When the area of the opening 451 is small, part of light from the light-emitting element 170 is blocked by the electrode 311b and cannot be extracted to the outside, in some cases. The opening 451 with a sufficiently large area can reduce waste of light emitted from the light-emitting element 170.

Figure 25:
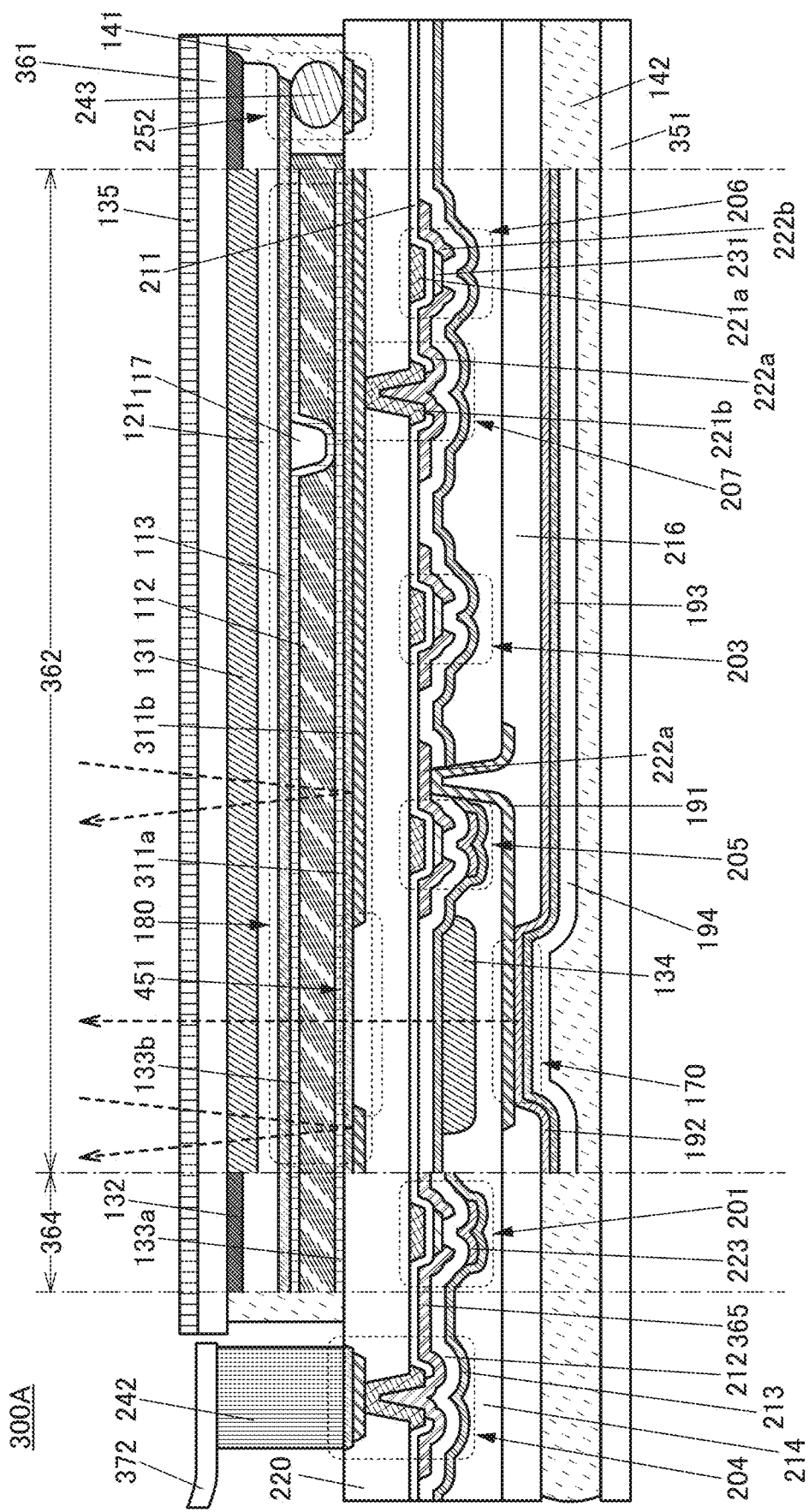
FIG. 25 is a cross-sectional view illustrating an example of a display device.

FIG. 25 illustrates an example of cross-sections of part of a region including the FPC 372, part of a region including the circuit 364, and part of a region including the display portion 362 of the display device 300A illustrated in FIG. 24.

The display device 300A illustrated in FIG. 25 includes a transistor 201, a transistor 203, a transistor 205, a transistor 206, the liquid crystal element 180, the light-emitting element 170, an insulating layer 220, a coloring layer 131, a coloring layer 134, and the like, between the substrate 351 and the substrate 361. The substrate 361 and the insulating layer 220 are bonded to each other with an adhesive layer 141. The substrate 351 and the insulating layer 220 are bonded to each other with an adhesive layer 142.

The substrate 361 is provided with the coloring layer 131, a light-blocking layer 132, an insulating layer 121, an electrode 113 functioning as a common electrode of the liquid crystal element 180, an alignment film 133b, an insulating layer 117, and the like. A polarizing plate 135 is provided on an outer surface of the substrate 361. The insulating layer 121 may have a function of a planarization layer. The insulating layer 121 enables the electrode 113 to have an almost flat surface, resulting in a uniform alignment state of a liquid crystal layer 112. The insulating layer 117 serves as a spacer for maintaining a cell gap of the liquid crystal element 180. In the case where the insulating layer 117 transmits visible light, the insulating layer 117 may be positioned to overlap with a display region of the liquid crystal element 180.

The liquid crystal element 180 is a reflective liquid crystal element. The liquid crystal element 180 has a stacked-layer structure of an electrode 311a serving as a pixel electrode, the liquid crystal layer 112, and the electrode 113. The electrode 311b that reflects visible light is provided in contact with a surface of the electrode 311a on the substrate 351 side. The electrode 311b includes the opening 451. The electrode 311a and the electrode 113 transmit visible light. An alignment film 133a is provided between the liquid crystal layer 112 and the electrode 311a. The alignment film 133b is provided between the liquid crystal layer 112 and the electrode 113.

In the liquid crystal element 180, the electrode 311b has a function of reflecting visible light, and the electrode 113 has a function of transmitting visible light. Light entering from the substrate 361 side is polarized by the polarizing plate 135, transmitted through the electrode 113 and the liquid crystal layer 112, and reflected by the electrode 311b. Then, the light is transmitted through the liquid crystal layer 112 and the electrode 113 again to reach the polarizing plate 135. In this case, alignment of a liquid crystal can be controlled with a voltage that is applied between the electrode 311b and the electrode 113, and thus optical modulation of light can be controlled. In other words, the intensity of light emitted through the polarizing plate 135 can be controlled. Light excluding light in a particular wavelength range is absorbed by the coloring layer 131 and thus, emitted light is red light, for example.

As illustrated in FIG. 25, the electrode 311a that transmits visible light is preferably provided across the opening 451. Accordingly, liquid crystals in the liquid crystal layer 112 are aligned in a region overlapping with the opening 451 as in the other regions, in which case an alignment defect of the liquid crystals in a boundary portion of these regions is prevented and undesired light leakage can be suppressed.

At a connection portion 207, the electrode 311b is electrically connected to a conductive layer 222a included in the transistor 206 via a conductive layer 221b. The transistor 206 has a function of controlling the driving of the liquid crystal element 180.

A connection portion 252 is provided in part of a region where the adhesive layer 141 is provided. In the connection portion 252, a conductive layer obtained by processing the same conductive film as the electrode 311a is electrically connected to part of the electrode 113 with a connector 243. Accordingly, a signal or a potential input from the FPC 372 connected to the substrate 351 side can be supplied to the electrode 113 formed on the substrate 361 side through the connection portion 252.

As the connector 243, for example, a conductive particle can be used. As the conductive particle, a particle of an organic resin, silica, or the like coated with a metal material can be used. It is preferable to use nickel or gold as the metal material because contact resistance can be decreased. It is also preferable to use a particle coated with layers of two or more kinds of metal materials, such as a particle coated with nickel and further with gold. A material capable of elastic deformation or plastic deformation is preferably used for the connector 243. As illustrated in FIG. 25, the connector 243, which is the conductive particle, has a shape that is vertically crushed in some cases. With the crushed shape, the contact area between the connector 243 and a conductive layer electrically connected to the connector 243 can be increased, thereby reducing contact resistance and suppressing the generation of problems such as disconnection.

The connector 243 is preferably provided so as to be covered with the adhesive layer 141. For example, the connectors 243 are dispersed in the adhesive layer 141 before curing of the adhesive layer 141.

The light-emitting element 170 is a bottom-emission light-emitting element. The light-emitting element 170 has a stacked-layer structure in which an electrode 191 serving as a pixel electrode, an EL layer 192, and an electrode 193 serving as a common electrode are stacked in this order from the insulating layer 220 side. The electrode 191 is connected to the conductive layer 222a included in the transistor 205 through an opening provided in an insulating layer 214. The transistor 205 has a function of controlling the driving of the light-emitting element 170. An insulating layer 216 covers an end portion of the electrode 191. The electrode 193 includes a material that reflects visible light, and the electrode 191 includes a material that transmits visible light. An insulating layer 194 is provided to cover the electrode 193. Light is emitted from the light-emitting element 170 to the substrate 361 side through the coloring layer 134, the insulating layer 220, the opening 451, the electrode 311a, and the like.

The liquid crystal element 180 and the light-emitting element 170 can exhibit various colors when the color of the coloring layer varies among pixels. The display device 300A can display a color image using the liquid crystal element 180. The display device 300A can display a color image using the light-emitting element 170.

The transistor 201, the transistor 203, the transistor 205, and the transistor 206 are formed on a plane of the insulating layer 220 on the substrate 351 side. These transistors can be fabricated through the same process.

A circuit electrically connected to the liquid crystal element 180 and a circuit electrically connected to the light-emitting element 170 are preferably formed on the same plane. In that case, the thickness of the display device can be smaller than that in the case where the two circuits are formed on different planes. Furthermore, since two transistors can be formed in the same process, a manufacturing process can be simplified as compared to the case where two transistors are formed on different planes.

The pixel electrode of the liquid crystal element 180 is positioned on the opposite side of a gate insulating layer included in the transistor from the pixel electrode of the light-emitting element 170.

In the case where a transistor including a metal oxide in its channel formation region and having an extremely low off-state current is used as the transistor 206 or in the case where a memory element electrically connected to the transistor 206 is used, for example, in displaying a still image using the liquid crystal element 180, even if writing operation to a pixel is stopped, the gray level can be maintained. In other words, an image can be kept displayed even with an extremely low frame rate. In one embodiment of the present invention, the frame rate can be extremely low and driving with low power consumption can be performed.

The transistor 203 is used for controlling whether the pixel is selected or not (such a transistor is also referred to as a switching transistor or a selection transistor). The transistor 205 is used for controlling current flowing to the light-emitting element 170 (such a transistor is also referred to as a driving transistor).

Insulating layers such as an insulating layer 211, an insulating layer 212, an insulating layer 213, and the insulating layer 214 are provided on the substrate 351 side of the insulating layer 220. Part of the insulating layer 211 functions as a gate insulating layer of each transistor. The insulating layer 212 is provided to cover the transistor 206 and the like. The insulating layer 213 is provided to cover the transistor 205 and the like. The insulating layer 214 functions as a planarization layer. Note that the number of insulating layers covering the transistor is not limited and may be one or two or more.

A material through which impurities such as water or hydrogen do not easily diffuse is preferably used for at least one of the insulating layers that cover the transistors. This is because such an insulating layer can serve as a barrier film. Such a structure can effectively suppress diffusion of the impurities into the transistors from the outside, and a highly reliable display device can be provided.

Each of the transistors 201, 203, 205, and 206 includes a conductive layer 221a functioning as a gate, the insulating layer 211 functioning as the gate insulating layer, the conductive layer 222a and a conductive layer 222b functioning as a source and a drain, and a semiconductor layer 231. Here, a plurality of layers obtained by processing the same conductive film are shown with the same hatching pattern.

The transistor 201 and the transistor 205 each include a conductive layer 223 functioning as a gate, in addition to the components of the transistor 203 or the transistor 206.

The structure in which the semiconductor layer where a channel is formed is provided between two gates is used as an example of the transistors 201 and 205. Such a structure enables the control of the threshold voltages of transistors. The two gates may be connected to each other and supplied with the same signal to operate the transistors. Such transistors can have higher field-effect mobility and thus have a higher on-state current than other transistors. Consequently, a circuit capable of high-speed operation can be obtained. Furthermore, the area occupied by a circuit portion can be reduced. The use of the transistor having a high on-state current can reduce signal delay in wirings and can reduce display unevenness even in a display device in which the number of wirings is increased because of an increase in size or resolution.

Alternatively, by supplying a potential for controlling the threshold voltage to one of the two gates and a potential for driving to the other, the threshold voltage of the transistor can be controlled.

There is no limitation on the structure of the transistors included in the display device. The transistor included in the circuit 364 and the transistor included in the display portion 362 may have the same structure or different structures. A plurality of transistors included in the circuit 364 may have the same structure or a combination of two or more kinds of structures. Similarly, a plurality of transistors included in the display portion 362 may have the same structure or a combination of two or more kinds of structures.

It is preferable to use a conductive material including an oxide for the conductive layer 223. A conductive film used for the conductive layer 223 is formed in an oxygen-containing atmosphere, whereby oxygen can be supplied to the insulating layer 212. The proportion of an oxygen gas in a deposition gas is preferably higher than or equal to 90% and lower than or equal to 100%. Oxygen supplied to the insulating layer 212 is then supplied to the semiconductor layer 231 by later heat treatment; as a result, oxygen vacancies in the semiconductor layer 231 can be reduced.

It is particularly preferable to use a low-resistance metal oxide for the conductive layer 223. In that case, an insulating film that releases hydrogen, such as a silicon nitride film, is preferably used for the insulating layer 213, for example, because hydrogen can be supplied to the conductive layer 223 during the formation of the insulating layer 213 or by heat treatment performed after the formation of the insulating layer 213, which leads to an effective reduction in the electric resistance of the conductive layer 223.

The coloring layer 134 is provided in contact with the insulating layer 213. The coloring layer 134 is covered with the insulating layer 214.

A connection portion 204 is provided in a region where the substrate 351 does not overlap with the substrate 361. In the connection portion 204, the wiring 365 is electrically connected to the FPC 372 via a connection layer 242. The connection portion 204 has a structure similar to that of the connection portion 207. On the top surface of the connection portion 204, a conductive layer obtained by processing the same conductive film as the electrode 311a is exposed. Thus, the connection portion 204 and the FPC 372 can be electrically connected to each other via the connection layer 242.

As the polarizing plate 135 provided on the outer surface of the substrate 361, a linear polarizing plate or a circularly polarizing plate can be used. An example of a circularly polarizing plate is a stack including a linear polarizing plate and a quarter-wave retardation plate. Such a structure can reduce reflection of external light. The cell gap, alignment, drive voltage, and the like of the liquid crystal element used as the liquid crystal element 180 are controlled depending on the kind of the polarizing plate so that desirable contrast is obtained.

Note that a variety of optical members can be arranged on the outer surface of the substrate 361. Examples of the optical members include a polarizing plate, a retardation plate, a light diffusion layer (e.g., a diffusion film), an anti-reflective layer, and a light-condensing film. Furthermore, an antistatic film preventing the attachment of dust, a water repellent film suppressing the attachment of stain, a hard coat film suppressing generation of a scratch caused by the use, or the like may be arranged on the outer surface of the substrate 361.

For each of the substrates 351 and 361, glass, quartz, ceramic, sapphire, an organic resin, or the like can be used. When the substrates 351 and 361 are formed using a flexible material, the flexibility of the display device can be increased.

A liquid crystal element having, for example, a vertical alignment (VA) mode can be used as the liquid crystal element 180. Examples of the vertical alignment mode include a multi-domain vertical alignment (MVA) mode, a patterned vertical alignment (PVA) mode, and an advanced super view (ASV) mode.

A liquid crystal element having a variety of modes can be used as the liquid crystal element 180. For example, a liquid crystal element using, instead of a VA mode, a twisted nematic (TN) mode, an in-plane switching (IPS) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, a super twisted nematic (STN) mode, a transverse bend alignment (TBA) mode, an electrically controlled birefringence (ECB) mode, a guest-host mode, or the like can be used.

The liquid crystal element is an element that controls transmission or non-transmission of light utilizing an optical modulation action of the liquid crystal. The optical modulation action of the liquid crystal is controlled by an electric field applied to the liquid crystal (including a horizontal electric field, a vertical electric field, and an oblique electric field). As the liquid crystal used for the liquid crystal element, a thermotropic liquid crystal, a low-molecular liquid crystal, a high-molecular liquid crystal, a polymer dispersed liquid crystal (PDLC), a polymer network liquid crystal (PNLC), a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

As the liquid crystal material, a positive liquid crystal or a negative liquid crystal may be used, and an appropriate liquid crystal material can be used depending on the mode or design to be used.

To control the alignment of the liquid crystal, the alignment films can be provided. In the case where a horizontal electric field mode is employed, a liquid crystal exhibiting a blue phase for which an alignment film is unnecessary may be used. The blue phase is one of liquid crystal phases, which is generated just before a cholesteric phase changes into an isotropic phase while the temperature of a cholesteric liquid crystal is increased. Since the blue phase appears only in a narrow temperature range, a liquid crystal composition in which a chiral material is mixed to account for several weight percent or more is used for the liquid crystal in order to improve the temperature range. The liquid crystal composition that includes a liquid crystal exhibiting a blue phase and a chiral material has a short response time and has optical isotropy. In addition, the liquid crystal composition that includes a liquid crystal exhibiting a blue phase and a chiral material does not need alignment treatment and has small viewing angle dependence. An alignment film does not need to be provided and rubbing treatment is thus not necessary; accordingly, electrostatic discharge damage caused by the rubbing treatment can be prevented and defects and damage of a liquid crystal display device in the manufacturing process can be reduced.

In the case where the reflective liquid crystal element is used, the polarizing plate 135 is provided on the display surface side. In addition, a light diffusion plate is preferably provided on the display surface side to improve visibility.

A front light may be provided on the outer side of the polarizing plate 135. As the front light, an edge-light front light is preferably used. A front light including an LED is preferably used to reduce power consumption.

For the materials that can be used for the light-emitting element, the transistors, the insulating layers, the conductive layers, the adhesive layers, the connection layer, and the like, the description in Embodiment 1 can be referred to.

Application Example

In one embodiment of the present invention, a display device provided with a touch sensor (hereinafter also referred to as an input/output device or a touch panel) can be manufactured.

There is no particular limitation on a sensor element included in the input/output device of one embodiment of the present invention. Note that a variety of sensors that can sense proximity or touch of a sensing target such as a finger or a stylus can be used as the sensor element.

For example, a variety of types such as a capacitive type, a resistive type, a surface acoustic wave type, an infrared type, an optical type, and a pressure-sensitive type can be used for the sensor.

In this embodiment, an input/output device including a capacitive sensor element will be described as an example.

Examples of the capacitive sensor element include a surface capacitive sensor element and a projected capacitive sensor element. Examples of the projected capacitive sensor element include a self-capacitive sensor element and a mutual capacitive sensor element. The use of a mutual capacitive sensor element is preferable because multiple points can be sensed simultaneously.

The input/output device of one embodiment of the present invention can have any of a variety of structures, including a structure in which a display device and a sensor element that are separately formed are bonded to each other and a structure in which an electrode and the like included in a sensor element are provided over one or both of a pair of substrates included in the display panel.

Figure 26:
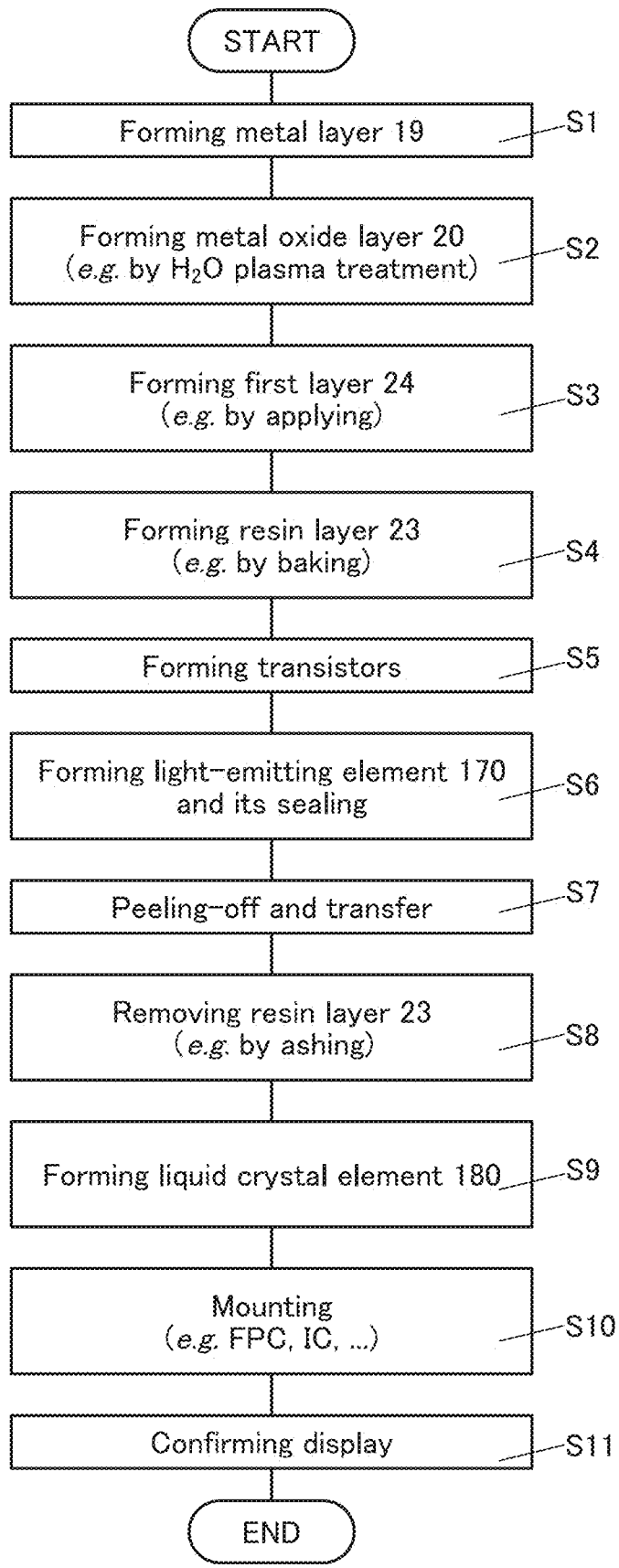
FIG. 26 is a flow chart showing an example of a manufacturing method of a display device.
Figure 27:
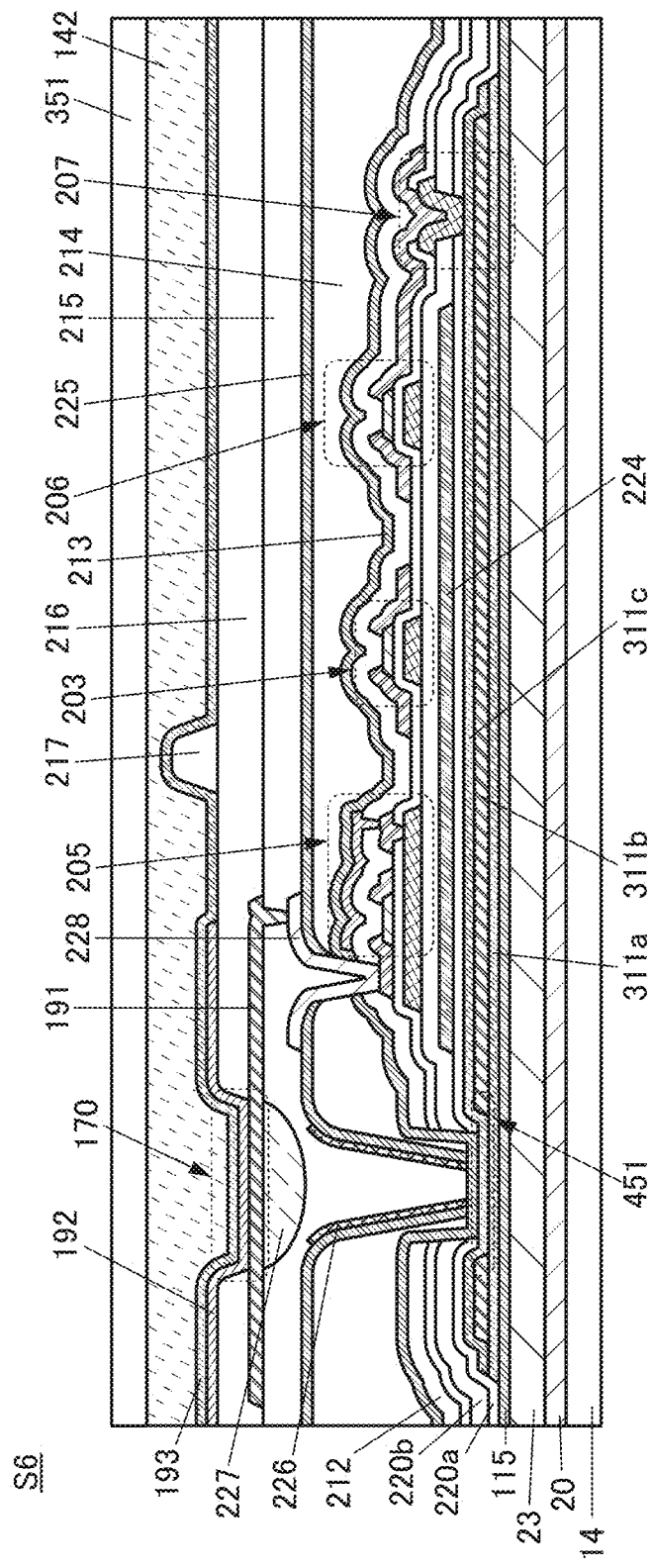
FIG. 27 is a cross-sectional view illustrating an example of a manufacturing method of a display device.
Figure 30:
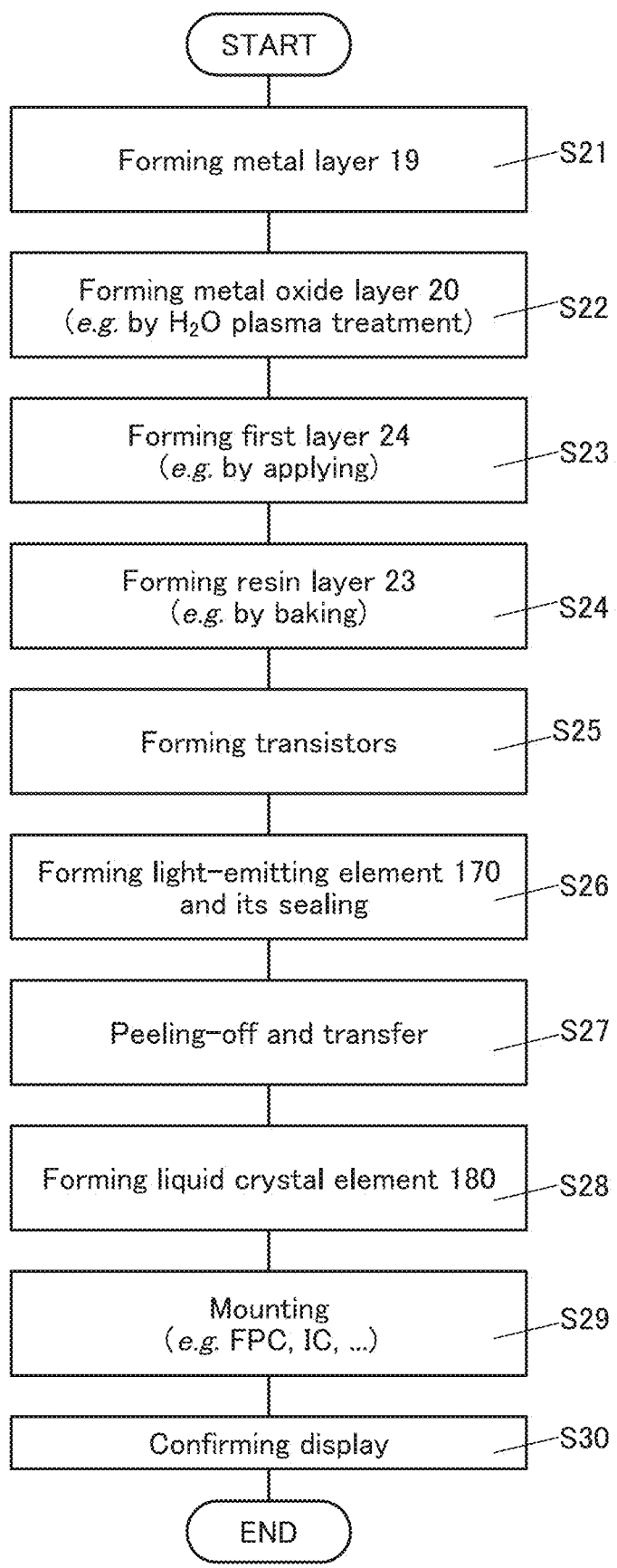
FIG. 30 is a flow chart showing an example of a manufacturing method of a display device.
Figure 31:
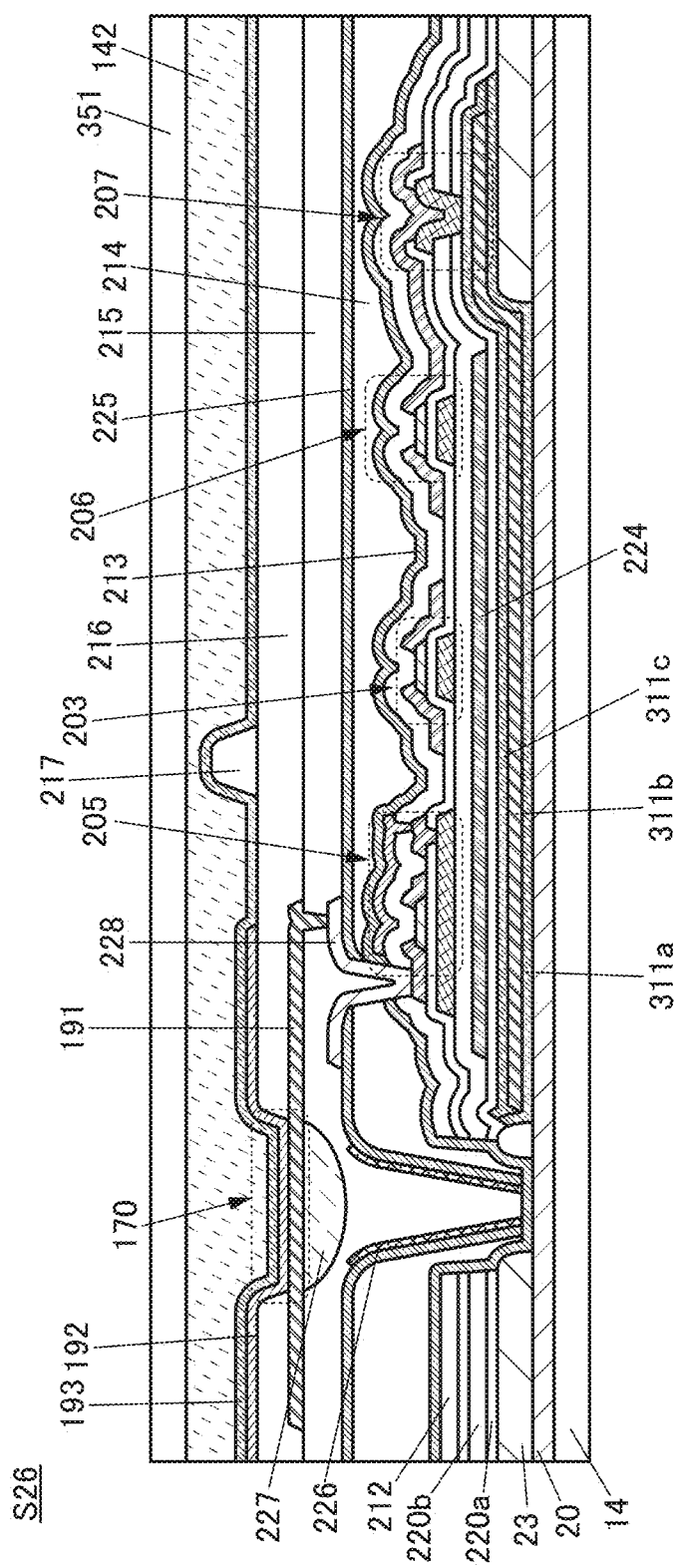
FIG. 31 is a cross-sectional view illustrating an example of a manufacturing method of a display device.

An input/output device having a structure in which a display device and a sensor element that are separately formed are bonded to each other will be described below. FIG. 26 and FIG. 30 each show a flowchart of a method for manufacturing the display device of one embodiment of the present invention. FIG. 27 and FIGS. 28A and 28B are cross-sectional views of the display device during manufacture. FIG. 27 corresponds to Step S6 in FIG. 26. Similarly, FIG. 28A and FIG. 28B correspond to Step S7 and Step S8, respectively. FIG. 31 and FIG. 32 are cross-sectional views of the display device during manufacture. FIG. 31 corresponds to Step S26 in FIG. 30. Similarly, FIG. 32 corresponds to Step S27.

As shown in FIG. 26, first, the metal layer 19 is formed over the formation substrate 14 (Step S1). Next, the metal layer 19 is oxidized, so that the metal oxide layer 20 is formed (Step S2). Here, the metal layer 19 is oxidized by performing $H_2O$ plasma treatment, so that the metal oxide layer 20 is formed. For the method for forming the metal oxide layer 20, Embodiment 1 can be referred to.

Next, the first layer 24 is formed over the metal oxide layer 20 (Step S3). Then, the first layer 24 is cured to form the resin layer 23 (Step S4). Here, the resin layer 23 is formed by applying the first layer 24 and performing baking. For the method for forming the resin layer 23, Embodiment 1 can be referred to.

Next, a transistor and the like are formed over the resin layer 23 (Step S5). Next, a light-emitting element electrically connected to the transistor is formed and sealing is performed (Step S6). Components formed over the resin layer 23 are described with reference to FIG. 27. Note that for the components that are already described, the above description can be referred to.

As illustrated in FIG. 27, the metal oxide layer 20 is formed over the formation substrate 14, and the resin layer 23 is formed over the metal oxide layer 20. An insulating layer 115 is formed over the resin layer 23. The insulating layer 115 preferably has a high barrier property. A silicon nitride film is suitably used for the insulating layer 115. The electrode 311a, the electrode 311b, and an electrode 311c are stacked in this order over the insulating layer 115. An end portion of the electrode 311a and an end portion of the electrode 311c are positioned on the outer side than an end portion of the electrode 311b and are in contact with each other. Conductive films that transmit visible light are used for the electrodes 311a and 311c. A conductive film that reflects visible light is used for the electrode 311b. The opening 451 is provided in the electrode 311b. The opening 451 overlaps with a light-emitting region of the light-emitting element 170. An insulating layer 220a is provided over the electrode 311c, the conductive layer 224 is provided over the insulating layer 220a, and an insulating layer 220b is provided over the conductive layer 224. The conductive layer 224 functions as one electrode of a capacitor. The transistor 203, the transistor 205, and the transistor 206 are provided over the insulating layer 220b. One of a source and a drain of the transistor 206 is electrically connected to the electrode 311c in the connection portion 207. The transistor 205 includes two gates. The two gates are electrically connected to each other. One of a source and a drain of the transistor 205 is electrically connected to the electrode 191 of the light-emitting element 170 through a conductive layer 228. The transistors are covered with the insulating layers 212, 213, and 214 and insulating layers 225 and 215. One or more of these insulating layers preferably have a high barrier property. FIG. 27 illustrates an example where a material having a high barrier property is used for the insulating layer 213 and the insulating layer 225. The insulating layer 213 is provided to cover end portions of the insulating layer 220a, the insulating layer 220b, the insulating layer 212, and the like. The insulating layer 225 is provided to cover an end portion of the insulating layer 214. A covering film 226 is a film that reflects visible light. The covering film 226 has a function of reflecting part of light from the light-emitting element 170 to supply the part of the light to the opening 451 side. A lens 227 has a function of transmitting light from the light-emitting element 170. The lens 227 overlaps with the light-emitting region of the light-emitting element 170. The light-emitting element 170 includes the electrode 191, the EL layer 192, and the electrode 193. The EL layer 192 is colored separately for each subpixel. The end portion of the electrode 191 is covered with the insulating layer 216. The insulating layer 217 functions as a spacer. The light-emitting element 170 and the substrate 351 are bonded to each other with the adhesive layer 142.

For one or both of the insulating layer 214 and the insulating layer 215, a material having a refractive index of 1.55 or approximately 1.55, a material having a refractive index of 1.66 or approximately 1.66, an acrylic resin, a polyimide resin, or the like can be used.

For the covering film 226, a metal can be used. Specifically, the covering film 226 can be formed using a material including silver, a material including silver and palladium, a material including silver and copper, or the like.

The refractive index of the lens 227 is preferably greater than or equal to 1.3 and less than or equal to 2.5. The lens 227 can be formed using one or both of an inorganic material and an organic material.

Examples of a material for the lens 227 include a material including an oxide or a sulfide and a material including a resin. Specifically, cerium oxide, hafnium oxide, lanthanum oxide, magnesium oxide, niobium oxide, tantalum oxide, titanium oxide, yttrium oxide, zinc oxide, an oxide including indium and tin, an oxide including indium, gallium, and zinc, zinc sulfide, or the like can be used as the material including an oxide or a sulfide. Specifically, a resin to which chlorine, bromine, or iodine is introduced, a resin to which heavy metal atoms are introduced, a resin to which an aromatic ring is introduced, a resin to which sulfur is introduced, or the like can be used as the material including a resin. Alternatively, the lens 227 can be formed using a material including a resin and a nanoparticle of a material whose refractive index is higher than that of the resin. Titanium oxide, zirconium oxide, or the like can be used for the nanoparticle.

Next, the transistor and the like are peeled from the formation substrate 14 and transferred to the substrate 351 side (Step S7). Separation occurs at the interface between the metal oxide layer 20 and the resin layer 23, so that the resin layer 23 is exposed (FIG. 28A).

Next, the insulating layer 115 is exposed by removing the resin layer 23 (Step S8). Note that the electrode 311a may be exposed by removing part or the whole of the insulating layer 115. When the insulating layer 115 having a high barrier property remains, entry of water into the transistor or the light-emitting element 170 can be prevented, which can increase the reliability of the display device. Here, the resin layer 23 is removed by ashing (FIG. 28B).

Figure 29:
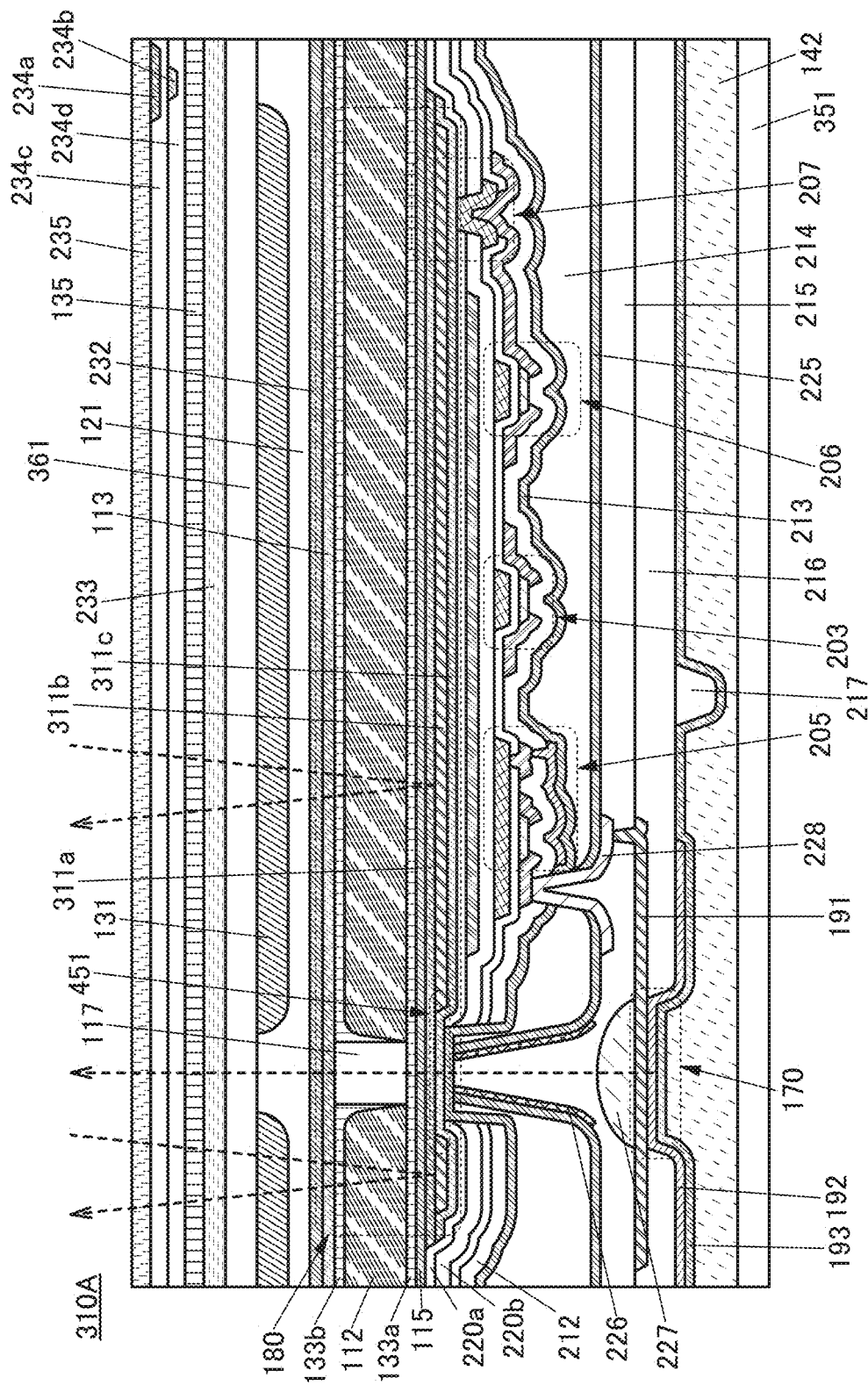
FIG. 29 is a cross-sectional view illustrating an example of an input/output device.

Next, the liquid crystal element 180 is formed (Step S9). The alignment film 133a is formed over the insulating layer 115 (or the electrode 311a). The coloring layer 131, the insulating layer 121, an insulating layer 232, the electrode 113, the insulating layer 117, and the alignment film 133b are formed in this order on one surface of the substrate 361. FIG. 29 illustrates an example where the coloring layer 131 does not overlap with the light-emitting region of the light-emitting element 170, but the coloring layer 131 may overlap with the light-emitting region of the light-emitting element 170. The insulating layer 121 serves as an overcoat. As the insulating layer 232, an insulating film having a high barrier property is suitably used. The electrode 113 serves as a common electrode of the liquid crystal element 180. The insulating layer 117 serves as a spacer for maintaining a cell gap of the liquid crystal element 180. The insulating layer 117 transmits visible light.

The liquid crystal element 180 is formed by bonding the substrate 351 and the substrate 361 so that the liquid crystal layer 112 is sandwiched between the alignment film 133a and the alignment film 133b. The liquid crystal element 180 includes the electrode 311a, the electrode 311b, the electrode 311c, the liquid crystal layer 112, and the electrode 113.

Furthermore, a diffusion film 233 and the polarizing plate 135 are bonded to the other surface of the substrate 361. The substrate 235 one surface of which is provided with a touch sensor is bonded to the polarizing plate 135. Note that an adhesive layer is not illustrated in some portions in FIG. 29. It is preferable that anti-reflective processing be performed on the other surface of the substrate 235. For example, anti-glare treatment is preferably performed. Reflected light can be scattered by roughness of the surface so as to reduce reflection. An insulating layer 234c is provided between a conductive layer 234a and a conductive layer 234b of the touch sensor. The conductive layer 234b is covered with an insulating layer 234d.

Through the above steps, an input/output device 310A in FIG. 29 can be formed. After that, an FPC, an IC, and the like are mounted (Step S10), and display can be confirmed (Step S11).

The flowchart in FIG. 26 includes a step of removing the resin layer 23 peeled from the formation substrate 14. Meanwhile, FIG. 30 is a flowchart without this step.

As shown in FIG. 30, first, the metal layer 19 is formed over the formation substrate 14 (Step S21). Next, the metal layer 19 is oxidized, so that the metal oxide layer 20 is formed (Step S22). Here, the metal layer 19 is oxidized by performing $H_2O$ plasma treatment, so that the metal oxide layer 20 is formed. For the method for forming the metal oxide layer 20, Embodiment 1 can be referred to.

Next, the first layer 24 is formed over the metal oxide layer 20 (Step S23). Then, the first layer 24 is cured to form the resin layer 23 (Step S24). Here, the resin layer 23 is formed by applying the first layer 24 and performing baking. For the method for forming the resin layer 23, Embodiment 1 can be referred to. Note that here, the resin layer 23 including an opening is formed. For example, by providing the opening in a portion of the resin layer 23 where the conductive layer is desired to be exposed, the conductive layer can be exposed without removing the resin layer 23 after the peeling. In the case where visible-light transmittance of the resin layer 23 is low, by providing the opening in a portion of the resin layer 23 where light is extracted, a decrease in light extraction efficiency can be prevented without removing the resin layer 23 after the peeling.

Next, a transistor and the like are formed over the metal oxide layer 20 and the resin layer 23 (Step S25). Next, a light-emitting element electrically connected to the transistor is formed and sealing is performed (Step S26). The components are described with reference to FIG. 31. Note that for the components that are already described, the above description can be referred to.

As illustrated in FIG. 31, the metal oxide layer 20 is formed over the formation substrate 14, and the resin layer 23 is formed over the metal oxide layer 20. The resin layer 23 is provided with an opening. A portion where the resin layer 23 is not provided includes a region where the metal oxide layer 20 and the electrode 311a are in contact with each other and a region where the metal oxide layer 20 and the insulating layer 213 are in contact with each other. The electrode 311a, the electrode 311b, and the electrode 311c are stacked in this order over the metal oxide layer 20 and the resin layer 23. An end portion of the electrode 311a and an end portion of the electrode 311c are positioned on the outer side than an end portion of the electrode 311b and are in contact with each other. Conductive films that transmit visible light are used for the electrodes 311a and 311c. A conductive film that reflects visible light is used for the electrode 311b. The light-emitting region of the light-emitting element 170 is provided in a portion not overlapping with the electrodes. The insulating layer 220a is provided over the electrode 311c, the conductive layer 224 is provided over the insulating layer 220a, and the insulating layer 220b is provided over the conductive layer 224. The conductive layer 224 functions as one electrode of a capacitor. The transistor 203, the transistor 205, and the transistor 206 are provided over the insulating layer 220b. One of the source and the drain of the transistor 206 is electrically connected to the electrode 311c in the connection portion 207. The transistor 205 includes two gates. The two gates are electrically connected to each other. One of the source and the drain of the transistor 205 is electrically connected to the electrode 191 of the light-emitting element 170 through the conductive layer 228. The transistors each are covered with the insulating layers 212 to 215 and 225. One or more of these insulating layers preferably have a high barrier property. FIG. 31 illustrates an example where a material having a high barrier property is used for the insulating layer 213 and the insulating layer 225. The insulating layer 213 is provided to cover end portions of the insulating layer 220a, the insulating layer 220b, the insulating layer 212, and the like. The insulating layer 225 is provided to cover an end portion of the insulating layer 214. The covering film 226 is a film that reflects visible light. The covering film 226 has a function of reflecting part of light from the light-emitting element 170 to supply the part of the light to the bottom of the drawing. The lens 227 has a function of transmitting light from the light-emitting element 170. The lens 227 overlaps with the light-emitting region of the light-emitting element 170. The light-emitting element 170 includes the electrode 191, the EL layer 192, and the electrode 193. The EL layer 192 is colored separately for each subpixel. The end portion of the electrode 191 is covered with the insulating layer 216. The insulating layer 217 functions as a spacer. The light-emitting element 170 and the substrate 351 are bonded to each other with the adhesive layer 142.

Next, the transistor and the like are peeled from the formation substrate 14 and transferred to the substrate 351 side (Step S27). Separation occurs at the interface between the metal oxide layer 20 and the resin layer 23, so that the resin layer 23 is exposed (FIG. 32). In a portion where the resin layer 23 is not provided, separation occurs at the interface between the metal oxide layer 20 and the electrode 311a, so that the electrode 311a is exposed (FIG. 32). The electrode 311a is preferably formed using a material with low adhesion to the metal oxide layer 20. The contact area between the electrode 311a and the metal oxide layer 20 is preferably small because the separation at the interface easily occurs.

Next, the liquid crystal element 180 is formed (Step S28). The alignment film 133a is formed over the resin layer 23 and the electrode 311a. The coloring layer 131, the insulating layer 121, the insulating layer 232, the electrode 113, the insulating layer 117, and the alignment film 133b are formed in this order on one surface of the substrate 361. These components are the same as those in FIG. 29; thus, the description thereof is omitted.

The liquid crystal element 180 is formed by bonding the substrate 351 and the substrate 361 so that the liquid crystal layer 112 is sandwiched between the alignment film 133a and the alignment film 133b. The liquid crystal element 180 includes the electrode 311a, the electrode 311b, the electrode 311c, the liquid crystal layer 112, and the electrode 113.

Furthermore, the diffusion film 233 and the polarizing plate 135 are bonded to the other surface of the substrate 361. The substrate 235 one surface of which is provided with a touch sensor is bonded to the polarizing plate 135. These components are the same as those in FIG. 29; thus, the description thereof is omitted.

Through the above steps, an input/output device 310B in FIG. 33 can be formed. After that, an FPC, an IC, and the like are mounted (Step S29), and display can be confirmed (Step S30).

The display device of this embodiment includes two types of display elements as described above; thus, switching between a plurality of display modes is possible. Accordingly, the display device can have high visibility regardless of the ambient brightness, leading to high convenience.

This embodiment can be combined with any other embodiment as appropriate.

Embodiment 4

Described in this embodiment is a metal oxide applicable to a transistor disclosed in one embodiment of the present invention. In particular, details of a metal oxide and a cloud-aligned composite (CAC)-OS are described below.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a channel formation region of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, high on-state current and high field-effect mobility, can be obtained.

In other words, the CAC-OS or the CAC metal oxide can be called a matrix composite or a metal matrix composite.

The CAC-OS has, for example, a composition in which elements included in a metal oxide are unevenly distributed. Materials including unevenly distributed elements each have a size of greater than or equal to 0.5 nm and less than or equal to 10 nm, preferably greater than or equal to 1 nm and less than or equal to 2 nm, or a similar size. Note that in the following description of a metal oxide, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

Note that a metal oxide preferably contains at least indium. In particular, indium and zinc are preferably contained. In addition, aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide ($InO_{X1}$, where X1 is a real number greater than 0) or indium zinc oxide ($In_{X2}Zn_{Y2}O_{Z2}$, where X2, Y2, and Z2 are real numbers greater than 0), and gallium oxide ($GaO_{X3}$, where X3 is a real number greater than 0) or gallium zinc oxide ($Ga_{X4}Zn_{Y4}O_{Z4}$, where X4, Y4, and Z4 are real numbers greater than 0), and a mosaic pattern is formed. Then, $InO_{X1}$ or $In_{X2}Zn_{Y2}O_{Z2}$ forming the mosaic pattern is evenly distributed in the film. This composition is also referred to as a cloud-like composition.

That is, the CAC-OS is a composite metal oxide with a composition in which a region including $GaO_{X3}$ as a main component and a region mixed including $In_{X2}Zn_{Y2}O_{Z2}$ or $InO_{X1}$ as a main component are mixed. Note that in this specification, for example, when the atomic ratio of In to an element M in a first region is greater than the atomic ratio of In to the element M in a second region, the first region has higher In concentration than the second region.

Note that a compound including In, Ga, Zn, and O is also known as IGZO.

Typical examples of IGZO include a crystalline compound represented by $InGaO_3(ZnO)_{m1}$ (m1 is a natural number) and a crystalline compound represented by $In_{(1+x0)}Ga_{(1-x0)}O_3(ZnO)_{m0}$ ($-1 \leq x0 \leq 1$; m0 is a given number).

The above crystalline compounds have a single crystal structure, a polycrystalline structure, or a c-axis-aligned crystalline (CAAC) structure. Note that the CAAC structure is a crystal structure in which a plurality of IGZO nanocrystals have c-axis alignment and are connected in the a-b plane direction without alignment.

On the other hand, the CAC-OS relates to the material composition of a metal oxide. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

A boundary between the region including $GaO_{X3}$ as a main component and the region including $In_{X2}Zn_{Y2}O_{Z2}$ or $InO_{X1}$ as a main component is not clearly observed in some cases.

In the case where one or more of aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the selected metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated intentionally, for example. In the case of forming the CAC-OS by a sputtering method, one or more selected from an inert gas (typically, argon), an oxygen gas, and a nitrogen gas may be used as a deposition gas. The ratio of the flow rate of an oxygen gas to the total flow rate of the deposition gas at the time of deposition is preferably as low as possible, and for example, the flow ratio of an oxygen gas is preferably higher than or equal to 0% and less than 30%, further preferably higher than or equal to 0% and less than or equal to 10%.

The CAC-OS is characterized in that no clear peak is observed in measurement using θ/2θ scan by an out-of-plane method, which is an X-ray diffraction (XRD) measurement method. That is, X-ray diffraction shows no alignment in the a-b plane direction and the c-axis direction in a measured region.

In an electron diffraction pattern of the CAC-OS which is obtained by irradiation with an electron beam with a probe diameter of 1 nm (also referred to as a nanometer-sized electron beam), a ring-like region with high luminance and a plurality of bright spots in the ring-like region are observed. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image confirms that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility (μ) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby high on-state current (Ion) and high field-effect mobility (μ) can be achieved.

A semiconductor element including a CAC-OS has high reliability. Thus, the CAC-OS is suitably used in a variety of semiconductor devices typified by a display.

This embodiment can be combined with any other embodiment as appropriate.

Embodiment 5

In this embodiment, a display module and electronic devices of embodiments of the present invention are described.

Figure 34A:
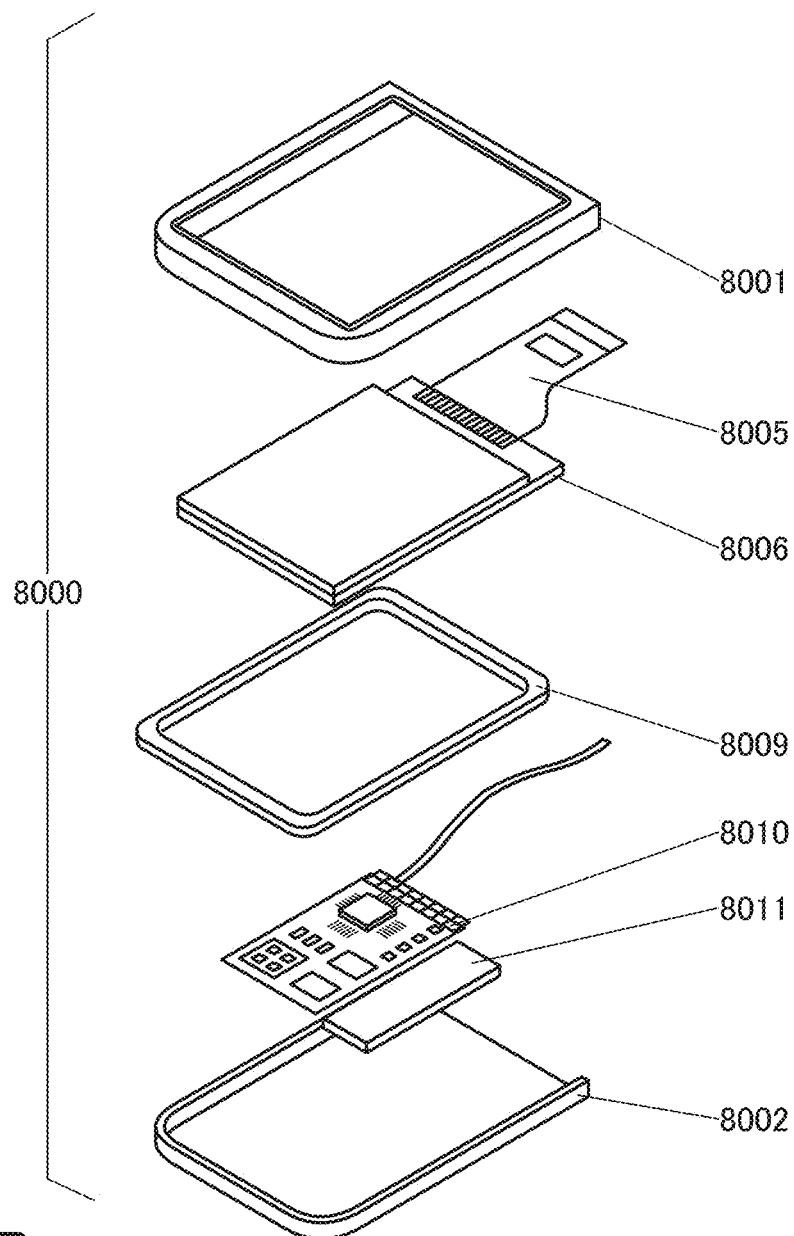
FIGS. 34A and 34B illustrate an example of a display module.

In a display module 8000 in FIG. 34A, a display panel 8006 connected to an FPC 8005, a frame 8009, a printed circuit board 8010, and a battery 8011 are provided between an upper cover 8001 and a lower cover 8002.

The display device fabricated using one embodiment of the present invention can be used for, for example, the display panel 8006. Thus, the display module can be manufactured with high yield.

The shape and size of the upper cover 8001 and the lower cover 8002 can be changed as appropriate in accordance with the size of the display panel 8006.

A touch panel may be provided so as to overlap with the display panel 8006. The touch panel can be a resistive touch panel or a capacitive touch panel and can be formed to overlap with the display panel 8006. Instead of providing the touch panel, the display panel 8006 may have a touch panel function.

The frame 8009 protects the display panel 8006 and functions as an electromagnetic shield for blocking electromagnetic waves generated by the operation of the printed circuit board 8010. The frame 8009 can also function as a radiator plate.

The printed circuit board 8010 includes a power supply circuit and a signal processing circuit for outputting a video signal and a clock signal. As a power source for supplying power to the power supply circuit, an external commercial power source or the battery 8011 provided separately may be used. The battery 8011 can be omitted in the case of using a commercial power source.

The display module 8000 may be additionally provided with a member such as a polarizing plate, a retardation plate, or a prism sheet.

Figure 34B:
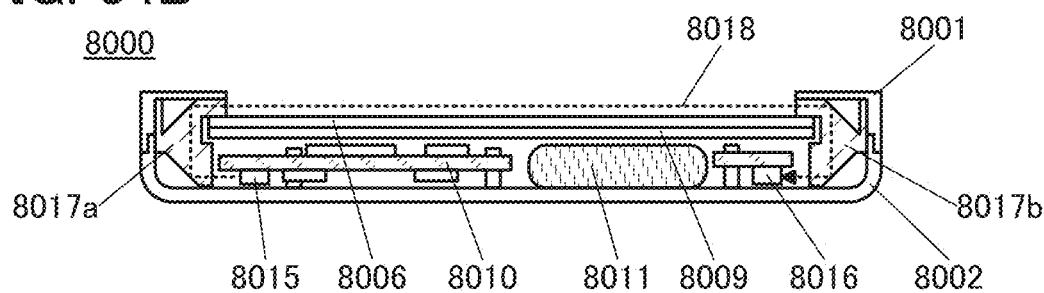

FIG. 34B is a schematic cross-sectional view of the display module 8000 with an optical touch sensor.

The display module 8000 includes a light-emitting portion 8015 and a light-receiving portion 8016 which are provided on the printed circuit board 8010. A pair of light guide portions (a light guide portion 8017a and a light guide portion 8017b) are provided in a region surrounded by the upper cover 8001 and the lower cover 8002.

For example, a plastic or the like can be used for the upper cover 8001 and the lower cover 8002. The upper cover 8001 and the lower cover 8002 can each be thin. For example, each cover can have a thickness of greater than or equal to 0.5 mm and less than or equal to 5 mm. Therefore, the display module 8000 can be significantly lightweight. The upper cover 8001 and the lower cover 8002 can be manufactured with a small amount of material, and therefore, manufacturing costs can be reduced.

The display panel 8006 overlaps with the printed circuit board 8010 and the battery 8011 with the frame 8009 located therebetween. The display panel 8006 and the frame 8009 are fixed to the light guide portion 8017a and the light guide portion 8017b.

Light 8018 emitted from the light-emitting portion 8015 travels over the display panel 8006 through the light guide portion 8017a and reaches the light-receiving portion 8016 through the light guide portion 8017b. For example, blocking of the light 8018 by a sensing target such as a finger or a stylus can be detected as touch operation.

A plurality of light-emitting portions 8015 are provided along two adjacent sides of the display panel 8006, for example. A plurality of light-receiving portions 8016 are provided so as to face the light-emitting portions 8015. Accordingly, information about the position of touch operation can be obtained.

As the light-emitting portion 8015, a light source such as an LED element can be used. It is particularly preferable to use a light source that emits infrared light, which is not visually recognized by users and is harmless to users, as the light-emitting portion 8015.

As the light-receiving portion 8016, a photoelectric element that receives light emitted from the light-emitting portion 8015 and converts it into an electrical signal can be used. A photodiode that can receive infrared light can be favorably used.

For the light guide portions 8017a and 8017b, members that transmit at least the light 8018 can be used. With the use of the light guide portions 8017a and 8017b, the light-emitting portion 8015 and the light-receiving portion 8016 can be placed under the display panel 8006, and a malfunction of the touch sensor due to external light reaching the light-receiving portion 8016 can be suppressed. It is particularly preferable to use a resin which absorbs visible light and transmits infrared light. This is more effective in suppressing the malfunction of the touch sensor.

According to one embodiment of the present invention, highly reliable electronic devices having curved surfaces can be manufactured. According to one embodiment of the present invention, flexible and highly reliable electronic devices can be manufactured.

Examples of the electronic devices include a television set, a desktop or laptop personal computer, a monitor of a computer or the like, a digital camera, a digital video camera, a digital photo frame, a mobile phone, a portable game machine, a portable information terminal, an audio reproducing device, and a large game machine such as a pachinko machine.

The display device of one embodiment of the present invention can achieve high visibility regardless of the intensity of external light. Thus, the display device of one embodiment of the present invention can be suitably used for a portable electronic device, a wearable electronic device (wearable device), an e-book reader, or the like.

Figure 35A:
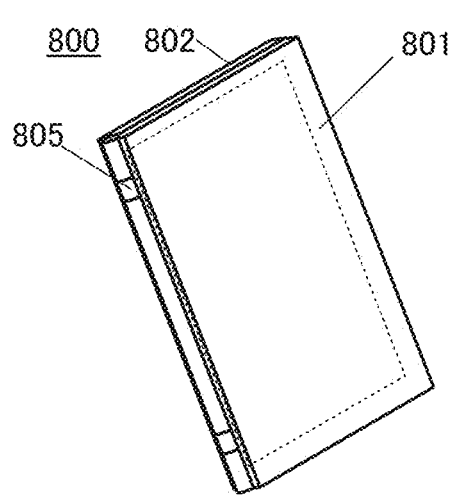
FIGS. 35A to 35D illustrate examples of electronic devices.
Figure 35B:
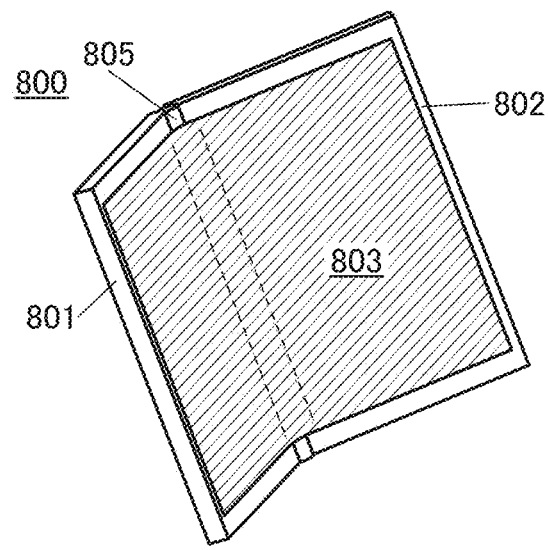

A portable information terminal 800 illustrated in FIGS. 35A and 35B includes a housing 801, a housing 802, a display portion 803, a hinge portion 805, and the like.

The housing 801 and the housing 802 are joined together with the hinge portion 805. The portable information terminal 800 can be opened as illustrated in FIG. 35B from a closed state (FIG. 35A). Thus, the portable information terminal 800 has high portability when carried and excellent visibility when used because of its large display region.

In the portable information terminal 800, the flexible display portion 803 is provided across the housing 801 and the housing 802 which are joined to each other by the hinge portion 805.

The display device manufactured using one embodiment of the present invention can be used for the display portion 803. Thus, the portable information terminal can be manufactured with high yield.

The display portion 803 can display at least one of a text, a still image, a moving image, and the like. When a text is displayed on the display portion, the portable information terminal 800 can be used as an e-book reader.

When the portable information terminal 800 is opened, the display portion 803 is significantly curved. For example, the display portion 803 is held while including a curved portion with a radius of curvature of greater than or equal to 1 mm and less than or equal to 50 mm, preferably greater than or equal to 5 mm and less than or equal to 30 mm. Part of the display portion 803 can display an image while being bent since pixels are continuously arranged from the housing 801 to the housing 802.

The display portion 803 functions as a touch panel and can be controlled with a finger, a stylus, or the like.

The display portion 803 is preferably formed using one flexible display. Thus, a continuous image can be displayed between the housing 801 and the housing 802. Note that each of the housing 801 and the housing 802 may be provided with a display.

The hinge portion 805 preferably includes a locking mechanism so that an angle formed between the housing 801 and the housing 802 does not become larger than a predetermined angle when the portable information terminal 800 is opened. For example, an angle at which the housing 801 and the housing 802 become locked (they are not opened any further) is preferably greater than or equal to 90° and less than 180° and can be typically 90°, 120°, 135°, 150°, 175°, or the like. In that case, the convenience, safety, and reliability of the portable information terminal 800 can be improved.

When the hinge portion 805 includes a locking mechanism, excessive force is not applied to the display portion 803; thus, breakage of the display portion 803 can be prevented. Therefore, a highly reliable portable information terminal can be provided.

A power button, an operation button, an external connection port, a speaker, a microphone, or the like may be provided for the housing 801 and the housing 802.

Either of the housing 801 and the housing 802 is provided with a wireless communication module, and data can be transmitted and received through a computer network such as the Internet, a local area network (LAN), or Wi-Fi (registered trademark).

Figure 35C:
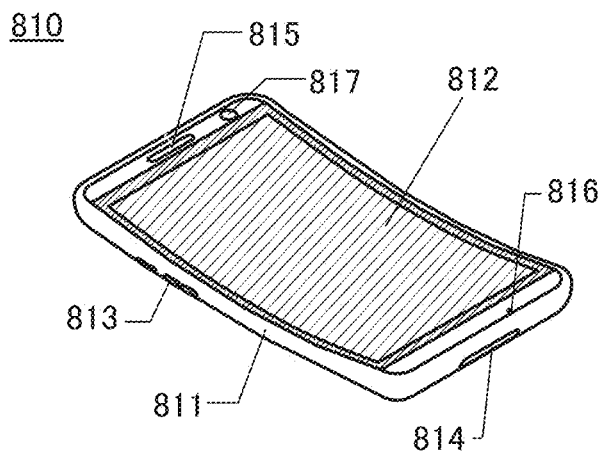

A portable information terminal 810 illustrated in FIG. 35C includes a housing 811, a display portion 812, an operation button 813, an external connection port 814, a speaker 815, a microphone 816, a camera 817, and the like.

The display device manufactured using one embodiment of the present invention can be used for the display portion 812. Thus, the portable information terminal can be manufactured with high yield.

The portable information terminal 810 includes a touch sensor in the display portion 812. Operations such as making a call and inputting a character can be performed by touch on the display portion 812 with a finger, a stylus, or the like.

With the operation button 813, the power can be turned on or off. In addition, types of images displayed on the display portion 812 can be switched; for example, switching an image from a mail creation screen to a main menu screen is performed with the operation button 813.

When a detection device such as a gyroscope sensor or an acceleration sensor is provided inside the portable information terminal 810, the direction of display on the screen of the display portion 812 can be automatically changed by determining the orientation of the portable information terminal 810 (whether the portable information terminal 810 is placed horizontally or vertically). Furthermore, the direction of display on the screen can be changed by touch on the display portion 812, operation with the operation button 813, sound input using the microphone 816, or the like.

The portable information terminal 810 functions as, for example, one or more of a telephone set, a notebook, and an information browsing system. Specifically, the portable information terminal 810 can be used as a smartphone. The portable information terminal 810 is capable of executing a variety of applications such as mobile phone calls, e-mailing, viewing and editing texts, music reproduction, reproducing a moving image, Internet communication, and computer games, for example.

Figure 35D:
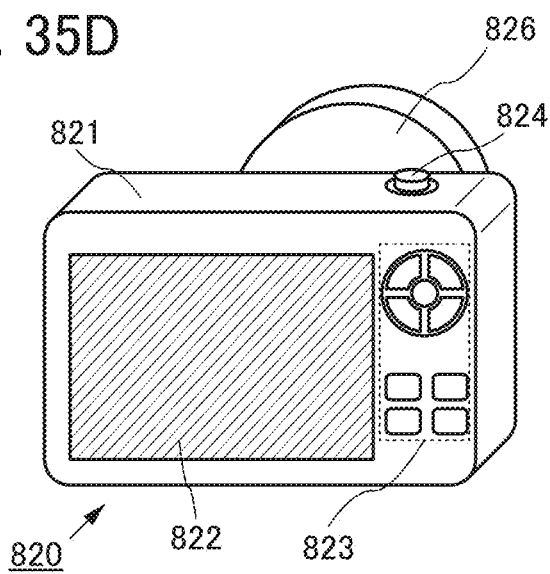

A camera 820 illustrated in FIG. 35D includes a housing 821, a display portion 822, operation buttons 823, a shutter button 824, and the like. Furthermore, an attachable lens 826 is attached to the camera 820.

The display device manufactured using one embodiment of the present invention can be used for the display portion 822. Thus, the camera can be manufactured with high yield.

Although the lens 826 of the camera 820 here is detachable from the housing 821 for replacement, the lens 826 may be incorporated into the housing 821.

A still image or a moving image can be taken with the camera 820 at the press of the shutter button 824. In addition, images can also be taken by the touch of the display portion 822 which has a function of a touch panel.

Note that a stroboscope, a viewfinder, or the like can be additionally attached to the camera 820. Alternatively, these may be incorporated into the housing 821.

FIGS. 36A to 36E illustrate electronic devices. These electronic devices each include a housing 9000, a display portion 9001, a speaker 9003, an operation key 9005 (including a power switch or an operation switch), a connection terminal 9006, a sensor 9007 (a sensor having a function of measuring force, displacement, position, speed, acceleration, angular velocity, rotational frequency, distance, light, liquid, magnetism, temperature, chemical substance, sound, time, hardness, electric field, current, voltage, power, radiation, flow rate, humidity, gradient, oscillation, odor, or infrared rays), a microphone 9008, and the like.

The display device manufactured using one embodiment of the present invention can be favorably used for the display portion 9001. Thus, the electronic devices can be manufactured with high yield.

The electronic devices illustrated in FIGS. 36A to 36E can have a variety of functions, for example, a function of displaying a variety of information (a still image, a moving image, a text image, and the like) on the display portion, a touch panel function, a function of displaying a calendar, the date, the time, and the like, a function of controlling processing with a variety of software (programs), a wireless communication function, a function of being connected to a variety of computer networks with a wireless communication function, a function of transmitting and receiving a variety of data with a wireless communication function, a function of reading a program or data stored in a storage medium and displaying the program or data on the display portion, and the like. Note that the functions of the electronic devices illustrated in FIGS. 36A to 36E are not limited to the above, and the electronic devices may have other functions.

Figure 36A:
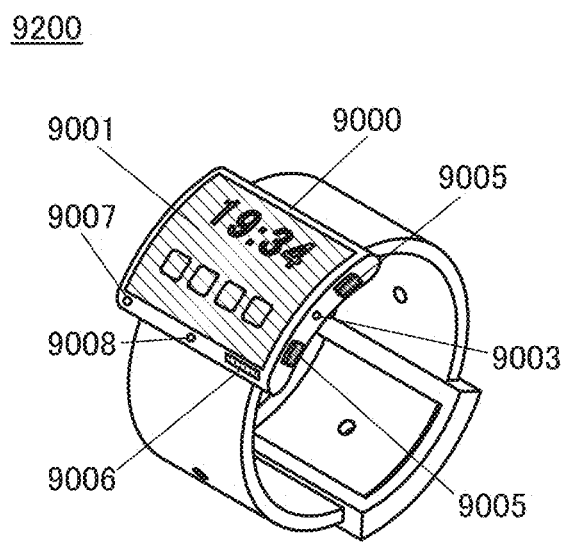
FIGS. 36A to 36E illustrate examples of electronic devices.
Figure 36B:
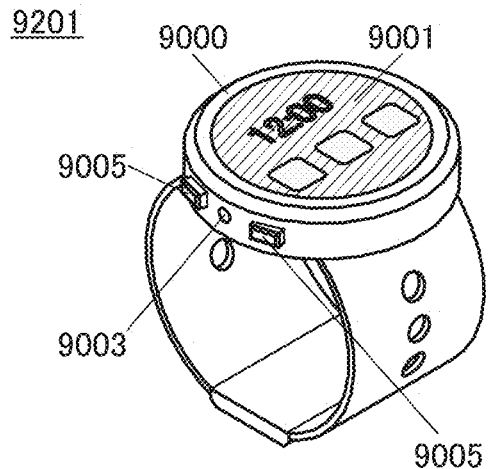

FIG. 36A is a perspective view of a watch-type portable information terminal 9200. FIG. 36B is a perspective view of a watch-type portable information terminal 9201.

The portable information terminal 9200 illustrated in FIG. 36A is capable of executing a variety of applications such as mobile phone calls, e-mailing, viewing and editing texts, music reproduction, Internet communication, and computer games. The display surface of the display portion 9001 is bent, and an image can be displayed on the bent display surface. The portable information terminal 9200 can employ near field communication conformable to a communication standard. In that case, for example, mutual communication between the portable information terminal 9200 and a headset capable of wireless communication can be performed, and thus hands-free calling is possible. The portable information terminal 9200 includes the connection terminal 9006, and data can be directly transmitted to and received from another information terminal via a connector. Power charging through the connection terminal 9006 is also possible. Note that the charging operation may be performed by wireless power feeding without using the connection terminal 9006.

Unlike in the portable information terminal illustrated in FIG. 36A, the display surface of the display portion 9001 is not curved in the portable information terminal 9201 illustrated in FIG. 36B. Furthermore, the external state of the display portion of the portable information terminal 9201 is a non-rectangular shape (a circular shape in FIG. 36B).

Figure 36C:
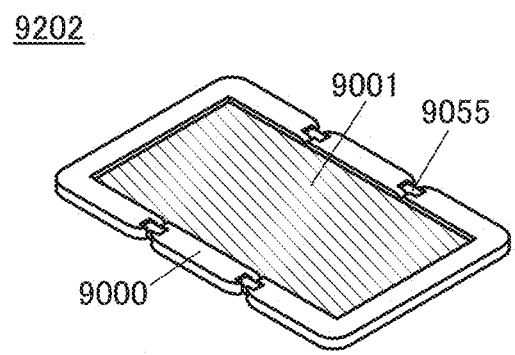
Figure 36D:
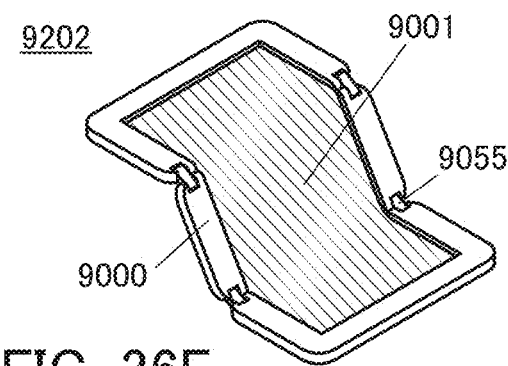
Figure 36E:
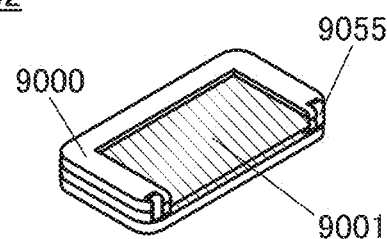

FIGS. 36C to 36E are perspective views of a foldable portable information terminal 9202. FIG. 36C is a perspective view illustrating the portable information terminal 9202 that is opened. FIG. 36D is a perspective view illustrating the portable information terminal 9202 that is being opened or being folded. FIG. 36E is a perspective view illustrating the portable information terminal 9202 that is folded.

The folded portable information terminal 9202 is highly portable, and the opened portable information terminal 9202 is highly browsable due to a seamless large display region. The display portion 9001 of the portable information terminal 9202 is supported by three housings 9000 joined together by hinges 9055. By folding the portable information terminal 9202 at a connection portion between two housings 9000 with the hinges 9055, the portable information terminal 9202 can be reversibly changed in shape from opened to folded. For example, the portable information terminal 9202 can be bent with a radius of curvature of greater than or equal to 1 mm and less than or equal to 150 mm.

This embodiment can be combined with any other embodiment as appropriate.

Example 1

In this example, the results of peeling a resin layer from a formation substrate are described.

A fabrication method of samples of this example is described with reference to FIGS. 37A to 37F. In this example, three samples were fabricated.

Figure 37A:
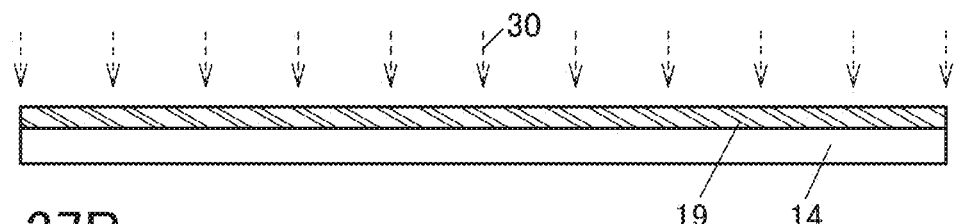
FIGS. 37A to 37F illustrate a fabrication method and a peeling method of samples of Example 1.

First, the metal layer 19 was formed over the formation substrate 14 (FIG. 37A).

As the formation substrate 14, an approximately 0.7-mm-thick glass substrate was used. As the metal layer 19, an approximately 5-nm-thick titanium film was formed by a sputtering method.

Figure 37B:
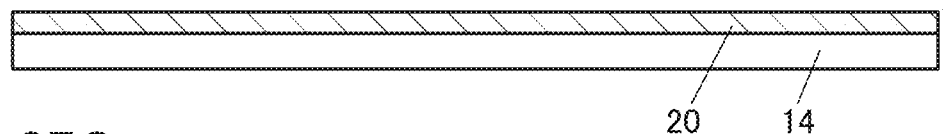

Then, H$_2$O plasma treatment was performed on a surface of the metal layer 19 (see plasma 30 in FIG. 37A), whereby the metal oxide layer 20, which was a titanium oxide film, was formed (FIG. 37B).

The bias power for the H$_2$O plasma treatment was different between the samples. Specifically, the bias power was 2000 W (Sample 1A), 3000 W (Sample 1B), and 4500 W (Sample 1C). The ICP power was 0 W, the pressure was 15 Pa, the lower electrode temperature was 40° C., the treatment time was 600 seconds, and the process gas was water vapor at a flow rate of 250 sccm. The H$_2$O plasma treatment was performed at room temperature.

Figure 37C:
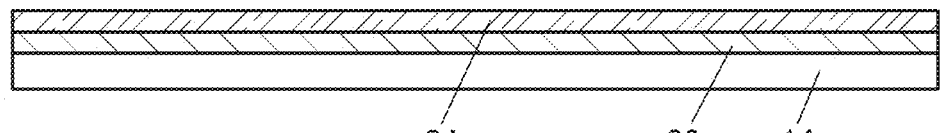

Next, the first layer 24 was formed over the metal oxide layer 20 (FIG. 37C). The first layer 24 was formed using a photosensitive material containing a polyimide resin precursor. The thickness obtained by applying this material was approximately 2.0 μm.

Figure 37D:
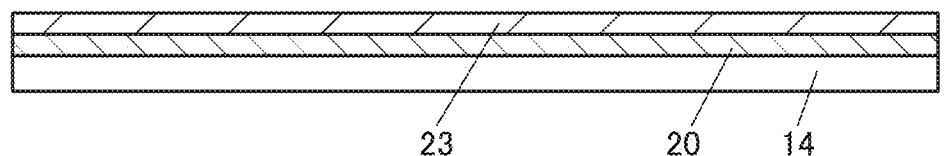

Subsequently, heat treatment was performed on the first layer 24, so that the resin layer 23 was formed (FIG. 37D). As the heat treatment, baking was performed at 480° C. in an air atmosphere for one hour.

Figure 37E:
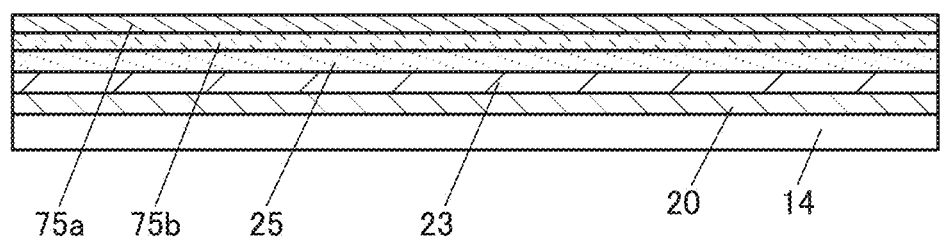

Next, the layer 25 to be peeled was formed over the resin layer 23 (FIG. 37E). The layer 25 to be peeled formed here had a stacked-layer structure with the assumption of the insulating layer 31 and the insulating layer 32 (the gate insulating layer of the transistor) that are illustrated in FIG. 5E. Specifically, an approximately 100-nm-thick silicon oxynitride film, an approximately 400-nm-thick silicon nitride film, and an approximately 50-nm-thick silicon oxynitride film were formed in that order over the resin layer 23. These films were formed by a plasma-enhanced CVD method at a substrate temperature of 330° C.

Then, an UV-peeling tape (corresponding to the adhesive layer 75b and the substrate 75a in FIG. 37E) was attached to the layer 25 to be peeled.

Figure 38:
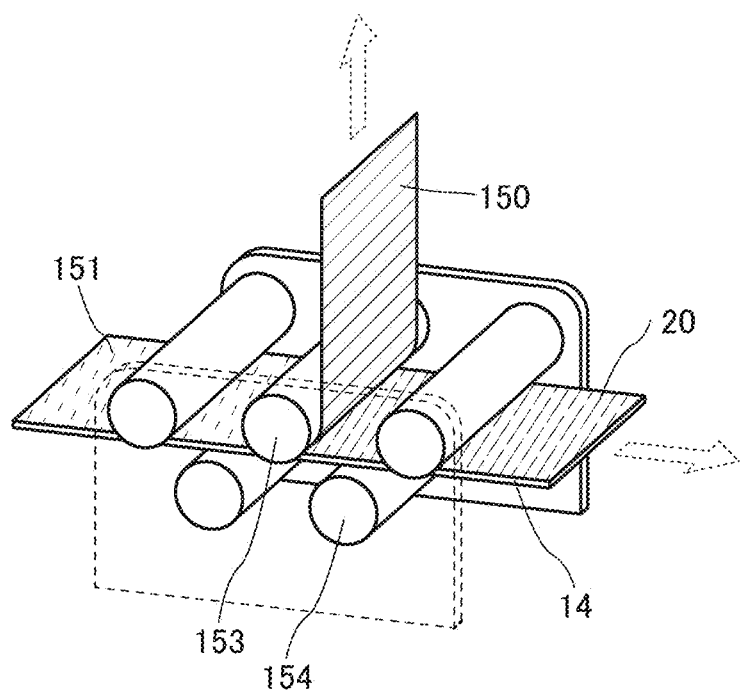
FIG. 38 is a perspective view illustrating a device used for measuring force required for peeling in Example 1.

A peeling test was conducted on the samples of this example, in which the resin layer 23 was peeled from the formation substrate 14. A jig illustrated in FIG. 38 was used for the peeling test. The jig illustrated in FIG. 38 includes a plurality of guide rollers 154 and a support roller 153. The force required for peeling can be measured by the following method: first, a tape 151 is attached onto a layer 150 including the layer to be peeled that has been formed over the formation substrate 14, and an end portion of the tape 151 is partly peeled in advance; then, the formation substrate 14 is fixed to the jig so that the tape 151 is held by the support roller 153, and the tape 151 and the layer 150 that includes the layer to be peeled are positioned perpendicular to the formation substrate 14; here, the tape 151 is pulled at a rate of 20 mm/min in a direction perpendicular to the formation substrate 14 to peel the layer 150 that includes the layer to be peeled, from the formation substrate 14; and at this time, the pulling force in the perpendicular direction is measured. During the peeling, the formation substrate 14 moves in the plane direction along the guide rollers 154 with the metal oxide layer 20 exposed. The support roller 153 and the guide rollers 154 are rotatable so that the formation substrate 14 and the layer 150 that includes the layer to be peeled are not affected by friction during the move.

For the peeling test, a compact table-top universal tester (EZ-TEST EZ-S-50N) manufactured by Shimadzu Corporation was used, and an adhesive tape/adhesive sheet testing method based on standard number JIS Z0237 of Japanese Industrial Standards (JIS) was employed. Each sample had a size of 126 mm×25 mm.

Figure 37F:
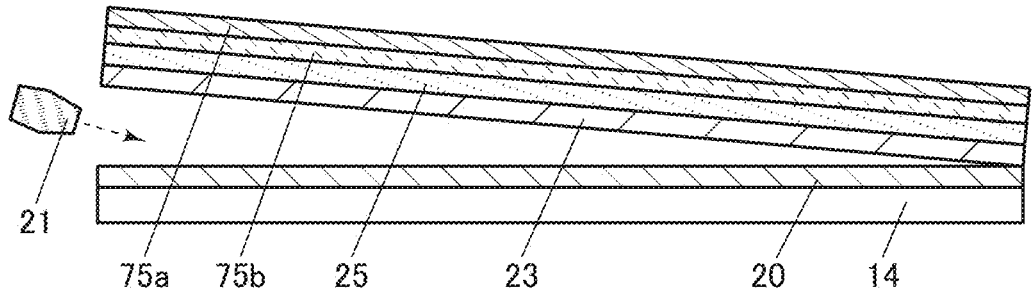

Before peeling, water was fed from an end portion of each sample (see the liquid feeding mechanism 21 in FIG. 37F).

Figure 39A:
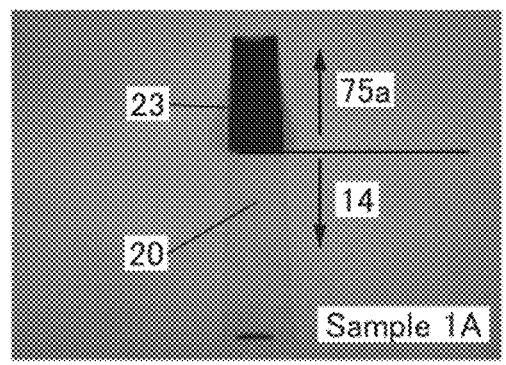
FIGS. 39A to 39C show results of peeling in samples of Example 1.
Figure 39B:
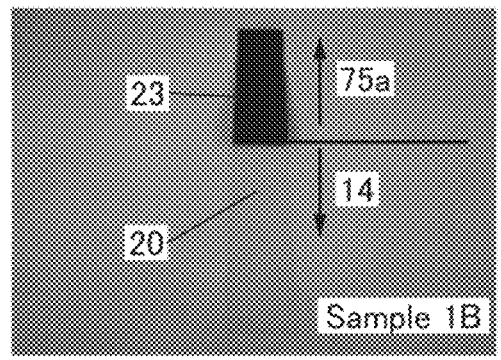
Figure 39C:
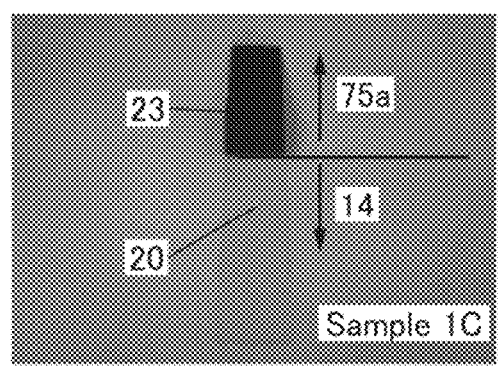

FIGS. 39A to 39C show the results of peeling in the samples. In FIGS. 39A to 39C, the portion above the solid line is the substrate 75a side and the portion below the solid line is the formation substrate 14 side. FIG. 39A shows the result for Sample 1A fabricated with the bias power of the H$_2$O plasma treatment set to 2000 W. FIG. 39B shows the result for Sample 1B fabricated with the bias power set to 3000 W. FIG. 39C shows the result for Sample 1C fabricated with the bias power set to 4500 W.

As can be seen in FIGS. 39A to 39C, the resin layer 23 remained on the substrate 75a side but did not remain on the formation substrate 14 side. In this example, separation probably occurred at the interface between the metal oxide layer 20 and the resin layer 23.

The forces required for peeling in Samples 1A, 1B, and 1C were approximately 0.24 N, approximately 0.22 N, and approximately 0.16 N, respectively. This shows that the force required for peeling reduces with increasing bias power of the $H_2O$ plasma treatment.

Note that the titanium oxide film as the metal oxide layer 20 may be formed by performing $O_2$ plasma treatment on the surface of the metal layer 19 instead of the $H_2O$ plasma treatment. A sample was formed in that manner and was subjected to a peeling test. The peeling was successfully performed as in Samples 1A to 1C, and the force required for peeling was approximately 0.21 N.

Alternatively, the titanium oxide film as the metal oxide layer 20 may be formed by performing plasma treatment on the surface of the metal layer 19 with the use of a mixed gas of $H_2O$ and Ar. A sample was formed in that manner and was subjected to a peeling test. The peeling was successfully performed as in Samples 1A to 1C, and the force required for peeling was approximately 0.15 N.

The conditions of the plasma treatment using the mixed gas of $H_2O$ and Ar were as follows: the bias power was 4500 W, the ICP power was 0 W, the pressure was 15 Pa, the lower electrode temperature was 40° C., the treatment time was 600 seconds, and the process gases were water vapor at a flow rate of 125 sccm and an argon gas at a flow rate of 125 sccm. The plasma treatment was performed at room temperature.

As described above, the resin layer 23 was peeled from the formation substrate 14 in this example by the peeling method of one embodiment of the present invention.

Example 2

In this example, the results of peeling a resin layer from a formation substrate are described.

A fabrication method of samples of this example is described with reference to FIGS. 4A to 4E. In this example, six samples were fabricated.

First, the metal oxide layer 20 was formed over the formation substrate 14 (FIG. 4A1).

As the formation substrate 14, an approximately 0.7-mm-thick glass substrate was used.

In Sample 2A, a titanium oxide film was formed as the metal oxide layer 20. Specifically, first, an approximately 5-nm-thick titanium film was formed by a sputtering method. Then, baking was performed at 450° C. for one hour while a mixed gas of a nitrogen gas and an oxygen gas (at 580 NL/min with an oxygen concentration of 20%) was supplied, whereby the titanium oxide film was formed.

In Sample 2B, an aluminum oxide film was formed as the metal oxide layer 20. Specifically, first, an approximately 5-nm-thick aluminum film was formed by a sputtering method. Then, baking was performed under the same conditions as Sample 2A, whereby the aluminum oxide film was formed.

In Sample 2C, an indium zinc oxide film was formed as the metal oxide layer 20. Specifically, first, an approximately 5-nm-thick indium zinc oxide film was formed by a sputtering method. Then, baking was performed under the same conditions as Sample 2A.

In Sample 2D, a titanium oxide film was formed as the metal oxide layer 20. Specifically, first, an approximately 5-nm-thick titanium film was formed by a sputtering method. Then, $H_2O$ plasma treatment was performed on a surface of the titanium film, whereby the titanium oxide film was formed. The $H_2O$ plasma treatment was performed at room temperature under the following conditions: the ICP power was 0 W, the bias power was 4500 W, the pressure was 15 Pa, the lower electrode temperature was 40° C., the treatment time was 600 seconds, and the process gas was oxygen at a flow rate of 250 sccm.

In Sample 2E, an aluminum oxide film was formed as the metal oxide layer 20. Specifically, first, an approximately 5-nm-thick aluminum film was formed by a sputtering method. Then, $H_2O$ plasma treatment was performed on a surface of the aluminum film, whereby the aluminum oxide film was formed. The conditions of the $H_2O$ plasma treatment were the same as those set for Sample 2D.

In Sample 2F, an indium zinc oxide film was formed as the metal oxide layer 20. Specifically, first, an approximately 5-nm-thick indium zinc oxide film was formed by a sputtering method. Then, $H_2O$ plasma treatment was performed on a surface of the indium zinc oxide film. The conditions of the $H_2O$ plasma treatment were the same as those set for Sample 2D.

Next, the first layer 24 was formed over the metal oxide layer 20 (FIG. 4B). The first layer 24 was formed using a photosensitive material containing a polyimide resin precursor. The thickness obtained by applying this material was approximately 2.0 µm.

Subsequently, heat treatment was performed on the first layer 24, so that the resin layer 23 was formed (FIG. 4C). As the heat treatment, baking was performed at 480° C. in an air atmosphere for one hour.

Next, the layer 25 to be peeled was formed over the resin layer 23 (FIG. 4D). The layer 25 to be peeled formed here had a stacked-layer structure with the assumption of the insulating layer 31 and the insulating layer 32 (the gate insulating layer of the transistor) that are illustrated in FIG. 5E. Specifically, an approximately 100-nm-thick silicon oxynitride film, an approximately 400-nm-thick silicon nitride film, and an approximately 50-nm-thick silicon oxynitride film were formed in that order over the resin layer 23. These films were formed by a plasma-enhanced CVD method at a substrate temperature of 330° C.

Then, an UV-peeling tape (corresponding to the adhesive layer 75b and the substrate 75a in FIG. 4D) was attached to the layer 25 to be peeled.

A peeling test was conducted on the samples of this example, in which the resin layer 23 was peeled from the formation substrate 14. The peeling test was performed under the conditions similar to those in Example 1.

Before peeling, water was fed from an end portion of each sample (see the liquid feeding mechanism 21 in FIG. 4E).

Figure 40A:
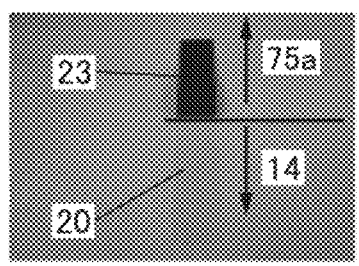
FIGS. 40A to 40F show results of peeling in samples of Example 2.
Figure 40B:
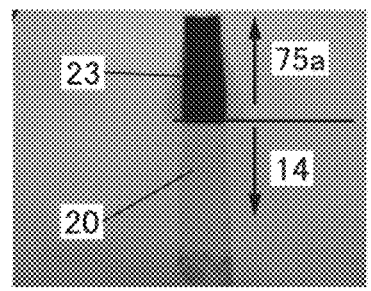
Figure 40C:
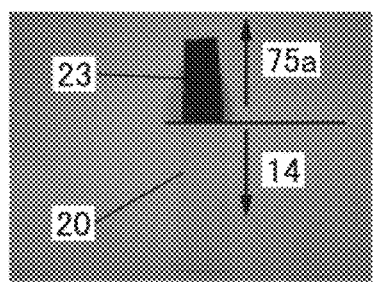
Figure 40D:
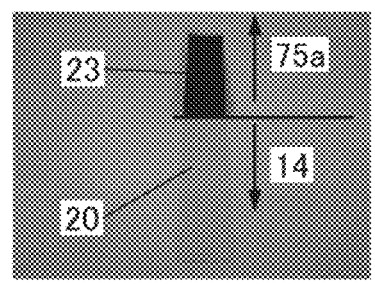
Figure 40E:
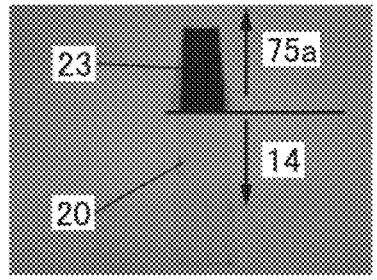
Figure 40F:
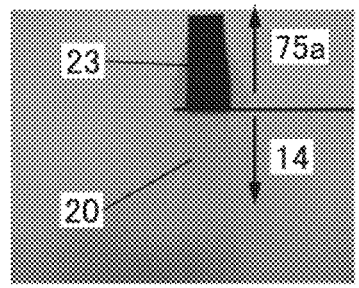

FIGS. 40A to 40F show the results of peeling in the samples. In FIGS. 40A to 40F, the portion above the solid line is the substrate 75a side and the portion below the solid line is the formation substrate 14 side. FIG. 40A shows the result for Sample 2A including the titanium oxide film formed by baking. FIG. 40B shows the result for Sample 2B including the aluminum oxide film formed by baking. FIG. 40C shows the result for Sample 2C including the indium zinc oxide film subjected to baking. FIG. 40D shows the result for Sample 2D including the titanium oxide film formed by the plasma treatment. FIG. 40E shows the result for Sample 2E including the aluminum oxide film formed by the plasma treatment. FIG. 40F shows the result for Sample 2F including the indium zinc oxide film subjected to the plasma treatment.

As can be seen in FIGS. 40A to 40F, the resin layer 23 remained on the substrate 75a side but did not remain on the formation substrate 14 side. Separation probably occurred at the interface between the metal oxide layer 20 and the resin layer 23.

The forces required for peeling in Samples 2A, 2B, 2C, 2D, 2E, and 2F were approximately 0.19 N, approximately 0.34 N, approximately 0.22 N, approximately 0.21 N, approximately 0.27 N, and approximately 0.17 N, respectively.

As described above, the resin layer 23 was peeled from the formation substrate 14 in this example by the peeling method of one embodiment of the present invention.

Example 3

In this example, the results of peeling a resin layer from a formation substrate are described.

A fabrication method of a sample of this example is described with reference to FIGS. 4A to 4E.

First, the metal oxide layer 20 was formed over the formation substrate 14 (FIG. 4A1). As the formation substrate 14, an approximately 0.7-mm-thick glass substrate was used. A titanium oxide film was formed as the metal oxide layer 20. Specifically, first, an approximately 5-nm-thick titanium film was formed by a sputtering method. Then, baking was performed at 450° C. for one hour while a mixed gas of a nitrogen gas and an oxygen gas (at 580 NL/min with an oxygen concentration of 20%) was supplied, whereby the titanium film was oxidized to be the titanium oxide film.

Next, the first layer 24 was formed over the metal oxide layer 20 (FIG. 4B). The first layer 24 was formed using a photosensitive material containing a polyimide resin precursor. The thickness obtained by applying this material was approximately 2.0 μm.

Subsequently, heat treatment was performed on the first layer 24, so that the resin layer 23 was formed (FIG. 4C). As the heat treatment, baking was performed at 480° C. in an air atmosphere for one hour.

Next, the layer 25 to be peeled was formed over the resin layer 23 (FIG. 4D). The layer 25 to be peeled formed here had a stacked-layer structure with the assumption of the insulating layer 31 and the insulating layer 32 (the gate insulating layer of the transistor) that are illustrated in FIG. 5E. Specifically, an approximately 400-nm-thick silicon oxynitride film, an approximately 400-nm-thick silicon nitride film, and an approximately 50-nm-thick silicon oxynitride film were formed in that order over the resin layer 23. These films were formed by a plasma-enhanced CVD method at a substrate temperature of 330° C.

Figure 41A:
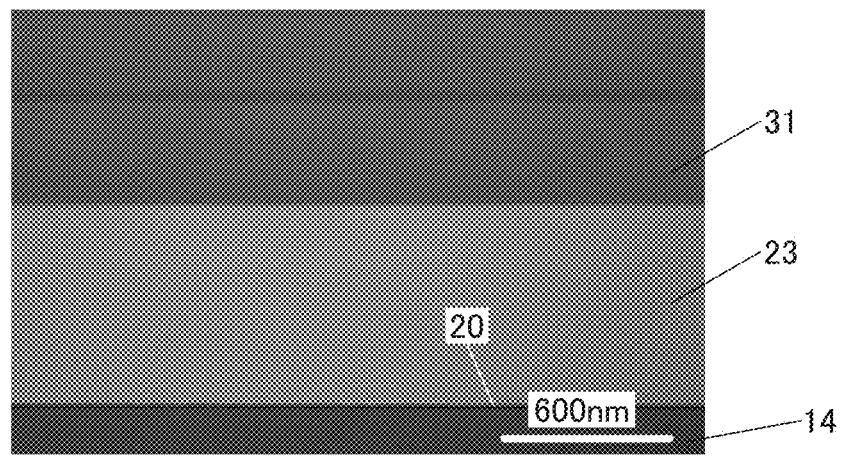
FIGS. 41A and 41B are cross-sectional STEM images of a sample of Example 3.
Figure 41B:
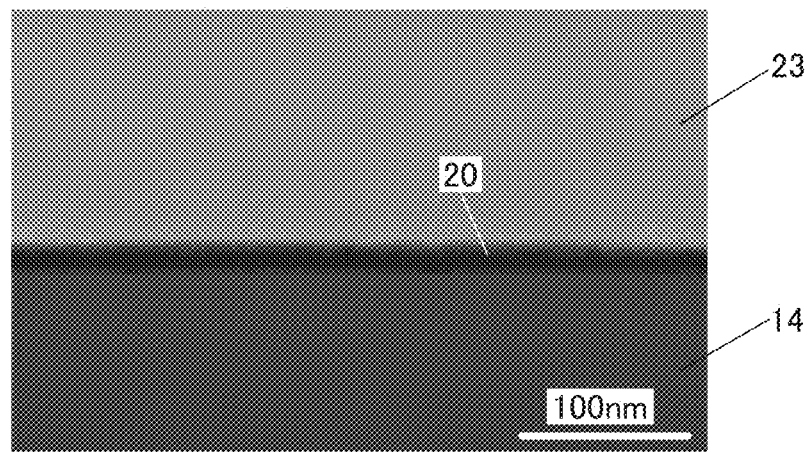

FIGS. 41A and 41B show cross-sectional scanning transmission electron microscopy (STEM) images of the sample at this stage. FIG. 41A shows that the resin layer 23 had a thickness of approximately 0.79 μm. FIG. 41B shows that the metal oxide layer 20 had a thickness of approximately 19.2 nm. The cross-sectional observation did not show a titanium film. It is thus probable that the entire titanium film was oxidized to be the titanium oxide film.

Then, an UV-peeling tape (corresponding to the adhesive layer 75b and the substrate 75a in FIG. 4D) was attached to the layer 25 to be peeled.

A peeling test was conducted on the sample of this example, in which the resin layer 23 was peeled from the formation substrate 14.

For the peeling test, a compact table-top universal tester (EZ-TEST EZ-S-50N) manufactured by Shimadzu Corporation was used, and an adhesive tape/adhesive sheet testing method based on standard number JIS Z0237 of Japanese Industrial Standards (JIS) was employed. The sample had a size of 126 mm×25 mm.

Figure 42A:
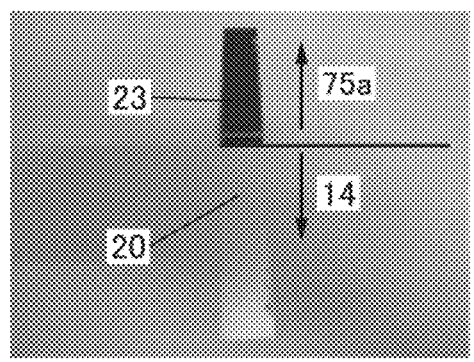
FIGS. 42A and 42B are a photograph and a cross-sectional STEM image showing a result of peeling in a sample of Example 3.

FIG. 42A shows the result of peeling in the sample. In FIG. 42A, the portion above the solid line is the substrate 75a side and the portion below the solid line is the formation substrate 14 side.

As can be seen in FIG. 42A, the resin layer 23 remained on the substrate 75a side but did not remain on the formation substrate 14 side.

Figure 42B:
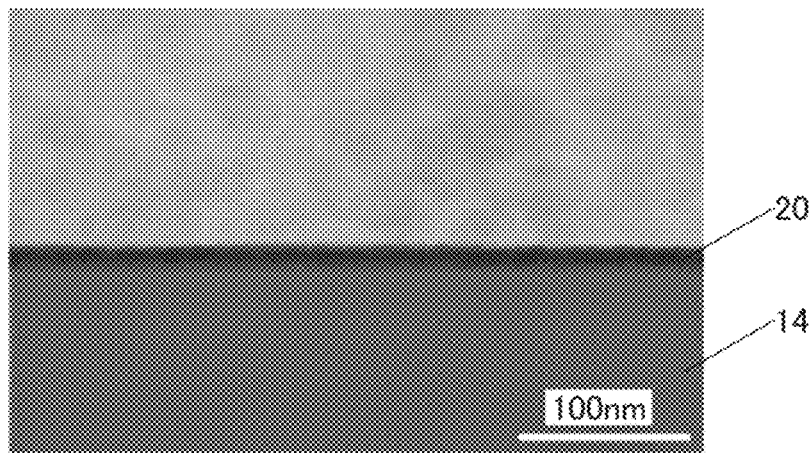

FIG. 42B shows a cross-sectional STEM image of the formation substrate 14 side. FIG. 42B shows that the metal oxide layer 20 had a thickness of approximately 12.6 nm. The cross-sectional observation did not show the resin layer 23. The layer over the metal oxide layer 20 is a film that was formed for the STEM observation.

Composition analysis was performed on the peeling surface on the substrate 75a side by X-ray photoelectron spectroscopy (XPS), where Ti was not detected.

These results suggest that separation occurred at the interface between the metal oxide layer 20 and the resin layer 23.

Note that separation between the formation substrate 14 and the resin layer 23 was difficult when the heat treatment was performed on the first layer 24 under certain conditions. For example, the formation substrate 14 and the resin layer 23 were not separated from each other in the above-described peeling test when baking was performed on the first layer 24 at 450° C. for one hour while a mixed gas of a nitrogen gas and an oxygen gas (at 580 NL/min with an oxygen concentration of 20%) was supplied.

The above results suggest that the formation substrate 14 and the resin layer 23 can be easily separated from each other when the resin layer 23 is formed by heating the first layer 24 in an air atmosphere. For example, it is suggested that in the case where the heating is performed in an air atmosphere, moisture is more easily held in the metal oxide layer 20, in the resin layer 23, or at the interface between the metal oxide layer 20 and the resin layer 23, for example, than in the case where the heating is performed while a gas is supplied.

It is also suggested that the formation substrate 14 and the resin layer 23 can be easily separated from each other when the resin layer 23 is formed by heating the first layer 24 at a sufficiently high temperature. Therefore, the adhesion between the metal oxide layer 20 and the resin layer 23 can be probably lowered.

As described above, the resin layer 23 was peeled from the formation substrate 14 in this example by the peeling method of one embodiment of the present invention.

Example 4

In this example, the results of peeling a resin layer from a formation substrate are described.

A fabrication method of samples of this example is described with reference to FIGS. 5A to 5E and FIGS. 6A, 6B1, 6B2, and 6B3. The samples of this example were fabricated using part of the manufacturing process of an EL display device to have a structure in which components from the formation substrate 14 to the insulating layer 35 illustrated in FIG. 6A are stacked.

First, the metal oxide layer 20 was formed over the formation substrate 14 (FIG. 5A). As the formation substrate 14, an approximately 0.7-mm-thick glass substrate was used. A titanium oxide film was used as the metal oxide layer 20. Specifically, first, an approximately 5-nm-thick titanium film was formed by a sputtering method. Then, baking was performed at 450° C. for one hour while a mixed gas of a nitrogen gas and an oxygen gas (at 580 NL/min with an oxygen concentration of 20%) was supplied, whereby the titanium film was oxidized to be the titanium oxide film. Note that the contact angle between the titanium oxide film formed in the above manner and water was measured to be approximately 46°.

Next, the first layer 24 was formed over the metal oxide layer 20 (FIG. 5B). The first layer 24 was formed using a photosensitive material containing a polyimide resin precursor. The thickness obtained by applying this material was approximately 2.0 μm.

Subsequently, the first layer 24 was processed into an island shape and subjected to heat treatment, so that the resin layer 23 was formed (FIG. 5C). As the heat treatment, baking was performed at 480° C. in an air atmosphere for one hour.

Then, an approximately 400-nm-thick silicon oxynitride film was formed over the resin layer 23 as the insulating layer 31. The insulating layer 31 was formed by a plasma-enhanced CVD method at a substrate temperature of 330° C.

Next, the transistor 40 was formed over the insulating layer 31 (FIG. 5E). The transistor formed in this example included an oxide semiconductor in its channel formation region.

Next, the insulating layer 33 covering the transistor 40 was formed. The insulating layer 33 included an approximately 400-nm-thick silicon oxynitride film and an approximately 100-nm-thick silicon nitride film. The insulating layer 33 was formed by a plasma-enhanced CVD method at a substrate temperature of 330° C.

After that, an approximately 2.0-μm-thick acrylic film was formed as the insulating layer 34 over the insulating layer 33.

Subsequently, an approximately 50-nm-thick titanium film, an approximately 200-nm-thick aluminum film, and an approximately 5-nm-thick titanium film were formed in this order as the conductive layer 61 over the insulating layer 34.

Next, the insulating layer 35 was formed to cover an end portion of the conductive layer 61. As the insulating layer 35, an approximately 1.0-μm-thick polyimide film was used.

Then, an approximately 2.0-μm-thick polyimide film was formed as a spacer (not shown) over the insulating layer 35.

Then, an UV-peeling tape (corresponding to the protective layer 75 in FIG. 6A) was attached to the layer 25 to be peeled.

A peeling test was conducted on the samples of this example, in which the resin layer 23 was peeled from the formation substrate 14. A method of the peeling test was similar to that described in Example 1.

The peeling test was conducted on 10 samples. In five out of the 10 samples, water was injected to the peeling interface before the peeling, whereas water was not injected before the peeling in the other five samples.

Figure 43A:
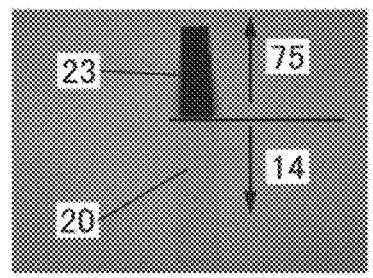
FIGS. 43A and 43B are photographs showing results of peeling in samples of Example 4.
Figure 43B:
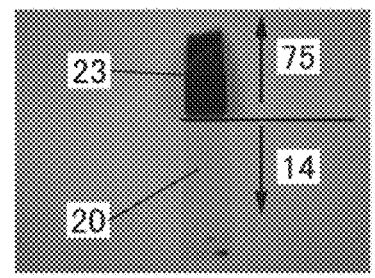

FIG. 43A shows the result of peeling in the sample in which water was injected before the peeling. FIG. 43B shows the result of peeling in the sample in which water was not injected before the peeling. In FIGS. 43A and 43B, the portion above the solid line is the protective layer 75 side and the portion below the solid line is the formation substrate 14 side.

As can be seen in FIGS. 43A and 43B, the resin layer 23 remained on the protective layer 75 side but hardly remained on the formation substrate 14 side.

The average force required for peeling in the five samples in which water was injected before the peeling was approximately 0.172 N. The average force required for peeling in the five samples in which water was not injected before the peeling was approximately 0.195 N. This shows that injection of water to the peeling interface reduces the force required for peeling.

The contact angle between the titanium oxide film formed in this example and water was as small as approximately 46°. The use of a film with high surface tension (high wettability) probably enhanced the effect of the water injection, leading to the reduced force required for peeling.

As described above, the resin layer 23 was peeled from the formation substrate 14 in this example by the peeling method of one embodiment of the present invention.

Example 5

In this example, the results of peeling a resin layer from a formation substrate are described.

A fabrication method of samples of this example is described with reference to FIGS. 4A to 4E.

First, the metal oxide layer 20 was formed over the formation substrate 14 (FIG. 4A1). As the formation substrate 14, an approximately 0.7-mm-thick glass substrate was used. A tungsten oxide film was formed as the metal oxide layer 20. Specifically, first, a tungsten film was formed by a sputtering method. In this example, two samples were fabricated: a sample whose tungsten film had a thickness of approximately 5 nm and a sample whose tungsten film had a thickness of approximately 10 nm. Then, baking was performed at 450° C. for one hour while a mixed gas of a nitrogen gas and an oxygen gas (at 580 NL/min with an oxygen concentration of 20%) was supplied, whereby the tungsten film was oxidized to be the tungsten oxide film.

Next, the first layer 24 was formed over the metal oxide layer 20 (FIG. 4B). The first layer 24 was formed using a non-photosensitive material containing a soluble polyimide resin. The thickness obtained by applying this material was approximately 2.0 μm.

Subsequently, heat treatment was performed on the first layer 24, so that the resin layer 23 was formed (FIG. 4C). As the heat treatment, baking was performed at 180° C. for 30 minutes while a mixed gas of a nitrogen gas and an oxygen gas (at 580 NL/min with an oxygen concentration of 20%) was supplied, followed by baking at 400° C. for one hour with supply of the same mixed gas.

Next, the layer 25 to be peeled was formed over the resin layer 23 (FIG. 4D). The layer 25 to be peeled formed here had a stacked-layer structure with the assumption of the insulating layer 31 and the insulating layer 32 (the gate insulating layer of the transistor) that are illustrated in FIG. 5E. Specifically, an approximately 100-nm-thick silicon oxynitride film, an approximately 400-nm-thick silicon nitride film, and an approximately 50-nm-thick silicon oxynitride film were formed in that order over the resin layer 23. These films were formed by a plasma-enhanced CVD method at a substrate temperature of 330° C.

Figure 44A:
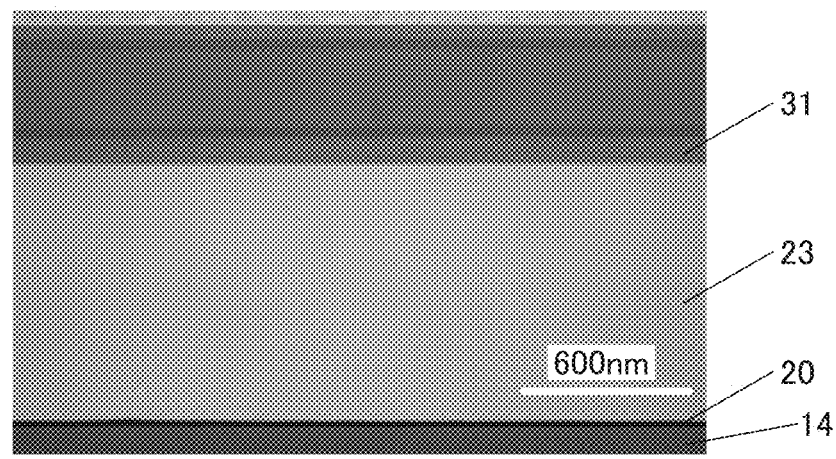
FIGS. 44A and 44B are cross-sectional STEM images of a sample of Example 5.
Figure 44B:
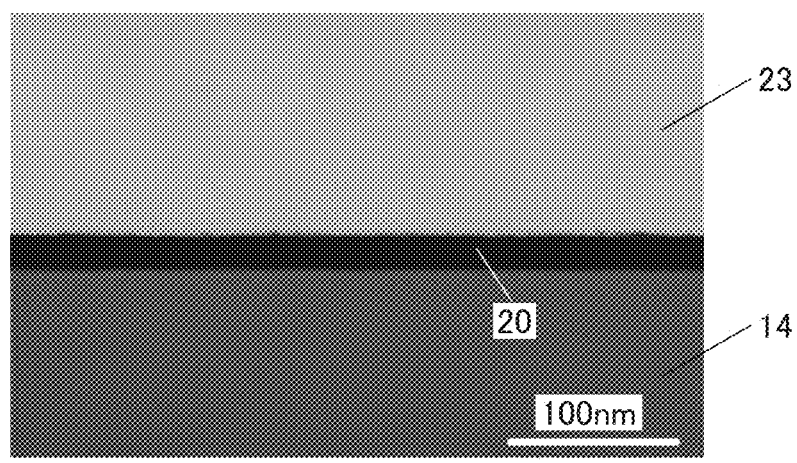

FIGS. 44A and 44B show cross-sectional STEM images of the sample (whose tungsten film had a thickness of approximately 5 nm) at this stage. FIG. 44A shows that the resin layer 23 had a thickness of approximately 1.01 μm. FIG. 44B shows that the metal oxide layer 20 had a thickness of approximately 23.8 nm. The cross-sectional observation did not show a tungsten film. It is thus probable that the entire tungsten film was oxidized to be the tungsten oxide film.

Then, an UV-peeling tape (corresponding to the adhesive layer 75b and the substrate 75a in FIG. 4D) was attached to the layer 25 to be peeled.

A peeling test was conducted on the samples of this example, in which the resin layer 23 was peeled from the formation substrate 14. A method of the peeling test was similar to that described in Example 1.

Figure 45A:
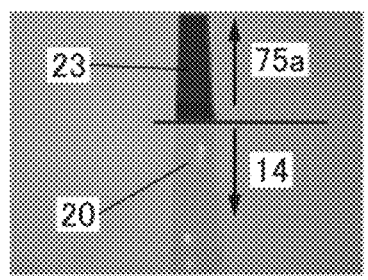
FIGS. 45A to 45C are photographs and a cross-sectional STEM image showing results of peeling in samples of Example 5.
Figure 45B:
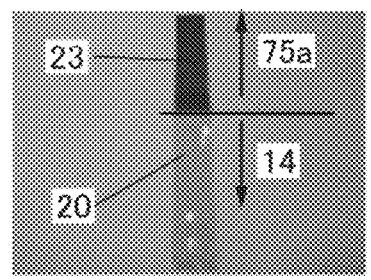

FIGS. 45A and 45B show the results of peeling in the samples. FIG. 45A shows the result for the sample whose tungsten film had a thickness of approximately 5 nm, and FIG. 45B shows the result for the sample whose tungsten film had a thickness of approximately 10 nm. In FIGS. 45A and 45B, the portion above the solid line is the substrate 75a side and the portion below the solid line is the formation substrate 14 side.

As can be seen in FIGS. 45A and 45B, the resin layer 23 remained on the substrate 75a side but did not remain on the formation substrate 14 side.

Figure 45C:
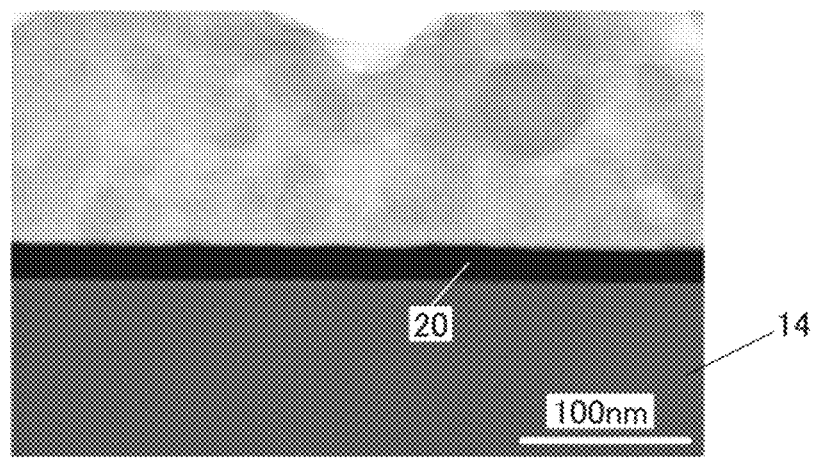

FIG. 45C shows a cross-sectional STEM image of the formation substrate 14 side of the sample whose tungsten film had a thickness of approximately 5 nm. FIG. 45C shows that the metal oxide layer 20 had a thickness of approximately 21.8 nm. The cross-sectional observation did not show the resin layer 23. The layer over the metal oxide layer 20 is a film that was formed for the STEM observation.

Conduction on the peeling surface on the substrate 75a side and conduction on the peeling surface on the formation substrate 14 side were examined, and there was conduction on the peeling surface on the formation substrate 14 side.

These results suggest that separation occurred at the interface between the metal oxide layer 20 and the resin layer 23.

As described above, the resin layer 23 was peeled from the formation substrate 14 in this example by the peeling method of one embodiment of the present invention.

Example 6

In this example, the results of manufacturing a display device with the use of the peeling method of one embodiment of the present invention are described.

Figure 46:
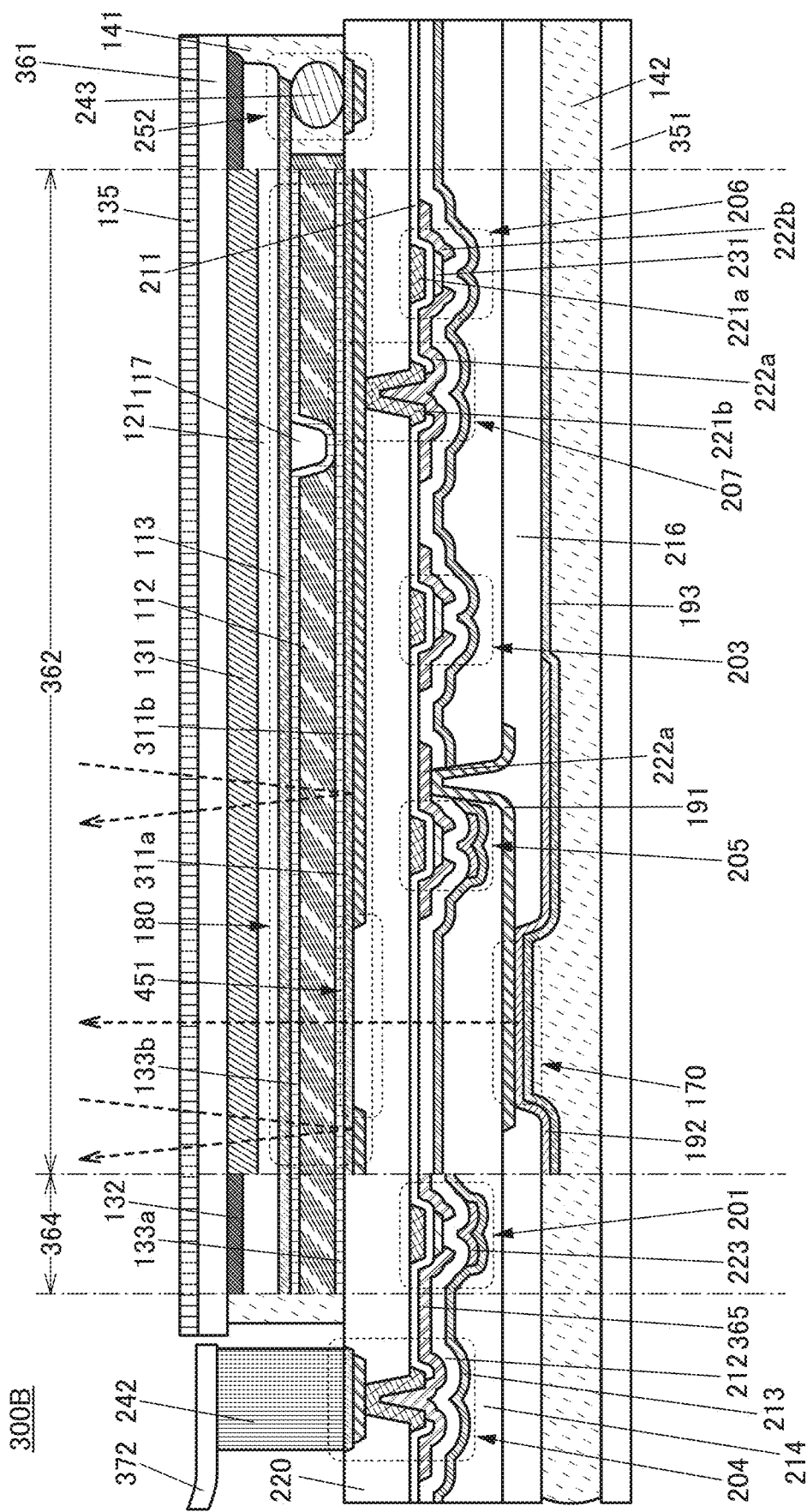
FIG. 46 is a schematic cross-sectional view of a display device in Example 6.

A display device 300B manufactured in this example has many parts in common with the display device 300A illustrated in FIG. 24 and FIG. 25. FIG. 46 illustrates an example of cross-sections of part of a region including the FPC 372, part of a region including the circuit 364, and part of a region including the display portion 362 of the display device 300B manufactured in this example. The display device 300B illustrated in FIG. 46 was different from the display device 300A in, mainly, that the coloring layer 134 and the insulating layer 194 were not provided and that the EL layer 192 was separately provided for each color.

The details of the display device 300B are described. The display portion 362 had a diagonal of 4.38 inches, 768×1024 effective pixels, and a resolution of 292 ppi. The display device 300B included a demultiplexer (DeMUX) serving as a source driver. The display device 300B also included a scan driver.

A channel formation region of a transistor included a metal oxide, specifically, an In—Ga—Zn oxide.

A reflective twisted ECB mode was used for the liquid crystal element 180. Reflected light of the liquid crystal element 180 was configured to be extracted to the outside of the display device 300B through the coloring layer 131 (a color filter). The liquid crystal element 180 had an aperture ratio of 76%.

An organic EL element was used as the light-emitting element 170. The light-emitting element 170 had a bottom-emission structure, where light from the light-emitting element 170 was configured to be extracted to the outside of the display device 300B through the coloring layer 131. The EL layer 192 of the light-emitting element 170 was separately provided for each sub-pixel (RGB). The light-emitting element 170 had an aperture ratio of 3.9%.

A process in the manufacturing process of the display device 300B to which the peeling method of one embodiment of the present invention was applied is described. A glass substrate, a titanium oxide film, and a polyimide film were respectively used as the formation substrate 14, the metal oxide layer 20, and the resin layer 23 illustrated in FIG. 4D. The layer 25 to be peeled was formed in such a manner that an inorganic insulating layer was formed over the resin layer 23 and then, a structure in which the components from the electrode 311a to the electrode 193 (see FIG. 46) were stacked was formed over the inorganic insulating layer. The adhesive layer 142 in FIG. 46 corresponds to the adhesive layer 75b. The substrate 351 in FIG. 46 corresponds to the substrate 75a. Then, the metal oxide layer 20 and the resin layer 23 were separated from each other by the peeling method of one embodiment of the present invention.

After that, the resin layer 23 and the inorganic insulating layer remaining on the substrate 351 side were removed. Then, the alignment film 133a was formed over the exposed electrode 311a. A structure in which the components from the coloring layer 131 (and the light-blocking layer 132) to the alignment film 133b were stacked was formed over the substrate 361. Subsequently, the substrate 351 and the substrate 361 were bonded to each other with the liquid crystal layer 112 positioned therebetween.

FIGS. 47A and 47B show photographs of the display device 300B displaying images. It was confirmed that a display device was manufactured with the use of the peeling method of one embodiment of the present invention and that the display device performed display on the entire screen without any major flaw.

Example 7

Items shown in Table 2 in the peeling method of one embodiment of the present invention will be described below in detail.

TABLE 2

| | |
|---|---|
| Processing on base layer | H$_2$O plasma treatment |
| Material of resin layer | Photosensitive material including polyimide resin precursor |
| Heating conditions of resin layer | Baking at 480° C. in air atmosphere |
| Ease of removing uncured resin layer | Good |
| Processability of resin layer | Good |
| Influence of dust on rear surface of formation substrate | Removal by light exposure Not influenced |
| Thermal conductivity of peeling interface | titanium oxide: 6.3 W/m · K polyimide: 0.18 W/m · K |
| Generation of soot | Not generated |
| Resin layer on formation substrate after peeling | No |
| Removal of resin layer after peeling | Performed       Not performed |

TABLE 2-continued

| Method for forming contact portion with Through electrode | Exposing Through electrode after peeling by assing and removing resin layer | Exposing Through electrode after peeling by forming opening in resin layer and forming Through electrode in opening |
|---|---|---|
| Coloring of completed device due to resin layer | Not colored | Colored |
| Force required for peeling | | 0.13 N |

As described in Example 1 and the like, as the processing performed on the base layer, H$_2$O plasma treatment is preferable. As the material of the resin layer, a photosensitive material including a polyimide resin precursor is favorable. As the heating condition for forming the resin layer, baking at 480° C. in an air atmosphere is favorable.

Here, when the material of the resin layer is applied to the formation substrate, the material might be non-uniformly applied to part of the peripheral portion of the substrate or the like. It is preferable to remove such an unnecessary portion easily before curing the resin layer. For example, the unnecessary portion can be removed with an organic solvent such as thinner. Depending on the material of the resin layer, turbidity, gelation, or solidification might occur by reaction with thinner. The material of the resin layer used in Example 1 and the like is dissolved in an organic solvent such as thinner; therefore, the unnecessary portion can be easily removed before curing the resin layer.

The photosensitive material is preferably used because the resin layer can be easily processed. The resin layer can be processed by applying the material and then performing light exposure and development. The fabrication process can be shortened because a resist mask is not needed.

When dust is present on the rear surface (the surface opposite to the surface where the resin layer is formed) of the formation substrate in a step of irradiating the entire surface of the resin layer with laser light through the formation substrate, the light irradiation is not appropriately performed, which leads to defective peeling. When the power of the laser is too strong with respect to the resin layer, the resin layer is changed in quality in some cases. For example, soot is generated. The peeling method of one embodiment of the present invention does not include a step of light irradiation from the rear surface of the formation substrate. Accordingly, the dust does not have an adverse effect and the resin layer is not damaged by laser light. In one embodiment of the present invention, the heat treatment improves the peelability of the resin layer. Even when a foreign matter is adhered to the substrate, heating nonuniformity does not easily occur in the resin layer, which inhibits a reduction in yield of the process for separating the substrate and the resin layer from each other. Note that as shown in Table 1, the thermal conductivity of titanium oxide is appropriately 6.3 W/m·K, and that of polyimide is appropriately 0.18 W/m·K.

As described in Example 1 or the like, the peeling interface is the interface between the metal oxide layer and the resin layer. Therefore, the resin layer does not remain over the formation substrate after peeling.

In the case of removing the resin layer after peeling, a through electrode can be exposed. The resin layer is preferably removed by ashing. Since the resin layer is removed, the completed device is not affected by the color of the resin layer.

In the case of not removing the resin layer after peeling, the through electrode is preferably exposed by peeling. When the resin layer is formed, an opening is formed in the resin layer to form the through electrode in the opening. Then, the resin layer and the through electrode are exposed by peeling. A material having low adhesion to the formation substrate is preferably used for the through electrode. In addition, a contact area between the through electrode and the formation substrate is preferably as small as possible. Since the photosensitive material is used, an opening can be formed in the resin layer by light-exposure technique. At this time, the opening has a tapered shape. When formed using a non-photosensitive material, the resin layer can be processed by ashing, dry etching, or the like. At this time, a sidewall of the opening in the resin layer is nearly vertical. Since the resin layer is not removed, the completed device is affected by the color of the resin layer. To suppress a decrease in light extraction efficiency, the resin layer is preferably not provided in a portion where the resin layer does not need to be provided.

When the peeling method of one embodiment of the present invention is employed, the force required for peeling is approximately 0.13 N, for example.

This application is based on Japanese Patent Application Serial No. 2016-170378 filed with Japan Patent Office on Aug. 31, 2016, Japanese Patent Application Serial No. 2016-173345 filed with Japan Patent Office on Sep. 6, 2016, and Japanese Patent Application Serial No. 2016-198947 filed with Japan Patent Office on Oct. 7, 2016, the entire contents of which are hereby incorporated by reference.

What is claimed is:

1. A method for manufacturing a semiconductor device, comprising the steps of:
    forming a first material layer comprising a metal oxide over a substrate;
    performing a first plasma treatment on a surface of the first material layer under an atmosphere comprising a gas containing hydrogen or oxygen or both hydrogen and oxygen;
    forming a second material layer comprising a resin on the first material layer; and
    separating the first material layer and the second material layer from each other,
    wherein a hydrogen bond exists at the surface of the first material layer after the formation of the second material layer,
    wherein one of the constituent elements of the hydrogen bond comes from the plasma treatment,
    wherein the other constituent element of the hydrogen bond is included in any one of the first material layer and the second material layer,
    wherein the first material layer and the second material layer are separated from each other by a break of the hydrogen bond, and
    wherein the second material layer is formed to comprise a region with a thickness of greater than or equal to 0.1 μm and less than or equal to 5 μm.

2. The method for manufacturing a semiconductor device, according to claim 1, wherein the first material layer is formed to have lower adhesion to the second material layer than the substrate.

3. The method for manufacturing a semiconductor device, according to claim 1, wherein the second material layer and the gas containing hydrogen or oxygen or both hydrogen and oxygen form the hydrogen bond.

4. A method for manufacturing a semiconductor device, comprising the steps of:

forming a first material layer comprising a metal oxide over a substrate;
performing a first plasma treatment on the first material layer under an atmosphere comprising a gas containing hydrogen or oxygen or both hydrogen and oxygen;
forming a second material layer over the first material layer;
heating the first material layer and the second material layer that are stacked;
separating out water at an interface between the first material layer and the second material layer or near the interface; and
separating the first material layer and the second material layer from each other,
wherein the first material layer comprises the gas containing hydrogen or oxygen or both hydrogen and oxygen,
wherein the gas containing hydrogen or oxygen or both hydrogen and oxygen in the first material layer forms a hydrogen bond after the formation of the second material layer,
wherein, in the case of the gas containing oxygen, the hydrogen bond is formed with hydrogen included in any one of the first material layer and the second material layer,
wherein the second material layer comprises a resin,
wherein the first material layer and the second material layer are separated from each other by reduced adhesion due to the water present at the interface or near the interface in the step of separating the first material layer and the second material layer from each other, and
wherein the step of separating the first material layer and the second material layer from each other is performed while a liquid is fed to a separation interface.

5. The method for manufacturing a semiconductor device, according to claim 4, wherein the first material layer is formed to comprise one or more of titanium, molybdenum, aluminum, tungsten, silicon, indium, zinc, gallium, tantalum and tin.

6. The method for manufacturing a semiconductor device according to claim 4, wherein the first material layer is formed to have a structure in which titanium and titanium oxide are stacked.

7. The method for manufacturing a semiconductor device, according to claim 4, wherein the second material layer is formed to comprise a region with a thickness of greater than or equal to 0.1 µm and less than or equal to 5 µm.

8. The method for manufacturing a semiconductor device, according to claim 4, wherein the second material layer is formed to comprise a compound represented by Formula (100):

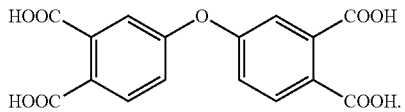

9. The method for manufacturing a semiconductor device, according to claim 4,
wherein the step of forming the first material layer comprises the steps of:
forming a metal layer over the substrate; and
performing a second plasma treatment on a surface of the metal layer to form a metal oxide layer after forming the metal layer over the substrate.

10. The method for manufacturing a semiconductor device according to claim 9, wherein in the second plasma treatment, the surface of the metal layer is exposed to an atmosphere containing an oxygen gas or water vapor or both an oxygen gas and water vapor.

11. A method for manufacturing a semiconductor device, comprising the steps of:
forming a metal oxide layer over a substrate;
performing a first plasma treatment on a surface of the metal oxide layer under an atmosphere comprising water vapor;
forming a first layer with use of a material comprising a resin or a resin precursor over the metal oxide layer after the first plasma treatment;
performing heat treatment on the first layer to form a resin layer; and
separating the metal oxide layer and the resin layer from each other,
wherein the metal oxide layer is formed by forming a metal layer over the substrate and heating the metal layer in an oxygen-containing atmosphere.

12. The method for manufacturing a semiconductor device according to claim 11, further comprising the step of:
performing a second plasma treatment on a surface of the metal layer to form the metal oxide layer after forming the metal layer.

13. The method for manufacturing a semiconductor device, according to claim 12,
wherein the step of performing the second plasma treatment comprises the step of:
exposing the surface of the metal layer to an atmosphere comprising an oxygen gas or water vapor or both an oxygen gas and water vapor.

14. The method for manufacturing a semiconductor device, according to claim 11, wherein the metal oxide layer and the resin layer are separated from each other while a water-containing liquid is fed to a separation interface.

15. The method for manufacturing a semiconductor device, according to claim 14, wherein a contact angle between the metal oxide layer and the water-containing liquid is greater than 0° and less than or equal to 60°.

16. The method for manufacturing a semiconductor device, according to claim 11, wherein the resin layer is formed to comprise a region with a thickness of greater than or equal to 0.1 µm and less than or equal to 5 µm.

17. The method for manufacturing a semiconductor device, according to claim 11, wherein the metal oxide layer comprises titanium oxide.

* * * * *